(12) United States Patent  (10) Patent No.: US 8,030,187 B2
Sasaki et al.  (45) Date of Patent: Oct. 4, 2011

(54) METHOD FOR MANUFACTURING SEMICONDUCTOR DEVICE

(75) Inventors: Yuichiro Sasaki, Osaka (JP); Katsumi Okashita, Osaka (JP); Keiichi Nakamoto, Osaka (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 185 days.

(21) Appl. No.: 12/517,477

(22) PCT Filed: Sep. 3, 2008

(86) PCT No.: PCT/JP2008/002420
§ 371 (c)(1),
(2), (4) Date: Jun. 3, 2009

(87) PCT Pub. No.: WO2009/084130
PCT Pub. Date: Jul. 9, 2009

(65) Prior Publication Data
US 2011/0065266 A1  Mar. 17, 2011

(30) Foreign Application Priority Data
Dec. 28, 2007  (JP) ................................ 2007-339557

(51) Int. Cl.
*H01L 21/00* (2006.01)
(52) U.S. Cl. ......... 438/480; 438/513; 438/527; 438/717
(58) Field of Classification Search ............... 438/10.17, 438/480, 513, 527, 717, 745, 766; 257/E21.091, 257/101, 143, 147, 316, 334, 531, 29.083
See application file for complete search history.

(56) References Cited

U.S. PATENT DOCUMENTS

| 4,496,450 | A | * | 1/1985 | Hitotsuyanagi et al. . 204/192.15 |
| 4,696,883 | A | * | 9/1987 | Saitoh et al. ................. 430/57.6 |
| 6,403,410 | B1 | * | 6/2002 | Ohira et al. ................... 438/181 |
| 7,192,854 | B2 | * | 3/2007 | Sasaki et al. .................. 438/513 |
| 7,348,264 | B2 | * | 3/2008 | Sasaki et al. .................. 438/513 |
| 7,759,254 | B2 | * | 7/2010 | Sasaki et al. .................. 438/717 |
| 2003/0153101 | A1 | | 8/2003 | Takase et al. |
| 2006/0099830 | A1 | | 5/2006 | Walther et al. |
| 2007/0111548 | A1 | | 5/2007 | Sasaki et al. |

(Continued)

FOREIGN PATENT DOCUMENTS
JP  64-061020  3/1989
(Continued)

OTHER PUBLICATIONS

Y, Sasaki et al., "$B_2H_6$ Plasma Doping with 'In-situ He Preamorphization,'" 2004 Symposium on VLSI Technology, p. 180-181.

(Continued)

*Primary Examiner* — Michael Lebentritt
(74) *Attorney, Agent, or Firm* — McDermott Will & Emery LLP

(57) ABSTRACT

A substrate is exposed to a plasma generated from a gas containing an impurity, thereby doping a surface portion of the substrate with the impurity and thus forming an impurity region. A predetermined plasma doping time is used, which is included within a time range over which a deposition rate on the substrate by the plasma is greater than 0 nm/min and less than or equal to 5 nm/min.

7 Claims, 32 Drawing Sheets

U.S. PATENT DOCUMENTS

| | | | |
|---|---|---|---|
| 2007/0176124 A1* | 8/2007 | Sasaki et al. | 250/492.21 |
| 2008/0067439 A1* | 3/2008 | Sasaki et al. | 250/492.21 |
| 2008/0233723 A1* | 9/2008 | Okumura et al. | 438/513 |
| 2008/0258082 A1* | 10/2008 | Okumura et al. | 250/492.3 |
| 2009/0042321 A1* | 2/2009 | Sasaki et al. | 438/10 |
| 2009/0227096 A1* | 9/2009 | Godet et al. | 438/527 |
| 2010/0009469 A1* | 1/2010 | Kai et al. | 438/7 |

FOREIGN PATENT DOCUMENTS

| | | | |
|---|---|---|---|
| WO | WO 02/084724 A1 | 10/2002 | |
| WO | WO 2005/034221 A1 | 4/2005 | |
| WO | WO 2006/064772 A1 | 6/2006 | |
| WO | WO 2006/121131 A1 | 11/2006 | |

OTHER PUBLICATIONS

Y. Sasaki et al., "Production-Worth USJ Formation by Self-Regulatory Plasma Doping Method," CP866 Ion Implantation Technology, 2006 American Institute of Physics, pp. 524-527.

Y. Sasaki et al., "New method of Plasma doping with in-situ Helium pre-amorphization," Nuclear instruments and Methods in Physics Research B 237 (2005) pp. 41-45.

D. Lenoble, "Advanced junction fabrication challenges at the 45nm node," Semiconductor Fabtech-30th Edition, pp. 114-130.

Shu Qin et al., "Device Performance Evaluation of PMOS Devices Fabricated by $B_2H_6$ PIII/PLAD Process of Poly-Si Gate Doping," International Workshop in Junction Technology, pp. 68, 2006.

* cited by examiner

FIG. 6
(a)
Process region B
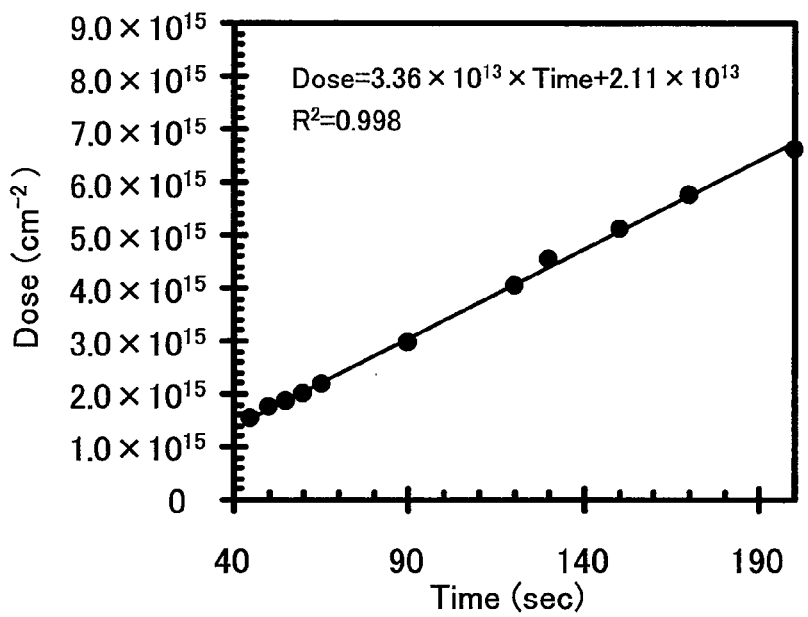
(b)
Initial region A
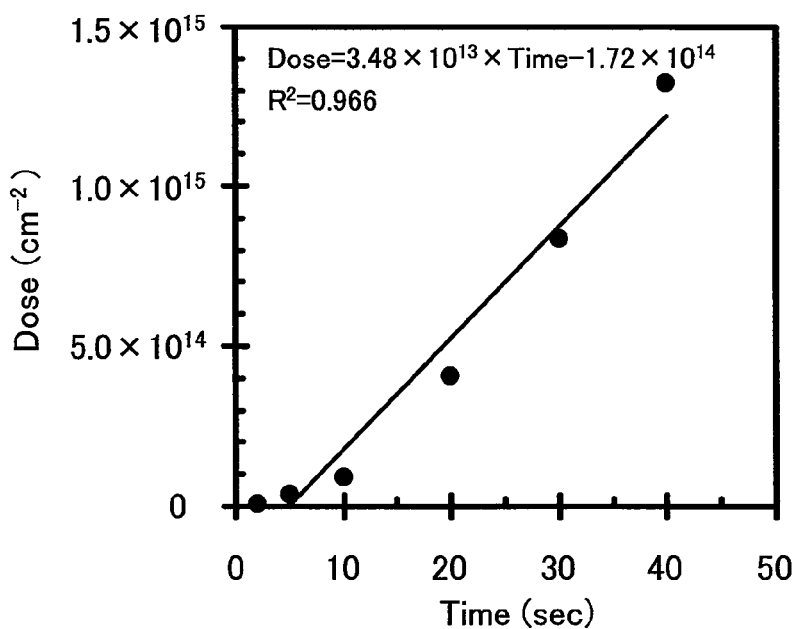

FIG. 7
(a)
|  | Temporal change rate of dose | | Range over which dose can be controlled only by time | |
|---|---|---|---|---|
| Method of present invention (Deposition is dominant) | Greater than prior art but constant | $3.4 \times 10^{13} cm^{-2}/sec$ | Wide | $1.5 \times 10^{15} \sim 6.5 \times 10^{15} cm^{-2}$ |
| Method of Patent Document 1 (Sputtering is dominant) | Very small | $5.4 \times 10^{12} cm^{-2}/sec$ | Narrow | $1.2 \times 10^{15} \sim 2.0 \times 10^{15} cm^{-2}$ |
(b)
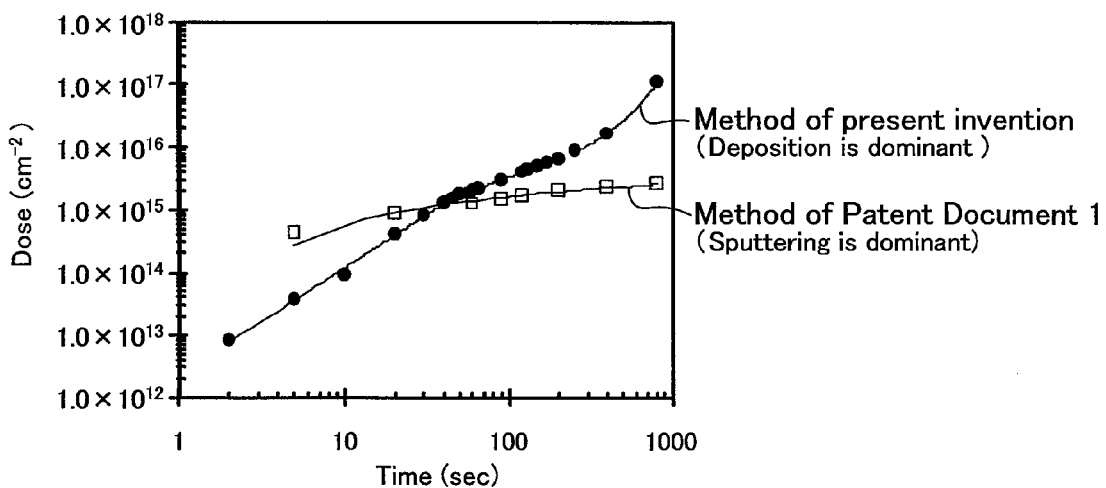
(c)
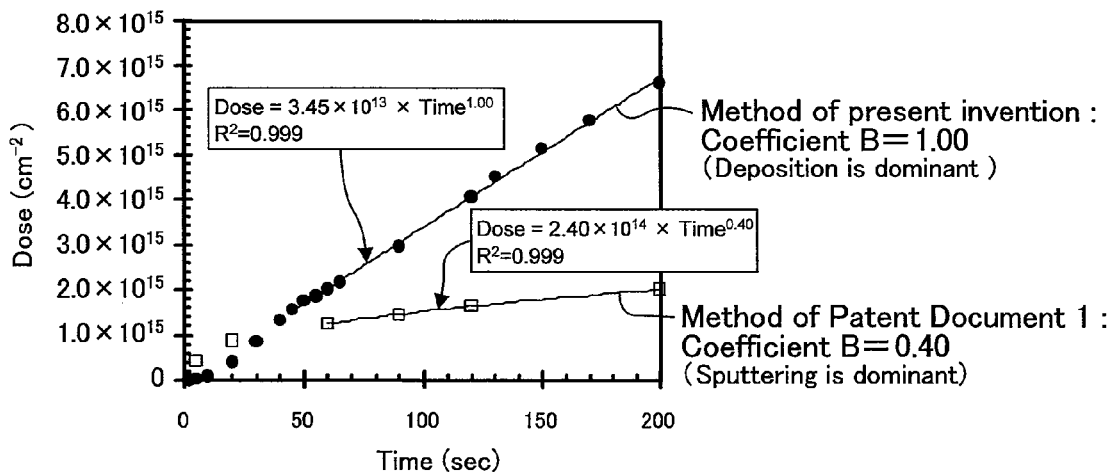

FIG. 21  Sheet resistance uniformity 1.01%(1σ)
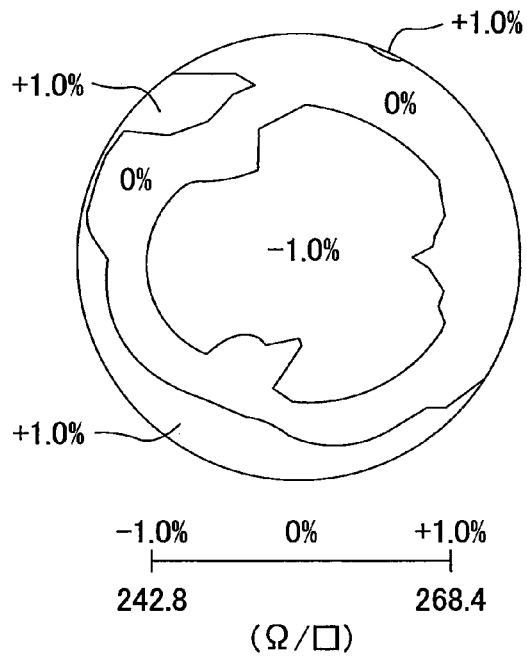
FIG. 22
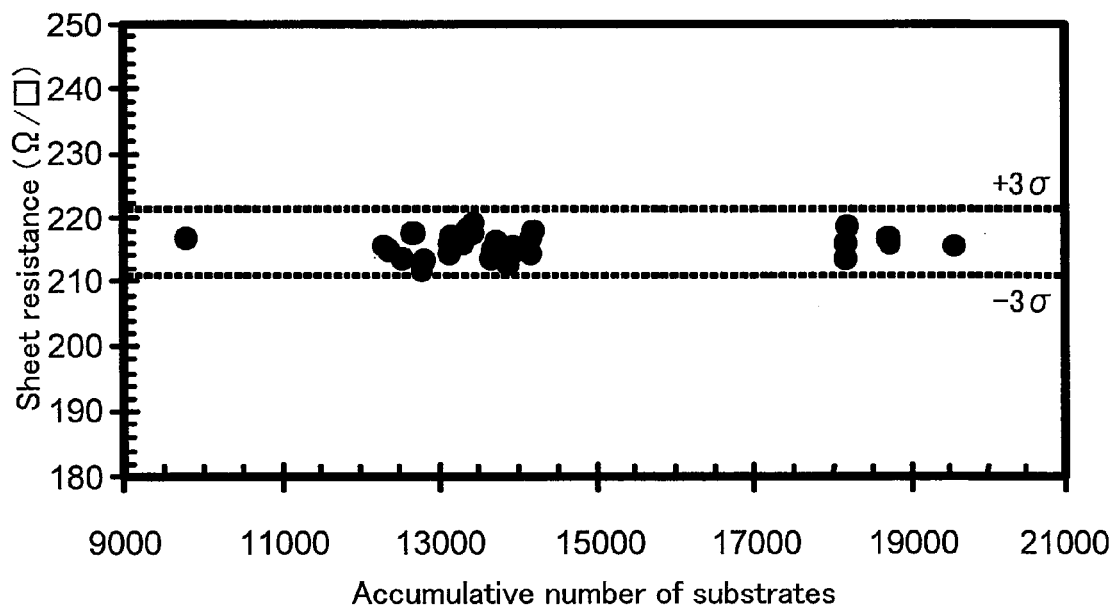

FIG. 27
(a)
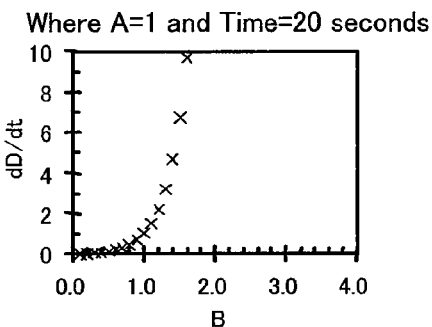
(b)
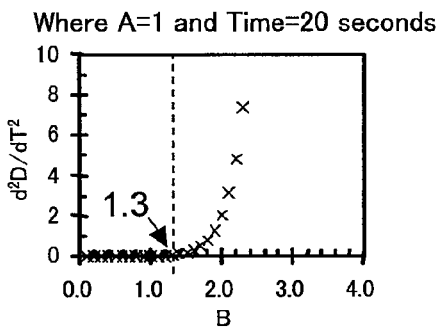
(c)
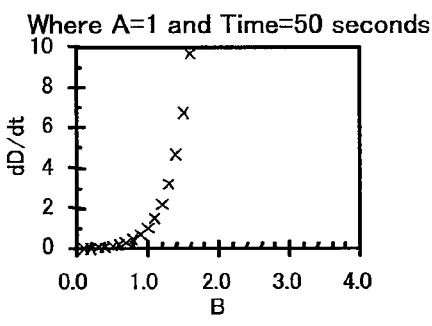
(d)
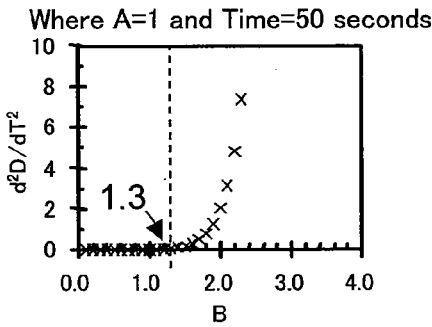
(e)
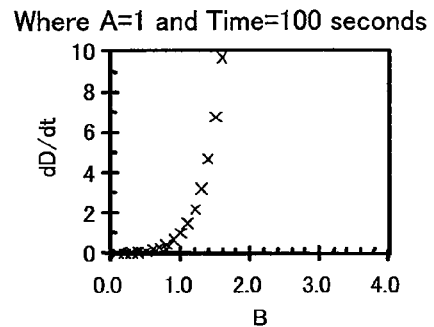
(f)
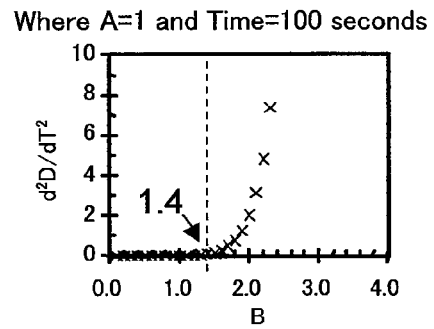
(g)
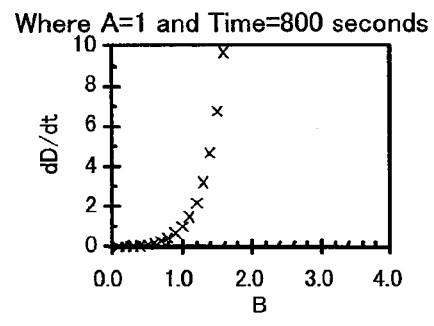
(h)
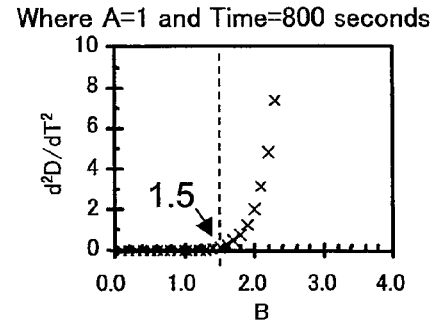

FIG. 28
(a)
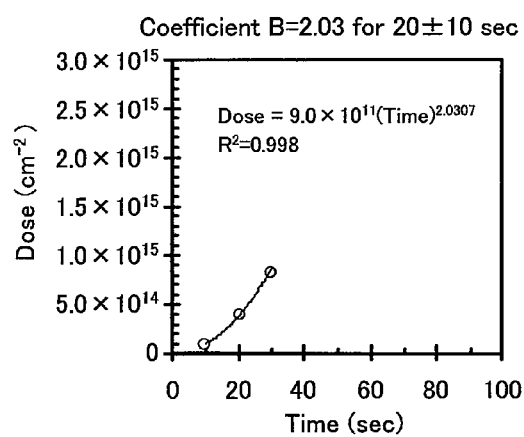
(c)
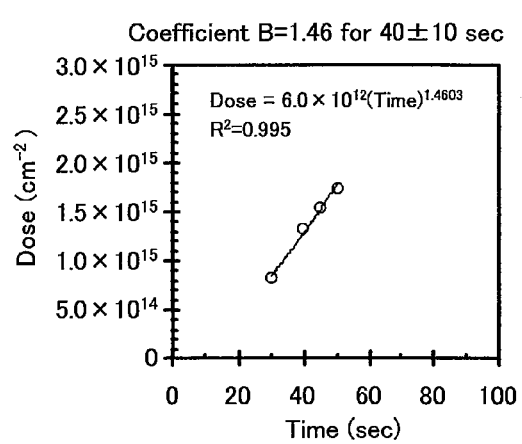
(b)
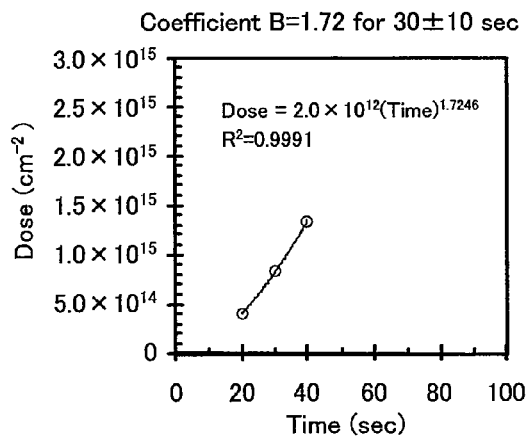
(d)
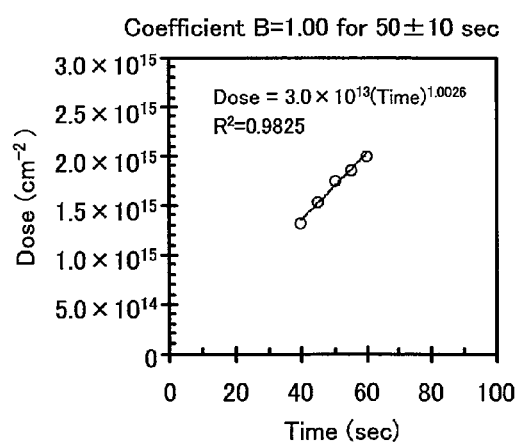

|  | Characteristic | Etching rate |
|---|---|---|
| PD of present invention | Deposition is dominant | −0.5nm/min |
| Conventional PD | Etching is dominant | +0.5nm/min |

METHOD FOR MANUFACTURING SEMICONDUCTOR DEVICE

RELATED APPLICATIONS

This application is the U.S. National Phase under 35 U.S.C. §371 of International Application No. PCT/JP2008/002420, filed on Sep. 3, 2008, which in turn claims the benefit of Japanese Application No. 2007-339557, filed on Dec. 28, 2007, the disclosures of which Applications are incorporated by reference herein.

TECHNICAL FIELD

The present invention relates to a method for manufacturing a semiconductor device and, more particularly, to a method for manufacturing a semiconductor device in which a semiconductor region is formed by implanting a substrate with an impurity by plasma doping.

BACKGROUND ART

In recent years, there are increasing demands for miniaturizing semiconductor devices along with the increase in the degree of integration, functionality and speed thereof. Accordingly, there are increasing demands for realizing an ultra-shallow semiconductor region formed by implanting a substrate with an impurity. Under such circumstances, plasma doping has been drawing attention as a technique with which it is easier to form an ultra-shallow semiconductor region implanted with an impurity, as compared with ion implantation widely used in the prior art as a technique for implanting a substrate with an impurity. With plasma doping, by exposing a substrate directly to a plasma, it is possible to implant an impurity in the plasma into the substrate without drawing the impurity out of the plasma. Thus, not only impurity ions in the plasma, but also electrically neutral impurities such as radicals or gas constituent atoms or molecules (hereinafter referred to simply as a "gas") in the plasma can be implanted into the substrate in large quantities with a low energy. Therefore, as characteristics of plasma doping, it is widely known that 1. since the rate at which the impurity is implanted into the substrate is very high, the throughput is very high as compared with ion implantation; and
2. since the impurity implantation energy can be set very low, it is easy to implant an impurity into an ultra-shallow region.

By utilizing the first characteristic of plasma doping that the implantation rate is very high, an impurity can be implanted into the polysilicon gate with a very high throughput (see Shu Qin, Allen Mc Teer, Device Performance Evaluation of PMOS Devices Fabricated by B2H6 PIII/PLAD Process on Poly-Si Gate Doping, International Workshop on Junction Technology, p 68 (2006) (hereinafter referred to as "Non-Patent Document 1")).

It has been reported that by applying the second characteristic of plasma doping that the implantation energy can be set very low, in combination with the first characteristic, a source/drain extension region which is a region substantially thinner than the gate can be formed with a low resistance (see Y. Sasaki, et al., B2H6 Plasma Doping with "In-situ He Preamorphization", Symp. on VLSI Tech, p 180 (2004) (hereinafter referred to as "Non-Patent Document 2") and Nuclear Instruments and Methods in Physics Research B 237 p 41-45 (2005) (hereinafter referred to as "Non-Patent Document 3")).

Moreover, a technique has been recently proposed in the art which, in addition to realizing an ultra-shallow source/drain extension region with a low resistance, can control the uniformity in the impurity dose, which has been considered in the prior art as an important problem in putting into practice the formation of an ultra-shallow impurity region by plasma doping, as precisely as required for the source/drain extension region (see IIT(2006)524AIP866 (hereinafter referred to as "Non-Patent Document 4"), International Publication WO06/064772 pamphlet (hereinafter referred to as Patent Document 1") and International Publication WO06/121131 pamphlet (hereinafter referred to as "Patent Document 2")).

With regard to the dose controllability, which is another important problem in putting into practice the formation of an ultra-shallow impurity region by plasma doping, a technique has been disclosed in the art for suppressing the deposition of electrically neutral impurities such as radicals and the gas on the substrate (see United States Patent Application Publication No. 2006/0099830 (hereinafter referred to as "Patent Document 3")). Patent Document 3 states that by measuring only the implantation dose of impurity ions with Faraday cups, it is possible to identify the dose and to thereby enhance the dose controllability.

As a technique that actively utilizes electrically neutral impurities such as radicals and the gas in plasma doping, a technique has been disclosed in the art in which a thin semiconductor film is formed on an insulative substrate, and then a thin impurity film is formed so as to be in contact with the thin semiconductor film, wherein the primary component of the thin impurity film is impurity atoms that can be electrically activated into carriers in the thin semiconductor film (see International Publication WO05/034221 pamphlet (hereinafter referred to as "Patent Document 4")).

DISCLOSURE OF THE INVENTION

Problems to be Solved by the Invention

However, according to the conventional method for manufacturing a semiconductor device disclosed in Non-Patent Document 1, although the throughput is very high, it is difficult to control the uniformity, across the substrate surface, of the dose of implantation into the ultra-shallow region of the substrate, as precisely as required for the source/drain extension region.

According to the conventional method for manufacturing a semiconductor device disclosed in Non-Patent Documents 2 and 3, it is possible to form an ultra-shallow source/drain extension region with a low resistance, but it is again difficult to precisely control the dose uniformity across the substrate surface.

For this purpose, Non-Patent Document 4 and Patent Documents 1 and 2 propose techniques that solve the problem of the dose uniformity across the substrate surface. Nevertheless, while these techniques can improve the dose uniformity across the substrate surface, there is only a very narrow range of dose for which the uniformity is effectively improved, and it is therefore difficult to achieve various levels of sheet resistance as required depending on the types of semiconductor devices according to such requirements. In practice, the required sheet resistance varies for each production lot, and if one uses methods disclosed in Non-Patent Document 4 and Patent Documents 1 and 2 with which it takes a long time for adjusting the level of sheet resistance to be obtained according to such requirement, the productivity lowers.

According to the method disclosed in Patent Document 3, the deposition of electrically neutral impurities such as radicals and the gas on the substrate is suppressed, and the precision of the electrical dose measurement using Faraday cups is therefore improved, as compared with a case where there is no such suppression. However, the dose measurement value using Faraday cups differs from that using SIMS (secondary ion mass spectrometry), which is a widely known dose identification method. That is, as stated in Patent Document 3, while Faraday cups measure only those ions that are electrically active among the impurities implanted into the substrate, SIMS measures not only ions but also electrically neutral impurities among the impurities implanted into the substrate. Therefore, dose measurement values using Faraday cups differing from those using SIMS means that it is not possible, even with the technique of Patent Document 3, to precisely measure the dose using Faraday cups.

While the method disclosed in Patent Document 4 utilizes the phenomenon that electrically neutral impurities such as radicals and the gas are deposited on the substrate during plasma doping, Patent Document 4 fails to disclose how to control the dose, and it is much less possible to precisely measure the dose by the method disclosed in Patent Document 4.

As described above, the problem of dose controllability is rooted in the principle of plasma doping, i.e., not only impurity ions that can be electrically measured but also electrically neutral impurities such as radicals and the gas that cannot be electrically measured are implanted into the substrate, and this has been noted as a problem remaining unsolved for many years, i.e., "historical hindrance", for the application of the plasma doping technique to the formation of a source/drain extension region (see D. Lenoble, SEMICONDUCTOR FABTECH—30th EDITION (hereinafter referred to as "Non-Patent Document 5")).

In view of the above, it is an object of the present invention to realize plasma doping for use in the manufacture of a semiconductor device, with which it is possible to substantially increase over the prior art the range over which the dose can be controlled precisely without detracting from the productivity or the dose uniformity across the substrate surface and without having to precisely measure the dose.

Means for Solving the Problems

In order to achieve the object set forth above, the present inventors researched on the reason why the productivity, the dose uniformity across the substrate surface, and the extent of the controllable dose range are in a trade-off relationship when forming a source/drain extension region in a planar-type device by using plasma doping, and obtained the following findings.

FIGS. 1(a)-1(h) are cross-sectional views of a main part showing steps of a method for forming a source/drain extension region in a planar-type device by using plasma doping.

First, as shown in FIG. 1(a), there is provided an SOI (silicon on insulator) substrate obtained by attaching an n-type silicon layer 3 on the surface of a silicon substrate 1 with a silicon oxide film 2 interposed therebetween, and a silicon oxide film 4 is formed as a gate insulating film on the surface of the SOI substrate.

Then, as shown in FIG. 1(b), a polycrystalline silicon layer 5A to be the gate electrode is formed on the silicon oxide film 4, after which a mask R covering the gate electrode formation region is formed on the polycrystalline silicon layer 5A by photolithography, as shown in FIG. 1(c). Then, as shown in FIG. 1(d), the polycrystalline silicon layer 5A is patterned using the mask R to form a gate electrode 5. In this process, a portion of the silicon oxide film 4 that is outside the gate electrode 5 is removed by etching. Then, as shown in FIG. 1(e), boron is introduced into the silicon layer 3 by plasma doping using the gate electrode 5 as a mask, to thereby form a shallow p-type impurity region 6 having a dose of about $1 \times 10^{15}$ cm$^{-2}$.

Then, as shown in FIG. 1(f), a silicon oxide film 7 is formed across the entire surface of the substrate using an LPCVD (low pressure chemical vapor deposition) method, for example, and the silicon oxide film 7 is etched back by anisotropic etching. Thus, the silicon oxide film 7 remains only on the side wall of the gate electrode 5 as shown in FIG. 1(g).

Then, as shown in FIG. 1(h), boron is implanted into the silicon layer 3 by ion implantation using the silicon oxide film 7 and the gate electrode 5 as a mask, to thereby form a p-type impurity region 8 to be a source/drain region. Then, a heat treatment is performed to active the implanted boron ions.

By the process described above, it is possible to form a MOSFET (metal oxide semiconductor field effect transistor), in which an extension region which is the shallow p-type impurity region 6 is formed inside a source/drain region which is the p-type impurity region 8.

In the step of forming the shallow p-type impurity region 6 shown in FIG. 1(e), plasma doping is performed using, for example, a plasma doping apparatus disclosed in Patent Document 2 shown in FIG. 2.

The plasma doping apparatus shown in FIG. 2 includes a vacuum chamber 101, a gas supplying device 102 for supplying gases into the vacuum chamber, a turbomolecular pump 103 as an exhauster for discharging the gas out of the vacuum chamber 101, a pressure controlling valve 104 as a pressure controlling device for controlling the pressure inside the vacuum chamber 101, a sample electrode 106 serving also as a sample stage on which a subject substrate (substrate) 109 is placed, a coil 108 as a plasma source (a plasma generating device for making a gas into a plasma through discharge) provided in the vicinity of a dielectric window 107 which is the ceiling portion of the vacuum chamber 101 opposing the sample electrode 106, a high-frequency power supply 105 for supplying a high-frequency power of, e.g., 13.56 MHz to the coil 108, a high-frequency power supply 110 as a voltage source for supplying a voltage to the sample electrode 106, a coolant supplying unit 111 for cooling the sample electrode 106, and a Vdc monitor 117 for monitoring the voltage supplied to the sample electrode 106. The gas needed for generating a plasma is supplied from the gas supplying device 102 through a gas introduction path 113 and a main gas path 114 in the dielectric window 107 and into the vacuum chamber 101 via a gas ejection port 115. The degree of vacuum inside the vacuum chamber 101 is controlled by the gas supplying device 102, the turbomolecular pump 103, the pressure controlling valve 104 and a dry pump 112. Moreover, a power is supplied to the sample electrode 106 in the vacuum chamber 101 from the high-frequency power supply 110 through a matching box 116. Thus, a power is supplied to the subject substrate 109 mounted on the sample electrode 106, which serves also as a sample stage.

FIG. 3 shows the relationship between the sheet resistance of the source/drain extension region and the plasma doping time in a case where the source/drain extension region of a planar-type device is formed by a method disclosed in Patent Document 1 or 2 using a plasma doping apparatus shown in FIG. 2. While "value of the target sheet resistance" in FIG. 3 is a value that is demanded by the device structure and varies for different devices, there are two methods of Comparative Examples 1 and 2 described below as the manufacturing methods therefor.

First, the characteristics of Comparative Examples 1 and 2 will be described. In both Comparative Examples 1 and 2, as the plasma doping time increases, the dose of the impurity implanted increases, thereby decreasing the sheet resistance. The rate of decrease of the sheet resistance is very high while the plasma doping time is short (during the initial period), but decreases as the plasma doping time increases, eventually reaching a point where the sheet resistance is substantially constant. These are true both in Comparative Examples 1 and 2. Note however that the plasma doping conditions of Comparative Examples 1 and 2 are in the following relationship with respect to each other. That is, the implantation dose under the conditions of Comparative Example 1 is greater than that of Comparative Example 2. More specifically, at least one of the concentration of the gas containing an impurity, the flow rate of the gas and the pressure of the gas of the conditions of Comparative Example 1 is greater than that of the conditions of Comparative Example 2. Thus, as compared at a certain plasma doping time, the sheet resistance under the conditions of Comparative Example 1 is smaller than that of Comparative Example 2.

Now, in order to realize the target sheet resistance in Comparative Example 1, the plasma doping time is shortened, in other words, the plasma is made to become extinct in the initial period of the doping process so as to prevent the implantation of an amount of impurity greater than or equal to a predetermined amount. However, when the plasma doping time is shortened, the dose across the substrate surface varies greatly. This corresponds to the width of the band (hereinafter referring to the width between the solid lines sandwiching the broken line), representing the relationship between the sheet resistance and the plasma doping time in FIG. 3, which becomes smaller as the plasma doping time increases and becomes substantially constant after a certain point in time. That is, the sheet resistance uniformity across the substrate surface is poor while the plasma doping time is short (during the initial period), and improves as the plasma doping time increases. The width of a band representing the relationship between the sheet resistance and the plasma doping time that can be obtained at a certain point on the substrate surface when the plasma doping is repeated using the conditions of Comparative Example 1 is also similar to the width of the band shown in FIG. 3. That is, the reproducibility of the sheet resistance across the substrate surface is also poor while the plasma doping time is short (during the initial period), and improves as the plasma doping time increases.

The reason for such phenomena is the same for uniformity and for reproducibility. The reason will now be described. The present inventors found that the sheet resistance decreases as the plasma doping time increases and becomes substantially constant at a certain level, and that the level at which the sheet resistance becomes constant is determined primarily by the impurity gas concentration. Specifically, conditions such as the source power, the chamber pressure and the gas flow rate of a plasma doping apparatus may vary slightly between different points on the substrate surface or between different iterations of the plasma doping. Particularly, while the plasma doping time is short (i.e., during the initial period of the doping process), the sheet resistance varies substantially across the substrate surface or between substrates due to these differences. However, as the plasma doping time increases, the amount of impurity implanted into the substrate and the amount of impurity sputtered from the substrate balance with each other to reach an equilibrium so that a sheet resistance inherent to the impurity gas concentration is achieved. Therefore, by managing the distribution of the impurity gas concentration across the substrate surface so that the target sheet resistance is obtained, the sheet resistance at a position on the substrate surface where the sheet resistance is higher than the target sheet resistance due to variations in other parameters while the plasma doping time is short (during the initial period) decreases at a higher rate as the plasma doping time increases as compared with a position on the substrate surface of an average sheet resistance. On the other hand, the sheet resistance at a position on the substrate surface where the sheet resistance is lower than the target sheet resistance due to variations in other parameters while the plasma doping time is short (during the initial period) decreases at a lower rate as the plasma doping time increases as compared with a position on the substrate surface of an average sheet resistance. Thus, as the plasma doping time passes a certain point, the sheet resistance at each point on the substrate surface becomes very close to the average sheet resistance, thereby realizing good uniformity across the surface.

This mechanism similarly applies to the reproducibility. Where the plasma doping is repeated, by managing the reproducibility of the impurity gas concentration so that the target sheet resistance can be obtained at a certain point of interest on the substrate surface, the sheet resistance of a substrate among others where the sheet resistance is higher than the target sheet resistance due to variations in other parameters while the plasma doping time is short (during the initial period) decreases at a higher rate as the plasma doping time increases as compared with a substrate of an average sheet resistance. On the other hand, the sheet resistance of a substrate among others where the sheet resistance is lower than the target sheet resistance due to variations in other parameters while the plasma doping time is short (during the initial period) decreases at a lower rate as the plasma doping time increases as compared with a substrate of an average sheet resistance. Thus, as the plasma doping time passes a certain point, the sheet resistance of every substrate becomes very close to the average sheet resistance, thereby realizing good reproducibility.

With the mechanism described above, when one attempts to obtain the target sheet resistance A shown in FIG. 3 in Comparative Example 1, it is necessary to stop the impurity implantation while the plasma doping time is short (during the initial period), and it is therefore difficult to improve the uniformity and the reproducibility. This is similarly true also when one attempts to obtain the target sheet resistance B. It is necessary to stop the impurity implantation while the plasma doping time is short (during the initial period), and it is therefore difficult to improve the uniformity and the reproducibility.

When one attempts to obtain the target sheet resistance A shown in FIG. 3 in Comparative Example 2, the plasma doping time can be set to a certain length or more, and it is therefore possible to improve the uniformity and the reproducibility to an intended level, but when one attempts to obtain the target sheet resistance B, it cannot be obtained since the sheet resistance obtained in Comparative Example 2 cannot be decreased to the level of the sheet resistance B. In view of the device design, there is a demand for performing processes with different target sheet resistance levels successively using the same process chamber. Therefore, it is important to realize a method with which it is possible to obtain the sheet resistance A and the sheet resistance B shown in, e.g., FIG. 3 using the same process chamber, and not being able to realize this is a very significant problem in practice.

Based on the findings described above, the present inventors solved the problem of the trade-off relationship between improving the uniformity and the reproducibility and expanding the controllable dose range, and invented a method for manufacturing a semiconductor device with which it is possible to improve the uniformity and the reproducibility while significantly expanding the controllable dose range.

The present invention is, as will be described later, a method of applying, to planar-type devices and fin-type devices, the fact that there is a time range in which the influence of doping, the influence of deposition and the influence of sputtering on the upper surface of the substrate during plasma doping remain in an equilibrium if one selects plasma doping conditions such that an appropriate deposition rate is achieved. Specifically, the present inventors have discovered that in this time range, the temporal increase rate of the implantation dose is greater than zero and is constant irrespective of the plasma doping time, i.e., that the temporal decrease rate of the sheet resistance is less than zero and is constant irrespective of the plasma doping time, thus arriving at the present invention "which uses a predetermined plasma doping time included within a time range in which the deposition rate is greater than 0 nm/min and less than or equal to 5 nm/min." That is, it is possible to obtain a time range in which the temporal increase rate of the implantation dose is greater than zero and is constant irrespective of the plasma doping time, by selecting plasma doping conditions so that the deposition rate on the substrate by a plasma is greater than 0 nm/min and less than or equal to 5 nm/min.

The predetermined plasma doping time can be determined as follows, for example. That is, for each of a plurality of positions on the surface of a dummy substrate, the time range for which the temporal change rate of the dose of the impurity with which the position is doped becomes substantially constant is obtained, and the predetermined plasma doping time is determined to be within one of these time ranges that contains the longest period of time.

Now, if the deposition rate is greater than 5 nm/min, i.e., if the deposition rate becomes too high, as in a method disclosed in Patent Document 4 (where the deposition rate is 10 nm per 30 seconds, i.e., 20 nm/min), substantially only the deposition phenomenon, but not the implantation phenomenon, is seen on the substrate, and it is then not possible to control the dose itself. Moreover, a film whose main component is an undesirable impurity is formed on the surface of the substrate to a thickness beyond tolerable limits, thereby resulting in problems, e.g., it becomes difficult to peel off the resist formed on the surface of the substrate, and the amount of impurity in the semiconductor exceeds the solubility limit, thus deteriorating the characteristics of the semiconductor device. Herein, in a case where the substrate is exposed to a plasma containing $B_2H_6$, for example, the film whose main component is an impurity is a film formed by boron deposited on the substrate.

On the other hand, in a case where the deposition rate is less than or equal to zero, in other words, the etching rate is greater than or equal to zero, the implantation dose remains constant irrespective of the time, and the degree of increase in the implantation dose with respect to the increase in the plasma doping time will be very small, and therefore the controllable dose range will be very small. This is a finding which the present inventors newly obtained as a result of studying the plasma doping method of Patent Document 1. That is, by measuring the etching rate as will be described later, the present inventors newly found that the etching rate is greater than or equal to zero in the plasma doping method of Patent Document 1, and therefore there appears a time period during the plasma doping in which the increase in the dose due to the impurity implantation phenomenon balances with the decrease in the dose due to the impurity sputtered from the substrate surface, so that the dose as a whole remains substantially constant with respect to the passage of time. The present invention was made starting from this finding, and it is an important finding that where the etching rate during plasma doping is greater than or equal to zero, there appears a time period in which the dose as a whole remains substantially constant with respect to the passage of time.

Next, the method of the present invention, which is particularly advantageous in realizing a highly-precise dose controllability over a wide range, will be described with reference to FIGS. 4(a)-4(d), which show the relationship between the plasma doping time and the implantation dose.

In the method of the present invention, during the initial period of plasma doping (hereinafter referred to as "the initial region A"), since the dose introduced into the substrate per unit time is high, the rate of decrease of the sheet resistance with respect to time is high. Specifically, as shown in FIGS. 4(a) and 4(b), the dose rapidly increases according to (Expression 1) below:

$$\text{Dose} = A \times (\text{Time})^B \quad \text{(Expression 1)}$$

(where Dose denotes the dose, Time denotes the time, and A and B denote coefficients). While the temporal increase rate of the dose is represented by (Expression 2) below:

$$dD/dT = A \times B \times (\text{Time})^{B-1} \quad \text{(Expression 2)}$$

this value also increases. The reason for this is believed to be as follows. That is, in the initial region A, the amount of impurity implanted into or attached to the surface of the substrate is small, and an impurity is therefore more likely to be implanted or attached by the plasma doping. In the initial region A, the implantation phenomenon and the deposition phenomenon are dominant, and the influence of the sputtering phenomenon cannot be seen from the dose transition though it may possibly be occurring.

However, as shown in FIGS. 4(a) and 4(c), after the passage of a certain amount of time, the dose introduced per unit time becomes smaller than that in the initial region A according to (Expression 3) below, and therefore the rate of decrease of the sheet resistance with respect to time becomes smaller than that in the initial region A:

$$\text{Dose} = A \times (\text{Time}) + B \quad \text{(Expression 3)}$$

(where Dose denotes the dose, Time denotes the time, and A and B denote coefficients). Moreover, in the time region (hereinafter referred to as "the process region B"), it is characteristic that the dose introduced per unit time remains constant (substantially constant in the experiment) as shown in FIGS. 4(a) and 4(c) according to (Expression 4) below:

$$dD/dT = A(\text{Constant}) \quad \text{(Expression 4)}$$

The reason for this is believed to be as follows. That is, in the process region B, the amount of impurity implanted into or attached to the surface of the substrate is larger than that in the initial region A, and therefore the implantation phenomenon and the deposition phenomenon are suppressed as compared to those in the initial region A, and the influence of the sputtering phenomenon is increased since the impurity attached to the substrate surface is likely to be detached. In the process region B, a balance is achieved at a level where the implantation phenomenon and the deposition phenomenon are more dominant than the sputtering phenomenon. In the present invention, the plasma doping time is appropriately selected, according to the target dose, from the time included within the process region B, thereby realizing a significant effect that the dose can be adjusted precisely and easily over a wide range.

Then, as shown in FIGS. 4(a) and 4(d), after the passage of another certain amount of time, the dose introduced per unit time becomes very high than that in the process region B which is the time region of the process window of the present invention according to (Expression 5) below, and therefore the rate of decrease of the sheet resistance with respect to time becomes higher than that in the process region B:

$$\text{Dose}=A\times\exp(B\times\text{Time}) \quad \text{(Expression 5)}$$

(where Dose denotes the dose, Time denotes the time, and A and B denote coefficients). Moreover, the temporal increase rate of the dose becomes very high as represented by (Expression 6) below:

$$dD/dT=A\times B\times\exp(B\times\text{Time}) \quad \text{(Expression 6)}$$

It is believed that in the time region (hereinafter referred to as "the deposition region C"), the amount of impurity injected exceeds the saturating amount that can be contained in the implantation layer and the substrate surface, thereby starting to form a deposit whose main component is an impurity. Since a portion of the impurity in the deposit formed on the substrate in the deposition region C diffuses out during the activation heat treatment, not all of the amount of impurity injected in the deposition region C contribute to the reduction in the sheet resistance.

As described above, in the present invention the plasma doping time is appropriately selected, according to the target dose, from the time included within the process region B, thereby realizing a significant effect that the dose can be adjusted precisely and easily over a wide range.

Next, the method of the present invention, which is particularly advantageous in realizing the dose uniformity across the substrate surface, will be described.

In the initial period of plasma doping (the initial region A) in the method of the present invention, since the rate of increase of the dose introduced per unit time is high, variations in the sheet resistance across the substrate surface and variations in the sheet resistance between substrates are both large. That is, there is a position on the substrate surface, or a substrate among all the substrates, that has a higher sheet resistance than the average sheet resistance across the substrate surface or the average sheet resistance among all the substrates, and there is also a position or a substrate that has a lower sheet resistance than the average sheet resistance.

In a position or a substrate having a higher sheet resistance than the average sheet resistance, a comparison between the sum of the influence of the impurity being implanted into the semiconductor substrate and the influence of the impurity deposited on the surface of the semiconductor substrate, and the influence of the impurity being dissociated from the semiconductor substrate due to sputtering shows that the former is greater and that the difference therebetween is greater than that in a position or a substrate having a sheet resistance closer to the average sheet resistance. Therefore, in a position or a substrate having a higher sheet resistance than the average sheet resistance, as compared with a position or a substrate having a sheet resistance closer to the average sheet resistance, a reaction in which the implantation phenomenon, the deposition phenomenon and the sputtering phenomenon are mixed together proceeds in such a direction that the sheet resistance decreases at a higher temporal decrease rate. This reaction proceeds until reaching a sheet resistance of the same level as the average sheet resistance.

Conversely, in a position or a substrate having a lower sheet resistance than the average sheet resistance, a comparison between the sum of the influence of the impurity being implanted into the semiconductor substrate and the impurity deposited on the surface of the semiconductor substrate, and the influence of the impurity being dissociated from the semiconductor substrate due to sputtering shows that the former is greater but the difference therebetween is smaller than that in a position or a substrate having a sheet resistance closer to the average sheet resistance. Therefore, in a position or a substrate having a lower sheet resistance than the average sheet resistance, as compared with a position or a substrate having a sheet resistance closer to the average sheet resistance, a reaction in which the implantation phenomenon, the deposition phenomenon and the sputtering phenomenon are mixed together proceeds in such a direction that the sheet resistance decreases at a lower temporal decrease rate. This reaction proceeds until reaching a sheet resistance of the same level as the average sheet resistance.

On the other hand, in a position or a substrate having a sheet resistance closer to the average sheet resistance, a comparison between the sum of the influence of the impurity being implanted into the semiconductor substrate and the influence of the impurity deposited on the surface of the semiconductor substrate, and the influence of the impurity being dissociated from the semiconductor substrate due to sputtering shows that the former is greater and the value thereof is constant. Therefore, the sheet resistance decreases at a constant rate as the plasma doping time increases. That is, a reaction in which the implantation phenomenon, the deposition phenomenon and the sputtering phenomenon are mixed together proceeds in such a direction that the sheet resistance decreases at an average temporal decrease rate.

With any of the three types of positions or substrates classified based on the status of the sheet resistance as described above, the temporal change of the sheet resistance starts converging to a decreasing straight line pointing toward the target sheet resistance, and it is possible to obtain a state where the uniformity and the reproducibility are very good after the passage of a certain period of time. This time region is the process region B described above. On the other hand, in the deposition region C where the dose changes rapidly with respect to the plasma doping time, after passing the time period of the process region B, the phenomenon in which the impurity is deposited on the substrate surface is very dominant, and it is therefore not possible to obtain a good uniformity and reproducibility.

The mechanism of the present invention will now be described so that it can be understood more easily. The present inventors made an in-depth research on the temporal change of the sheet resistance at a plurality of positions on the substrate surface, and as a result newly found that the temporal change rate of the dose remains substantially constant over the time region which is referred to as the process region B in the present invention at a plurality of positions on the substrate surface, and that the temporal change rates are substantially the same. This indicates that in the time region which is referred to as the process region B in the present invention, the temporal change rate of the dose is very insensitive to variations in the plasma density, the pressure, the gas concentration, or the like, across the substrate surface. That is, the present invention newly focuses on the fact that the dose, which increases rapidly during the initial period of plasma doping, increases relatively mildly thereafter, and that the temporal change rate of the mildly-increasing dose is very insensitive to variations in parameters such as the plasma density, the pressure and the gas concentration across the substrate surface, and the present invention utilizes the fact that a comparison between the initial region A and the subsequent process region B shows that the temporal change rate of the dose is lower in the latter. Thus, in the process region B, the temporal change of the sheet resistance starts converging to a decreasing straight line pointing toward the target sheet resistance both across the substrate surface and between substrates, and it is possible to obtain a state where the uniformity and the reproducibility are very good after the passage of a certain period of time. Then, in the deposition region C, the rate of impurity deposition on the substrate surface becomes sensitive to variations in the plasma density, the pressure, the gas concentration, and the like, across the substrate surface, thereby resulting in significant dose variations across the substrate surface.

In the present invention, over the range of plasma doping time in which the temporal change rate of the dose remains constant irrespective of the length of the plasma doping time, it is more preferred that the coefficient B is 1.3 or less when the impurity dose D ($cm^{-2}$) is represented as $D=A \times t^B$ (where A and B are coefficients) where the plasma doping time is denoted as t (sec). The reason for this will be described with reference to FIGS. 5(a)-5(f), 6(a) and 6(b). Herein, the behavior of a continuous doping phenomenon over 30 seconds or more, which is considered a long period of time as an ordinary process window of plasma doping time, will be described. That is, whether effects can be obtained by utilizing a phenomenon that lasts over at least 30 seconds or more, regarded as a single phenomenon, will be discussed. As shown in FIGS. 5(a)-5(f), 6(a) and 6(b), the coefficient B is greater than 1.3 during the initial period of plasma doping (i.e., the initial region A during which the plasma doping time is short). Moreover, with the period being divided into the initial region A and the process region B each as a phenomenon that lasts continuously over 30 seconds or more, the coefficient of correlation $R^2$ between the dose D represented by $D=A \times t^B$ and the actual dose is small in the initial region A as shown in FIGS. 6(a) and 6(b), and it is difficult to represent the dose by $D=A \times t^B$. In contrast, as the plasma doping time increases, the coefficient B decreases, and the coefficient of correlation $R^2$ between the dose D represented by $D=A \times t^B$ and the actual dose also approaches 1. Then, when reaching the time region where the coefficient B is less than or equal to 1.3, i.e., the process region B, the coefficient of correlation $R^2$ between the dose D represented by $D=A \times t^B$ and the actual dose becomes very close to 1, and at the same time it becomes possible to regard the dose as changing linearly with respect to time. That is, when the coefficient B is 1.3 or less, in other words, when the plasma doping time is 43 seconds or more, it becomes possible to easily and precisely control the dose by the plasma doping time.

In the present invention, it is more preferred that the coefficient B is greater than 0.4. The reason will be described with reference to FIGS. 7(a)-7(c). As shown in FIGS. 7(a)-7(c), also in the conventional method disclosed in Patent Document 1 in the prior art, there is a time region in which the dose changes linearly with respect to time. In the method of Patent Document 1, however, the coefficient B is 0.4 or less, and the temporal change rate of the dose is therefore very small (specifically, $1.5 \times 10^{13}$ $cm^{-2}$/sec or less). Therefore, there is a problem in practice that the range over which the dose can be controlled only by the plasma doping time will be very narrow. In contrast, by setting the coefficient B to be greater than 0.4 in the present invention, it is possible to obtain an effect that the range over which the dose can be controlled only by the plasma doping time can be expanded significantly.

Effects of the Invention

According to the present invention, it is possible to implant an impurity into the substrate without substantially etching the substrate by appropriately selecting the plasma doping time when performing the plasma doping process using plasma doping conditions such that the deposition rate on the substrate surface by a plasma generated from a gas containing the impurity is appropriately positive (i.e., the etching rate of the substrate is negative). It is also possible, by adjusting only the plasma doping time, to easily control the dose over a wide range while ensuring a good uniformity and reproducibility of the impurity dose. Moreover, it is possible to achieve these effects without lowering the productivity and without having to measure the dose with a high precision.

BRIEF DESCRIPTION OF THE DRAWINGS

FIGS. 6(a) and 6(b) illustrate the reason why it is preferred that the coefficient B is 1.3 or less when the impurity dose D ($cm^{-2}$) is represented as $D=A \times t^B$ (where A and B are coefficients) where the plasma doping time is denoted as t (sec) in the plasma doping method of the present invention.

FIGS. 7(a)-7(c) illustrate the reason why it is preferred that the coefficient B is greater than 0.4 when the impurity dose D ($cm^{-2}$) is represented as $D=A \times t^B$ (where A and B are coefficients) where the plasma doping time is denoted as t (sec) in the plasma doping method of the present invention.

FIG. 21 shows a typical example of the sheet resistance distribution across the substrate surface, obtained when the plasma doping process of a method for manufacturing a semiconductor device according to one embodiment of the present invention is performed, with the plasma doping time being 60 seconds.

FIG. 22 shows the sheet resistance reproducibility in a case where the plasma doping process of a method for manufacturing a semiconductor device according to one embodiment of the present invention is performed repeatedly, with the plasma doping time for each subject substrate being 120 seconds.

FIGS. 27(a)-27(h) illustrate a method for determining the boundary between the initial region A and the process region B in a plasma doping process of a method for manufacturing a semiconductor device according to one embodiment of the present invention.

FIGS. 28(a)-28(d) illustrate a method for determining the boundary between the initial region A and the process region B in a plasma doping process of a method for manufacturing a semiconductor device according to one embodiment of the present invention.

DESCRIPTION OF REFERENCE NUMERALS

Figure 1:
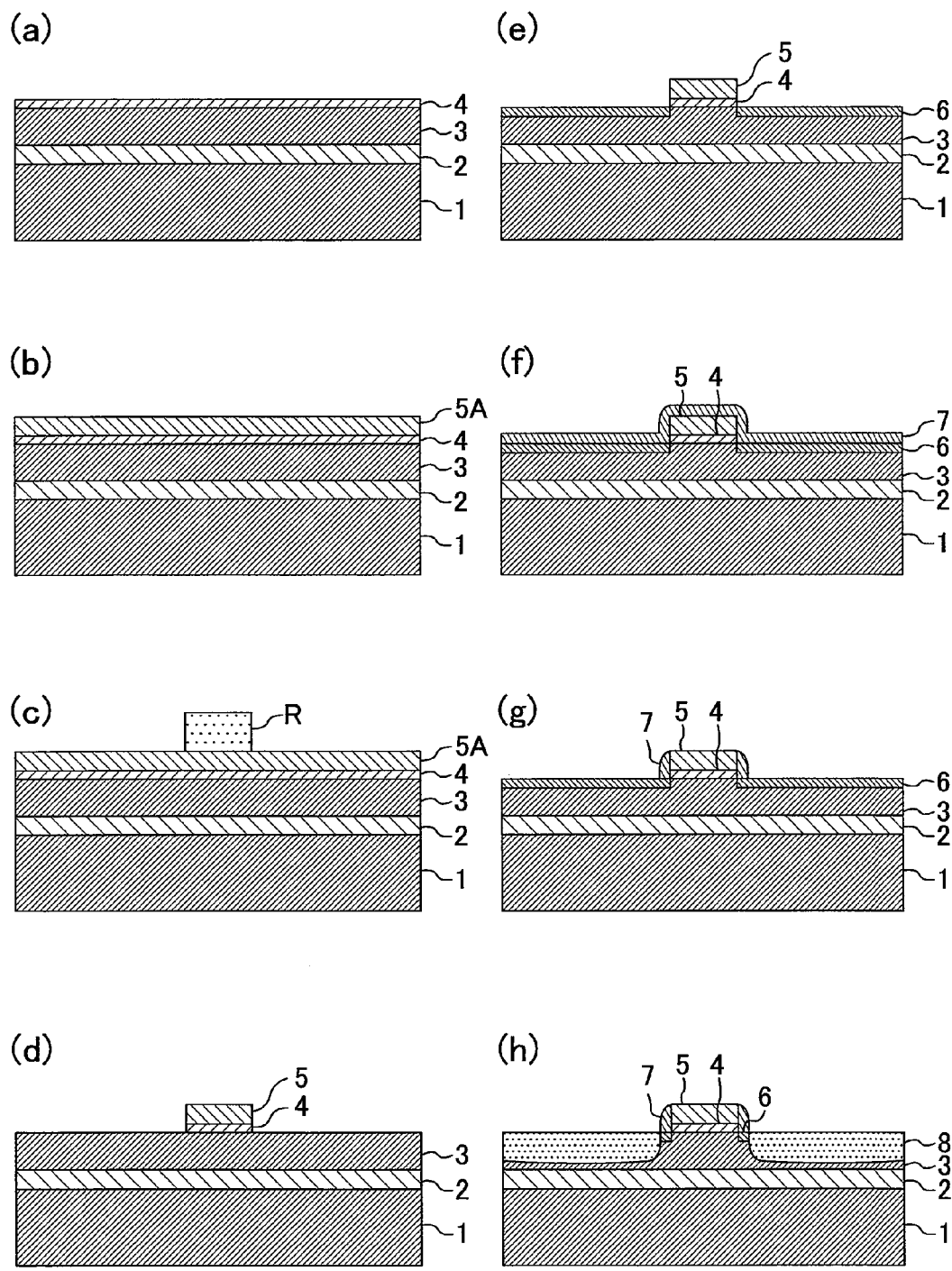
FIGS. 1(a)-1(h) are cross-sectional views of a main part showing steps of a method for forming a source/drain extension region in a planar-type device by using plasma doping.
Figure 2:
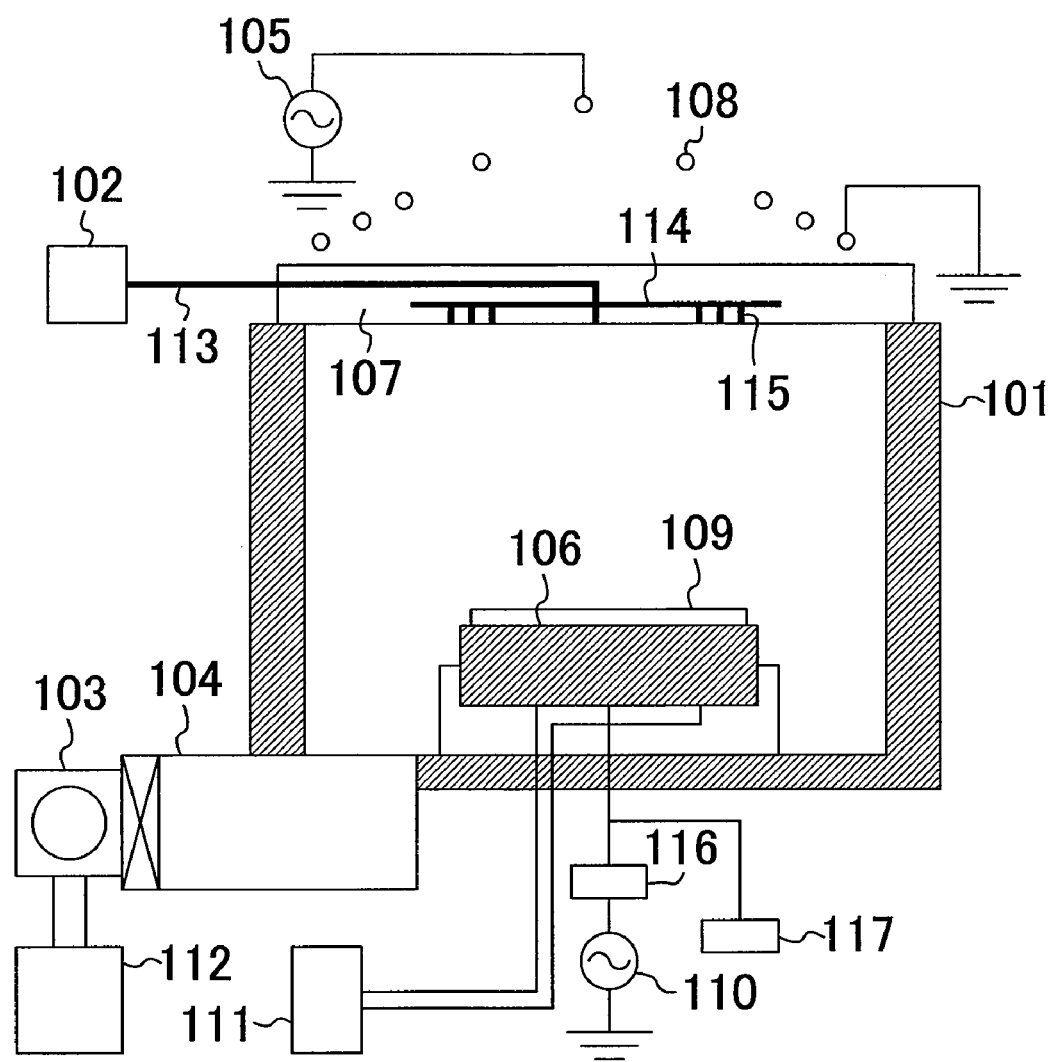
FIG. 2 is a cross-sectional view of a conventional plasma doping apparatus.
Figure 3:
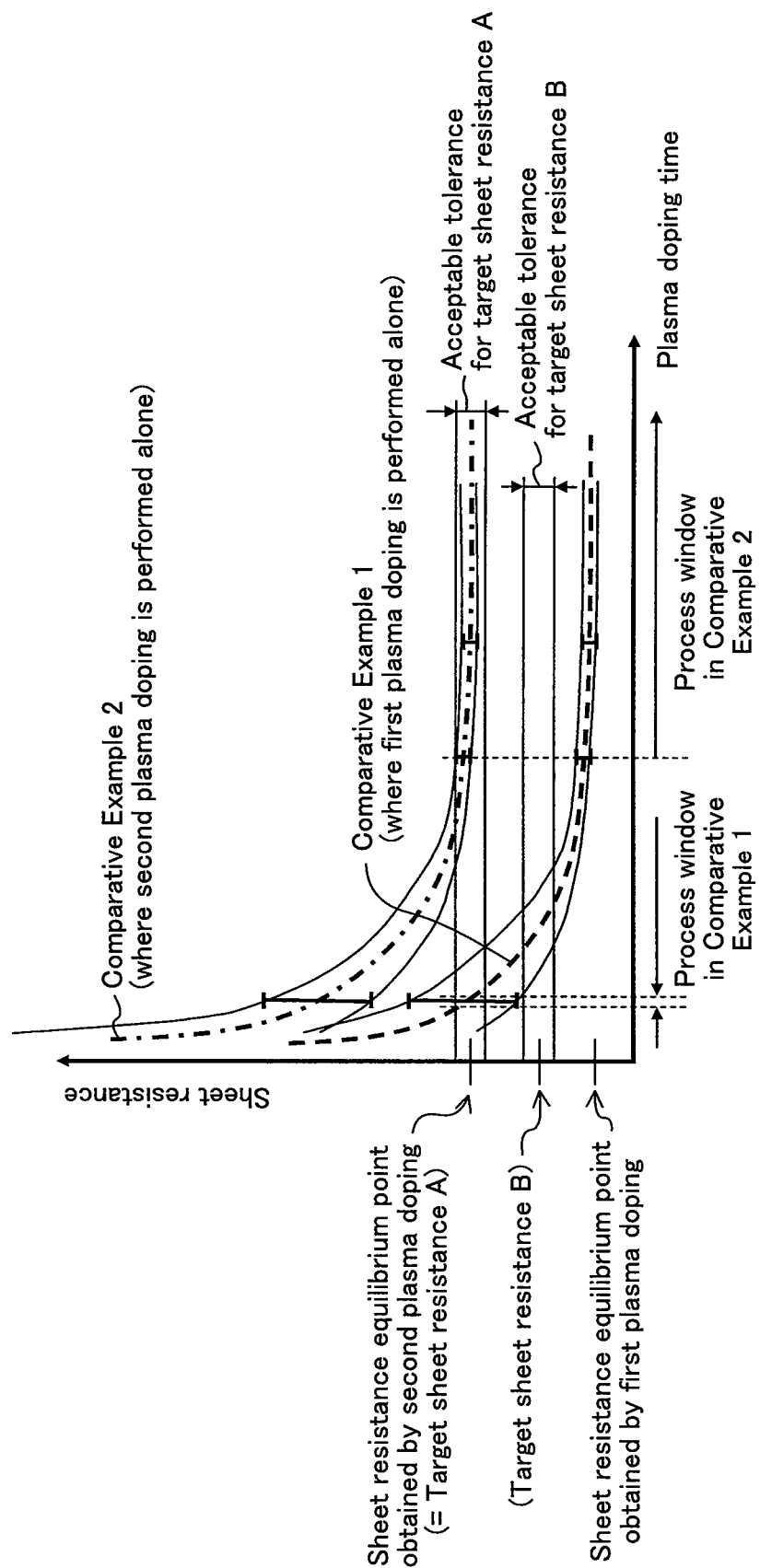
FIG. 3 shows the relationship between the sheet resistance of a source/drain extension region and the plasma doping time in a case where a source/drain extension region of a planar-type device is formed by a conventional plasma doping method.
Figure 4:
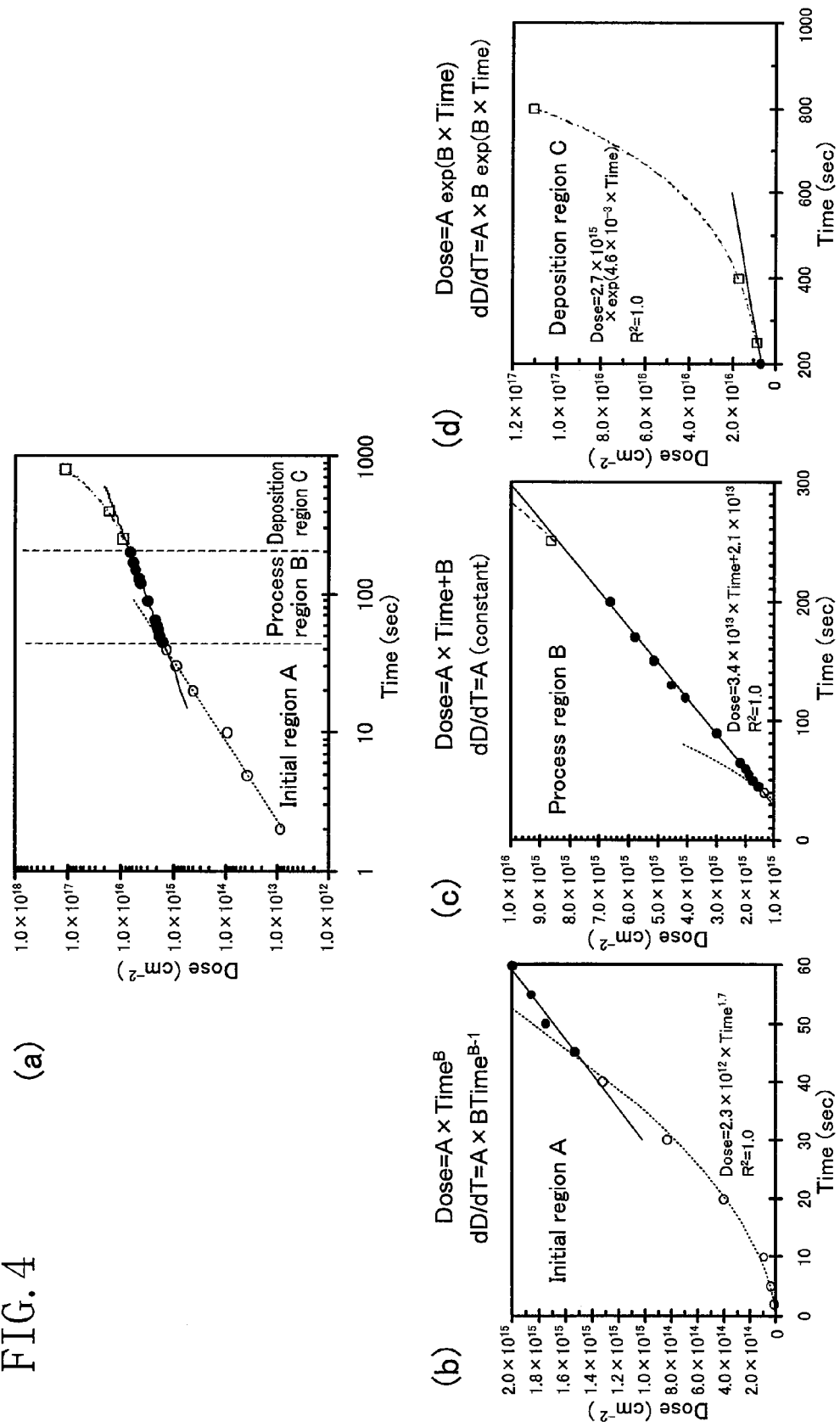
FIGS. 4(a)-4(d) show the relationship between the plasma doping time and the implantation dose in a plasma doping method of the present invention.
Figure 5:
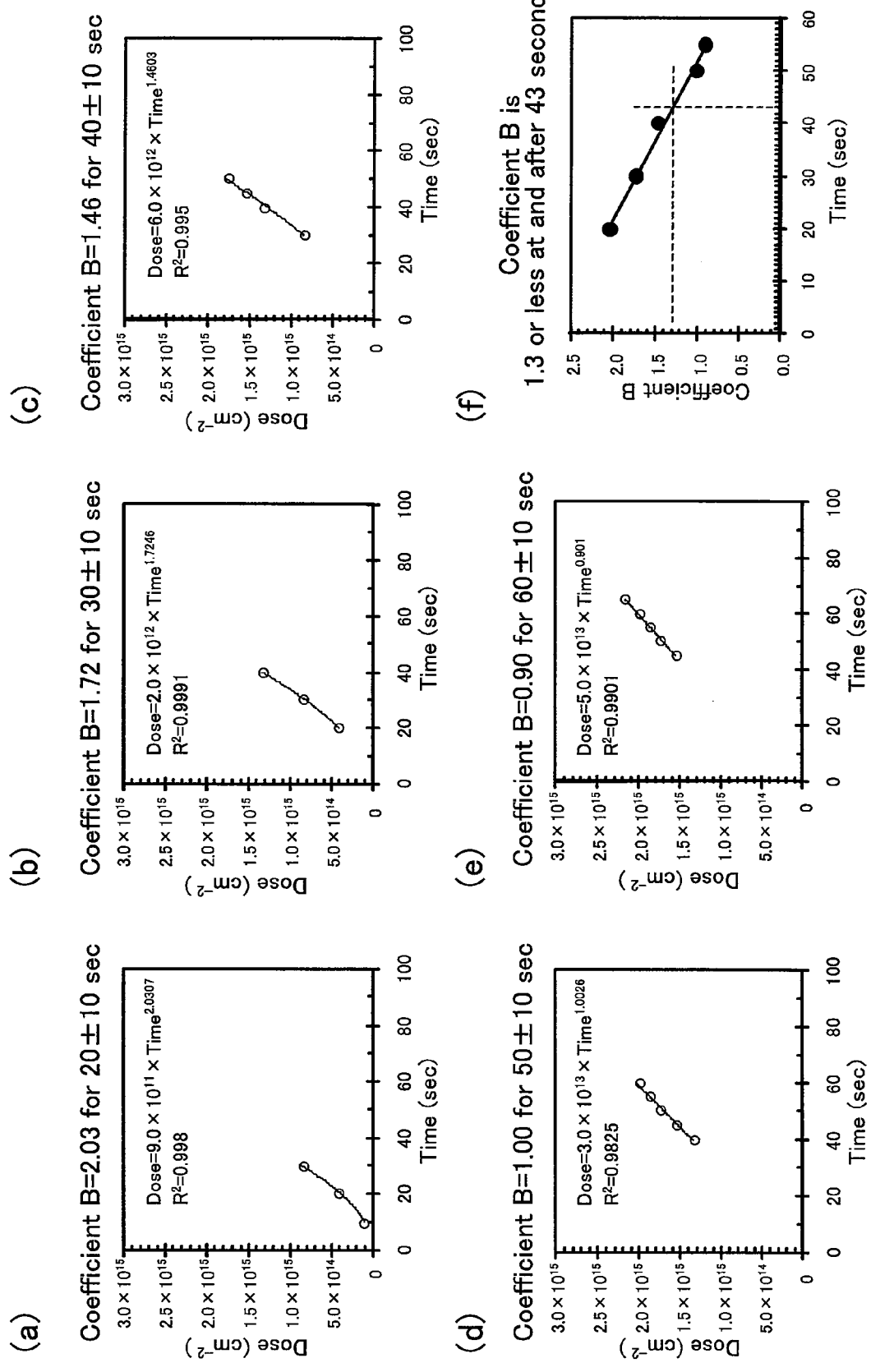
FIGS. 5(a)-5(f) illustrate the reason why it is preferred that the coefficient B is 1.3 or less when the impurity dose D ($cm^{-2}$) is represented as $D=A \times t^B$ (where A and B are coefficients) where the plasma doping time is denoted as t (sec) in the plasma doping method of the present invention.

1 Silicon substrate
2 Silicon oxide film
3 Silicon layer
4 Silicon oxide film
5A Polycrystalline silicon layer
5 Gate electrode
6 Impurity region
7 Silicon oxide film
8 Impurity region
R Mask
101 Vacuum chamber
102 Gas supplying device
103 Turbo molecular pump
104 Pressure controlling valve
105 High-frequency power supply
106 Sample electrode
107 Dielectric window
108 Coil
109 Subject substrate
110 High-frequency power supply
111 Coolant supplying unit
112 Dry pump
113 Gas introduction path
114 Main gas path
115 Gas ejection port
116 Matching box
117 Vdc monitor
201 Vacuum chamber
202 Vacuum exhaust port
203 Sample electrode
204 Top plate
205 Gas supplying device
206 Gas supply port
207 High-frequency power supply
208 Coil
209 Sample
210 High-frequency power supply
220 Central gas supply port
221 Peripheral gas supply port
222a First gas introduction pipe
222b Second gas introduction pipe
226 Viewing window
227 Sensor
228 Gas branch pipe
229 Gas introduction pipe
231 Vacuum chamber
232 Vacuum exhaust port
233 Sample electrode
234 Top plate
235 Coil
236 High-frequency power supply
237 Gas supply pipe
238 Gas branch pipe
239 Gas supply port
240 Sample
241 High-frequency power supply
242 Gas supplying device

BEST MODE FOR CARRYING OUT THE INVENTION

Embodiment

A method for manufacturing a semiconductor device according to one embodiment of the present invention will now be described with reference to the drawings. The method for manufacturing a semiconductor device of the present embodiment is a method for forming an impurity region by exposing a substrate to a plasma generated from a gas containing an impurity to thereby dope a surface portion of the substrate with the impurity, and the basic steps thereof are similar to those shown in FIGS. 1(a)-1(h), for example.

Figure 8:
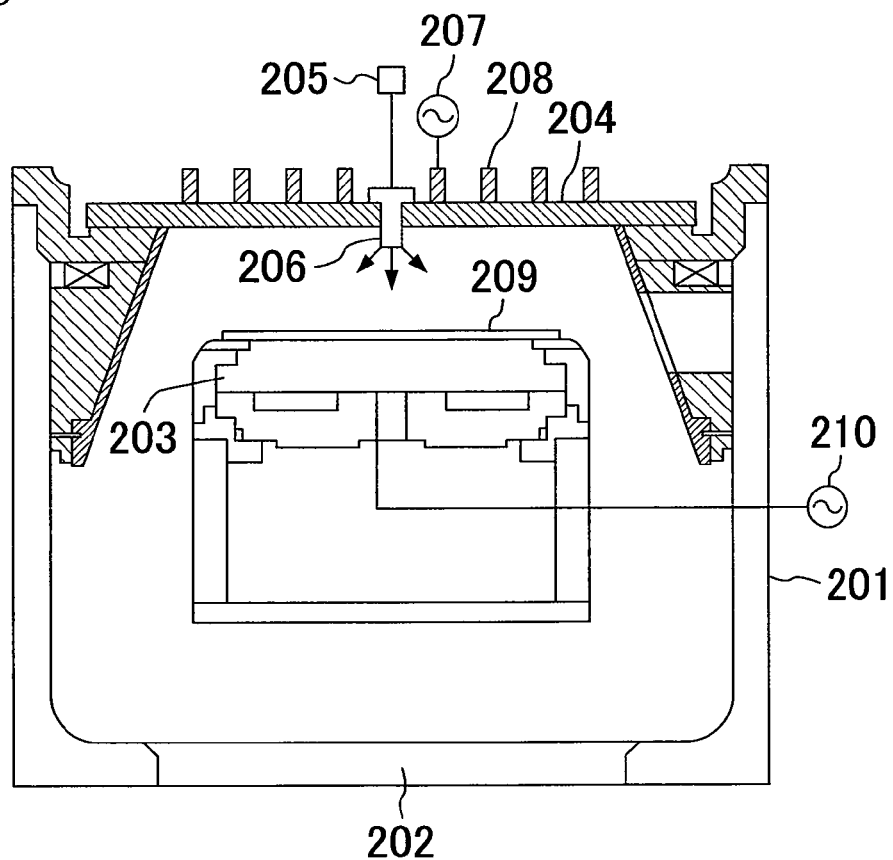
FIG. 8 is a cross-sectional view showing a general configuration of a plasma doping process apparatus used in a plasma doping process in a method for manufacturing a semiconductor device according to one embodiment of the present invention.

FIG. 8 is a cross-sectional view showing a general configuration of a plasma doping process apparatus used in a plasma doping process (e.g., the step of forming the shallow p-type impurity region 6 shown in FIG. 1(e)) in a method for manufacturing a semiconductor device of the present embodiment.

As shown in FIG. 8, a sample electrode 203 for receiving a sample 209 such as, for example, a silicon substrate, to be placed thereon is provided in a vacuum chamber 201, and a high-frequency power supply 210 is connected to the sample electrode 203. A top plate 204 made of a dielectric is provided on the upper wall of the vacuum chamber 201, and multiple coils 208 are provided on the upper surface of the top plate 204, with a high-frequency power supply 207 connected to the coils 208. A gas supply port 206, which uses the same dielectric as the top plate 204, is provided in a central portion of the top plate 204. Connected to the gas supply port 206 is a gas supplying device 205 for supplying $B_2H_6$, for example, which is an impurity supply gas containing an intended element and He, for example, which is a diluent gas. A vacuum exhaust port 202 capable of decreasing and adjusting the pressure inside the vacuum chamber 201 is provided in a bottom portion of the vacuum chamber 201.

Herein, a high-frequency power is supplied to the coils 208 from the high-frequency power supply 207 to generate a magnetic field around the coils 208, which propagates into the vacuum chamber 201 via the top plate 204 made of a dielectric, thereby exciting a gas containing an intended impurity in the vacuum chamber 201 into a plasma state (ions, radicals, neutral molecules, etc.). Moreover, by supplying the high-frequency power to the sample electrode 203 from the high-frequency power supply 210, it is possible to control the potential of the sample electrode 203. The potential is negative with respect to the plasma. With the negative potential with respect to the plasma, ions of boron, for example, which is an intended impurity in the plasma, can be implanted into the surface of the sample 209.

Figure 9:
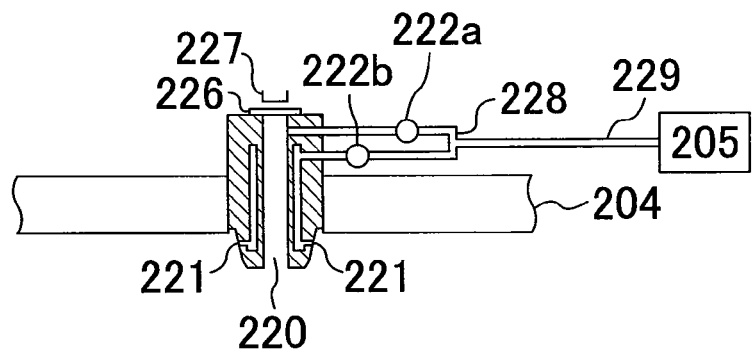
FIG. 9 shows a gas supply port and a peripheral portion thereof in the plasma doping process apparatus shown in FIG. 8.

FIG. 9 shows the gas supply port 206 and a peripheral portion thereof in the plasma doping process apparatus shown in FIG. 8.

As shown in FIG. 9, the gas supplied from the gas supplying device 205 through a gas introduction pipe 229 is branched into two branches at a gas branch pipe 228. One of the gas pipes branching at the gas branch pipe 228 (a first gas introduction pipe 222a) communicates with a central gas supply port 220, and a gas is supplied vertically from the central gas supply port 220 toward a central portion of the sample 209 in the vacuum chamber 201. The other one of the gas pipes branching at the gas branch pipe 228 (a second gas introduction pipe 222b) communicates with a peripheral gas supply port 221, and a gas is supplied from the peripheral gas supply port 221 from a central portion toward a peripheral portion of the sample 209 in the vacuum chamber 201. A sensor 227 is provided above the central gas supply port 220 in the gas supply port 206 with a viewing window 226 interposed therebetween.

Next, conditioning, which is a process of setting the plasma doping process apparatus described above to a state where plasma doping can be performed, will be described. Herein, in the plasma doping process conditions to be described later, the $B_2H_6$ gas containing an intended impurity is present in the vacuum chamber 201 only by 0.73% in mass concentration, and the remaining gas is He which is a diluent gas. Under such conditions, the dose varies significantly depending on how boron ions, which are produced in the plasma state of $B_2H_6$ supplied into the vacuum chamber 201, are implanted into the sample 209. First, by maintenance, or the like, a boron-containing deposit is removed from portions of the vacuum chamber 201 that are to be exposed to a plasma, such as the inner wall and the top plate 204. Then, a plasma doping process is performed, whereby particles in the plasma state (ions, radicals, neutral molecules, etc.) are consumed by being implanted into or deposited on the inner wall and the top plate 204 of the vacuum chamber 201 exposed to the plasma. Herein, if the gas containing $B_2H_6$ is turned into a plasma state in the vacuum chamber 201, boron ions in the plasma are consumed by being implanted into the inner wall and the top plate 204 of the vacuum chamber 201. Alternatively, boron ions in the plasma are deposited as a boron-containing product on the inner wall and the top plate 204 of the vacuum chamber 201, thereby decreasing boron ions, which are necessary for the sample 209. Then, the thickness of the deposit, which is the boron-containing product described above, on the inner wall and the top plate 204 of the vacuum chamber 201 increases as the plasma doping process is repeated. Herein, as described above, particles in a plasma state are implanted into the inner wall and the top plate 204 of the vacuum chamber 201, which are exposed to a plasma. As a result, the boron-containing product, which has been deposited on the inner wall and the top plate 204 of the vacuum chamber 201, is sputtered so that boron is supplied back into the plasma. Therefore, after the passage of a certain period of time, the amount of boron consumed in the vacuum chamber 201 or on the top plate 204 substantially balances with the amount supplied from the vacuum chamber 201 or the top plate 204 into the plasma by sputtering. The process of achieving such a state is referred to as conditioning.

Figure 10:
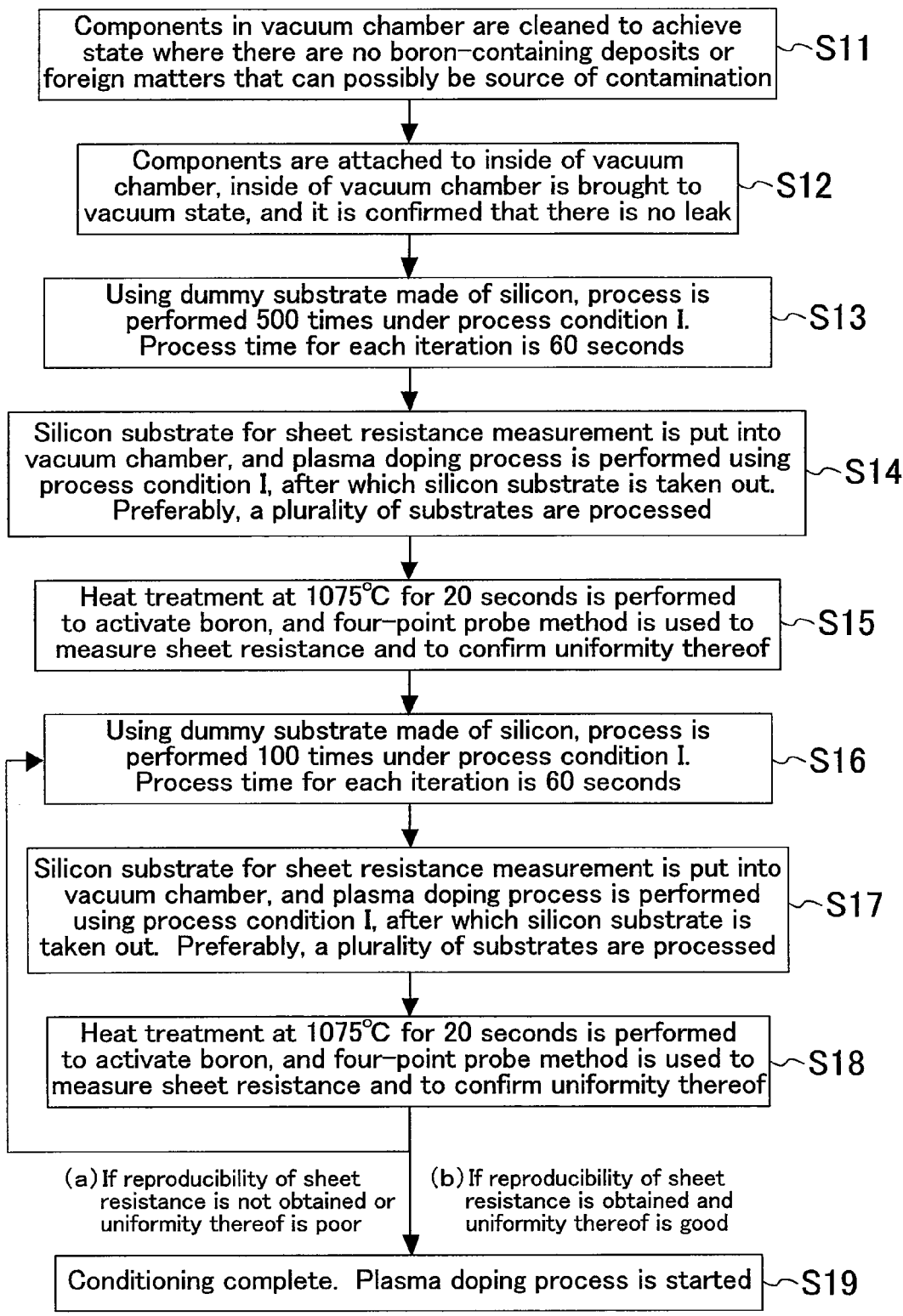
FIG. 10 is a flow chart showing a process of conditioning the inside of a vacuum chamber in a method for manufacturing a semiconductor device according to one embodiment of the present invention.

FIG. 10 is a flow chart showing the process of conditioning the inside of the vacuum chamber in the method for manufacturing a semiconductor device according to the present invention.

First, in step S11, components in the vacuum chamber are cleaned to achieve a state where there are no boron-containing deposits or foreign matters that can possibly be the source of contamination.

Then, in step S12, the cleaned components are attached to the inside of the vacuum chamber, the inside of the vacuum chamber is brought to a vacuum state, and it is confirmed that there is no leak.

Then, in step S13, a dummy substrate made of silicon is placed on the sample electrode in the vacuum chamber, and the plasma doping process is performed 500 times under the process condition I (hereinafter referring to a process condition where the source power is 500 W, the bias voltage is 250 V, the pressure is 0.35 Pa, the $B_2H_6$ concentration is 0.73%, the process time is 60 seconds). Herein, the amount of time required for a single iteration of the process using the process condition I is 60 seconds.

Then, in step S14, a silicon substrate for sheet resistance measurement is placed on the sample electrode in the vacuum chamber, and the plasma doping process is performed using the process condition I, after which the silicon substrate is taken out of the vacuum chamber. It is preferred that this process is performed for a plurality of substrates.

Then, in step S15, the silicon substrate which has been subjected to the plasma doping process is subjected to a heat treatment at 1075° C. for 20 seconds for activating boron, after which a four-point probe method is used to measure the sheet resistance and to confirm the uniformity thereof Then, in step S16, a dummy substrate made of silicon is placed on the sample electrode in the vacuum chamber, and the plasma doping process is performed 100 times using the process condition I. Herein, the amount of time required for a single iteration of the process using the process condition I is 60 seconds.

Then, in step S17, a silicon substrate for sheet resistance measurement is placed on the sample electrode in the vacuum chamber, and the plasma doping process is performed using the process condition I, after which the silicon substrate is taken out of the vacuum chamber. It is preferred that this process is performed for a plurality of substrates.

Then, in step S18, the silicon substrate which has been subjected to the plasma doping process is subjected to a heat treatment at 1075° C. for 20 seconds for activating boron, after which a four-point probe method is used to measure the sheet resistance and to confirm the uniformity thereof.

After step S18, the process proceeds differently in two cases: (a) where one or both of the reproducibility of the sheet resistance and the good uniformity thereof are not obtained, and (b) the reproducibility of the sheet resistance and the good uniformity thereof are both obtained.

First, in the case (a) where either one of the reproducibility of the sheet resistance and the good uniformity thereof is not obtained, the process returns to step S16. In the case (b) where the reproducibility of the sheet resistance and the good uniformity thereof are both obtained, the conditioning process is terminated in step S19. Herein, the completion of conditioning means that there has been achieved a state where the plasma doping process can be performed. That is, it is possible to start the plasma doping process on substrates to be products.

Now, process conditions for performing the plasma doping process of the present embodiment using the plasma doping process apparatus (the plasma doping process apparatus shown in FIG. 8) for which conditioning described above has been completed will be described. First, the power (the source power) supplied from the high-frequency power supply 207 to the coils 208 is 500 W. A dopant gas containing an intended element, which is supplied from the gas supplying device 205 into the vacuum chamber 201 through the gas supply port 206, has a mass concentration of 0.73% with respect to the entire gas. A power such that the potential of the sample electrode 203 (the bias voltage) is 250 V is supplied from the high-frequency power supply 210. The pressure inside the vacuum chamber 201 adjusted by the vacuum exhaust port 202 is 0.35 Pa.

The conditions described above are obtained through a pre-adjustment by the present inventors using the flow to be described later for use in the measurement of the etching rate of the sample 209 made of silicon so that the rate of etching of the sample 209 by a plasma is −0.58 nm/min (i.e., the deposition rate is 0.58 nm/min). Herein, the etching rate may be less than 0 nm/min and greater than or equal to −5.0 nm/min (more preferably greater than or equal to −2.0 nm/min). First, the necessity for the etching rate to be less than 0 nm/min will be described. If the etching rate is greater than or equal to 0 nm/min, the controllable dose range will be small, as in Comparative Example 1 or 2 to be described later. Next, the necessity for the etching rate to be greater than or equal to −5.0 nm/min will be described. If the etching rate is less than −5.0 nm/min, in other words, if the deposition rate is greater than 5.0 nm/min, an undesirable insulator film is formed on the surface of the substrate to a thickness beyond tolerable limits, thus adversely influencing the device. In such a case, an undesirable insulator film is formed on the surface of the resist pattern, which is formed on the surface of the substrate, to a thickness beyond tolerable limits, thereby making it difficult to peel off the resist. In order to reliably prevent these problems, it is preferred that the etching rate is greater than or equal to −2.0 nm/min. Herein, the insulator film refers to a film formed by the deposition of boron in a case where the substrate is exposed to a plasma containing a high concentration of $B_2H_6$, for example.

Now, the results obtained by the plasma doping process of the present embodiment will be described.

Figure 11:
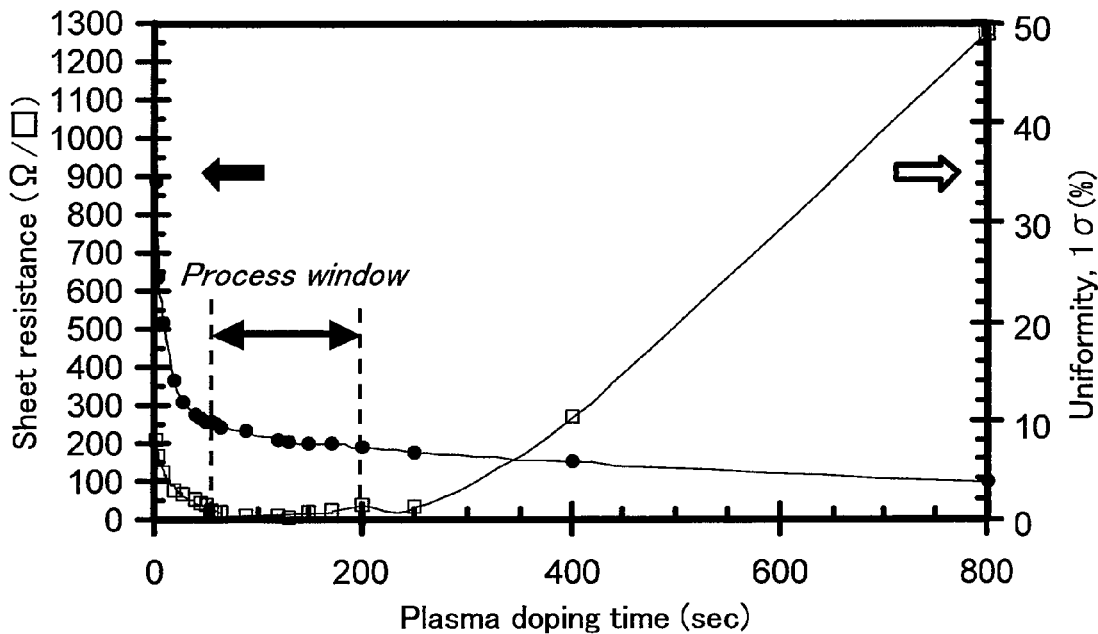
FIG. 11 shows the transition of the sheet resistance and the transition of the uniformity thereof with respect to the change in the plasma doping time, obtained by a plasma doping process in a method for manufacturing a semiconductor device according to one embodiment of the present invention.
Figure 12:
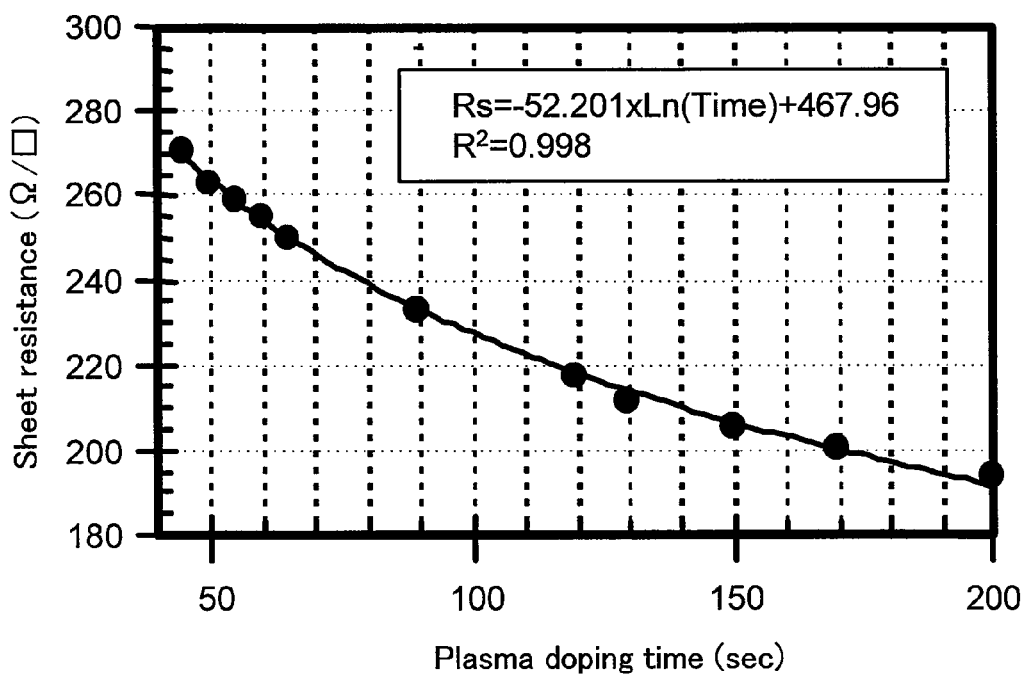
FIG. 12 shows the transition of the sheet resistance with respect to the change in the plasma doping time in the process region B in FIG. 11.

FIG. 11 shows the transition of the sheet resistance and the transition of the uniformity thereof with respect to the change in the plasma doping time, as examined by using a four-point probe method to measure the sheet resistance of the surface of each of a plurality of samples after activating the impurity introduced into each sample by performing a heat treatment at 1075° C. for 20 seconds on each sample which has been subjected to the plasma doping process of the present embodiment with various values of plasma doping time. The evaluation of the uniformity uses 1σ (the deviation from the average value meaning that 75% of samples fall within ±1σ (shown in percentage of average value)), and it can be said that the uniformity is higher as this value is smaller. As shown in FIG. 11, for a period of the plasma doping time from 0 seconds to about 45 seconds, since the sheet resistance rapidly decreases, even a very slight shift in a parameter of the plasma doping conditions, for example, significantly influences the sheet resistance, and the sheet resistance is likely to vary. Therefore, it is difficult to ensure the sheet resistance reproducibility during the time period. When the plasma doping time is about 200 seconds or more, the change in the sheet resistance with respect to time becomes significant again, and therefore the uniformity deteriorates rapidly. Thus, for a plasma doping time of about 200 seconds or more, the device characteristics vary across the substrate surface after the plasma doping process, and the yield lowers during production. Therefore, this time period cannot be used as the plasma doping time. On the other hand, in a period of the plasma doping time from about 45 seconds to about 200 seconds, it can be seen that the decrease in the sheet resistance is mild and the uniformity is good, as shown in FIG. 11. This time region is the process region B (the process window of the plasma doping time). FIG. 12 shows the transition of the sheet resistance with respect to the change in the plasma doping time during the process region B in FIG. 11 (a period of the plasma doping time from 50 seconds to 200 seconds during which the decrease in the sheet resistance is not rapid and the uniformity is good). The transition of the sheet resistance in the process region B can be represented as a function of time using (Expression a) below:

$$Rs = -52.201 \times \text{Ln}(\text{Time}) + 467.96 \quad \text{(Expression a)}$$

(where Rs denotes the sheet resistance, Time denotes the plasma doping time, and Ln denotes the natural logarithm). Here, $R^2 = 0.998$. Herein, $R^2 = 0.998$ means the following. That is, $R^2$ is a coefficient of determination widely known in statistics, and is the square of a coefficient of correlation. By evaluating $R^2$, it is possible to evaluate the proportion of the portion, which can be explained (determined) by the plasma doping time (Time), of the variance of the 11 sheet resistance values (the 11 points of data shown by black circles) obtained in a time range around the process region B (from 45 seconds to 200 seconds), which includes therein the process region B from 50 seconds to 200 seconds in FIG. 12. $R^2$ takes a value greater than or equal to 0 and less than or equal to 1. If $R^2 = 0$, it means that the variance of the 11 sheet resistance values obtained in the time range from 45 seconds to 200 seconds is not at all reduced even if the difference in the plasma doping time (Time) is taken into consideration by (Expression a), i.e., it means that the plasma doping time (Time) does not at all determine the sheet resistance Rs. On the other hand, if $R^2 = 1$, it means that (Expression a) strictly holds for any plasma doping time (Time) in the time range from 45 seconds to 200 seconds, i.e., it means that the sheet resistance Rs is completely determined by the logarithmic form of the plasma doping time (Time) represented by (Expression a). Herein, as shown in FIG. 12, $R^2$ is evaluated as being 0.998, which is very close to 1, thus indicating that the 11 sheet resistance values obtained in the time range from 45 seconds to 200 seconds are very well explained (determined) by the plasma doping time (Time). Therefore, in the time range around the process region B (from 45 seconds to 200 seconds), which includes therein the process region B from 50 seconds to 200 seconds, it is possible to predict the sheet resistance Rs with a very high precision using (Expression a) and to adjust the sheet resistance Rs with a very high precision only by adjusting the plasma doping time (Time).

Next, the relationship between the plasma doping time from 50 seconds to 200 seconds and the sheet resistance, and the relationship between the plasma doping time and dose will be described.

Figure 13:
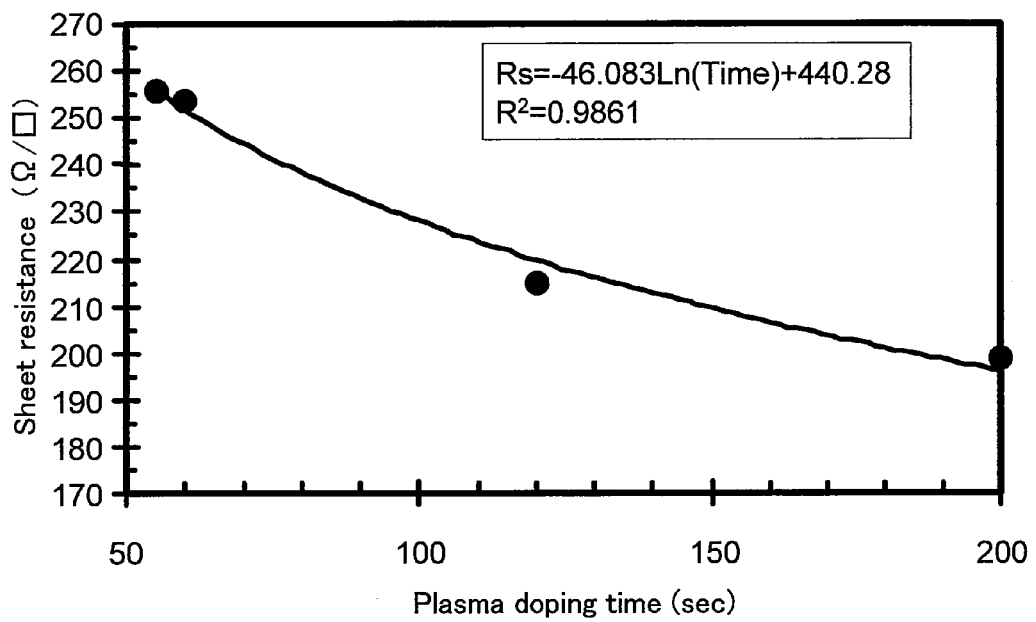
FIG. 13 shows the transition of the sheet resistance with respect to the change in the plasma doping time, obtained by a plasma doping process in a method for manufacturing a semiconductor device according to one embodiment of the present invention.

FIG. 13 shows the relationship of the sheet resistance with respect to the plasma doping time, obtained by the plasma doping process of the present embodiment. The relationship of the sheet resistance with respect to the plasma doping time shown in FIG. 13 can be represented by (Expression f) below:

$$Rs=-46.083\times Ln(Time)+440.28 \quad \text{(Expression f)}$$

(where Rs denotes the sheet resistance, Time denotes the plasma doping time, and Ln denotes the natural logarithm) Here, $R^2=0.9861$. Herein, $R^2$ of (Expression f) is evaluated as being 0.9861, which is very close to 1, thus indicating that the 4 sheet resistance values (black circles in the figure) obtained in the time range from 50 seconds to 200 seconds are very well explained (determined) by the plasma doping time (Time).

That is, it can be seen that the sheet resistance Rs is completely determined by the logarithmic form of the plasma doping time (Time) represented by (Expression f).

Figure 14:
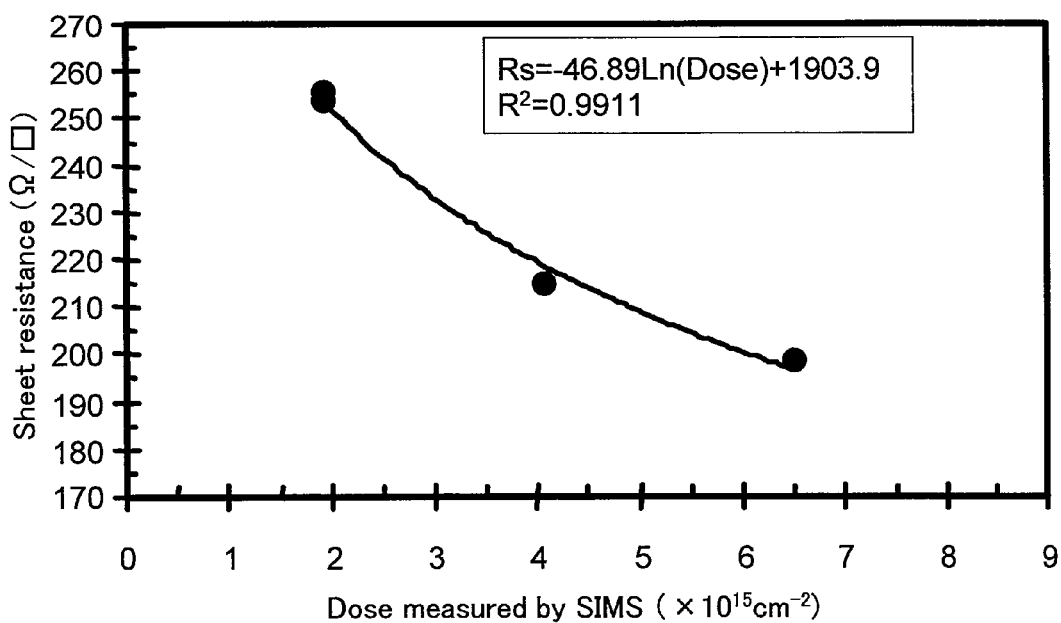
FIG. 14 shows the relationship between the sheet resistance and the dose, obtained by a plasma doping process in a method for manufacturing a semiconductor device according to one embodiment of the present invention.

FIG. 14 shows the relationship between the sheet resistance shown in FIG. 13 and the dose obtained by SIMS measurement for the 4 samples having sheet resistance values shown by black circles in FIG. 13. The relationship of the sheet resistance with respect to the dose shown in FIG. 14 can be represented by (Expression g) below:

$$Rs=-46.89\times Ln(Dose)+1903.9 \quad \text{(Expression g)}$$

(where Rs denotes the sheet resistance, Dose denotes the dose, and Ln denotes the natural logarithm). Here, $R^2=0.9911$. Herein, $R^2$ of (Expression g) is evaluated as being 0.9911, which is very close to 1, thus indicating that the 4 sheet resistance values (black circles in the figure) obtained in the time range from 50 seconds to 200 seconds are very well explained (determined) by the dose. That is, it can be seen that the sheet resistance Rs is completely determined by the logarithmic form of the dose (Dose) represented by (Expression g).

Herein, the dose can be represented by the plasma doping time (Time) using (Expression f) and (Expression g) above, and Calculation Expression i to Calculation Expression xiii below.

First, substituting (Expression g) into Rs of (Expression f) yields Calculation Expression i below.

$$-46.083\times Ln(Time)+440.28=-46.89\times Ln(Dose)+1903.9 \quad \text{Calculation Expression i:}$$

Then, rearranging the left-hand side and the right-hand side of Calculation Expression i yields Calculation Expression ii and Calculation Expression iii below for obtaining Dose.

$$-46.89\times Ln(Dose)=-46.083\times Ln(Time)-1463.62 \quad \text{Calculation Expression ii:}$$

$$Ln(Dose)=0.983\times Ln(Time)+31.214 \quad \text{Calculation Expression iii:}$$

Then, representing the left-hand side and the right-hand side of Calculation Expression iii all in a logarithmic form yields Calculation Expression iv and Calculation Expression v below. Herein, e in the second term of the right-hand side is the base of natural logarithms.

$$Ln(Dose)=0.983\times Ln(Time)+31.214\ Ln(e) \quad \text{Calculation Expression iv:}$$

$$Ln(Dose)=Ln(Time)^{0.983}+Ln(e^{31.214}) \quad \text{Calculation Expression v:}$$

Then, rearranging the right-hand side of Calculation Expression v yields Calculation Expression vi and Calculation Expression vii below.

$$Ln(Dose)=Ln((Time)^{0.983}\times e^{31.214}) \quad \text{Calculation Expression vi:}$$

$$Dose=(Time)^{0.983}\times e^{31.214} \quad \text{Calculation Expression vii:}$$

Then, substituting the value of the base of natural logarithms, about 2.718, into Calculation Expression vii yields Calculation Expression viii and Calculation Expression ix below.

$$Dose=(Time)^{0.983}\times 3.586\times 10^{13} \quad \text{Calculation Expression viii:}$$

$$Dose=3.586\times 10^{13}\times (Time)^{0.983} \quad \text{Calculation Expression ix:}$$

Then, resolving the exponent of Time in Calculation Expression ix yields Calculation Expression x below.

$$Dose=3.586\times 10^{13}\times (Time)/(Time)^{0.017} \quad \text{Calculation Expression x:}$$

Figure 15:
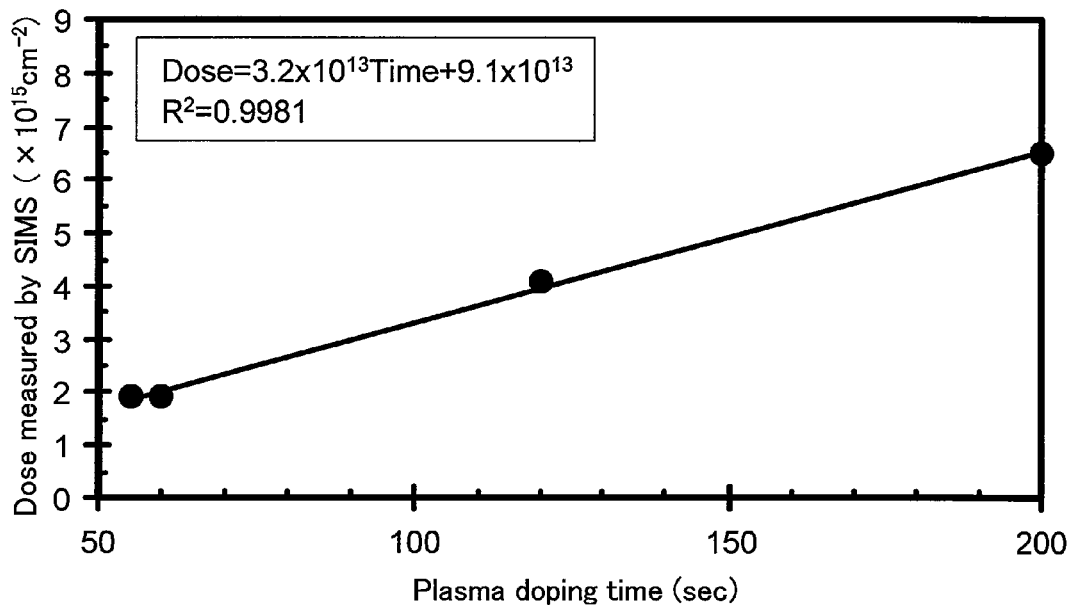
FIG. 15 shows the transition of the dose with respect to the change in the plasma doping time, obtained by a plasma doping process in a method for manufacturing a semiconductor device according to one embodiment of the present invention.

FIG. 15 shows the relationship of the dose (the dose shown in FIG. 14) with respect to the plasma doping time obtained by the plasma doping process of the present embodiment. The relationship of the dose with respect to the plasma doping time shown in FIG. 15 can be represented by (Expression h) below:

$$Dose=3.2\times 10^{13}\times (Time)+9.1\times 10^{13}$$

(where Dose denotes the dose and Time denotes the plasma doping time). Here, $R^2=0.9981$. Herein, $R^2$ of (Expression h) is evaluated as being 0.9981, which is very close to 1, thus indicating that the 4 sheet resistance values (black circles in the figure) obtained in the time range from 50 seconds to 200 seconds are very well explained (determined) by the plasma doping time (Time).

On the other hand, substituting 60 (sec) into Time of Calculation Expression x above yields Calculation Expression xi below.

$$Dose=3.586\times 10^{13}\times 60/(60)^{0.017}=2.00\times 10^{15} \quad \text{Calculation Expression xi:}$$

Herein, Calculation Expression xi is a relational expression that holds true during the period of the plasma doping time from 50 seconds to 200 seconds. Based on the result shown in FIG. 15, the dose when the plasma doping time is 60 seconds is $1.92\times 10^{15}$ (cm$^{-2}$). Comparing this with the result of Calculation Expression xi indicates that the result of Calculation Expression xi is greater by $8.0\times 10^{13}$ (cm$^{-2}$).

Substituting 200 (sec) into Time of Calculation Expression x above yields Calculation Expression xii below.

$$Dose=3.586\times 10^{13}\times 200/(200)^{0.017}=6.55\times 10^{15} \quad \text{Calculation Expression xii:}$$

Herein, Calculation Expression xii above is a relational expression that holds true during the period of the plasma doping time from 50 seconds to 200 seconds. From the result shown in FIG. 15, the dose when the plasma doping time is 200 seconds is $6.50\times 10^{15}$ (cm$^{-2}$). Comparing this with the result of Calculation Expression xii indicates that the result of Calculation Expression xii is greater by $5.0\times 10^{13}$ (cm$^{-2}$).

That is, while the dose is on the order of $10^{15}$ (cm$^{-2}$), the difference between the result of Calculation Expression xi above and the value shown in FIG. 15 and the difference between the result of Calculation Expression xii above and the value shown in FIG. 15 are both on the order of $10^{13}$ (cm$^{-2}$), as much as two orders of magnitude smaller than the dose. Therefore, in view of the magnitude of the dose, the result of each of Calculation Expression xi and Calculation Expression xii and the value shown in FIG. 15 can be said to be about the same. Herein, where the value is denoted as Z, Calculation Expression x above can be transformed into Calculation Expression xiii below.

$$Dose=3.586\times 10^{13}\times (Time)+Z \quad \text{Calculation Expression xiii:}$$

That is, it can be seen that the directly proportional relationship between the dose and the plasma doping time is well explained (determined). This supports that the relationship between the plasma doping time and the dose shown in FIG. 15 is a directly proportional relationship that can be explained (determined) by only the plasma doping time.

Figure 16:
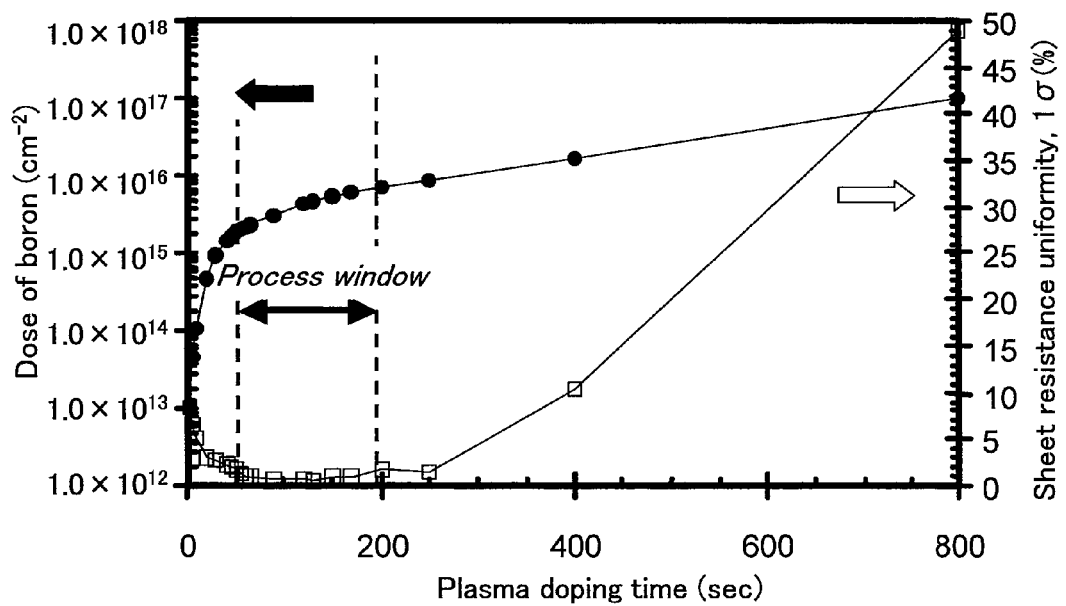
FIG. 16 shows the transition of the dose (the boron dose) and that of the sheet resistance uniformity with respect to the plasma doping time, obtained by a plasma doping process in a method for manufacturing a semiconductor device according to one embodiment of the present invention.
Figure 17:
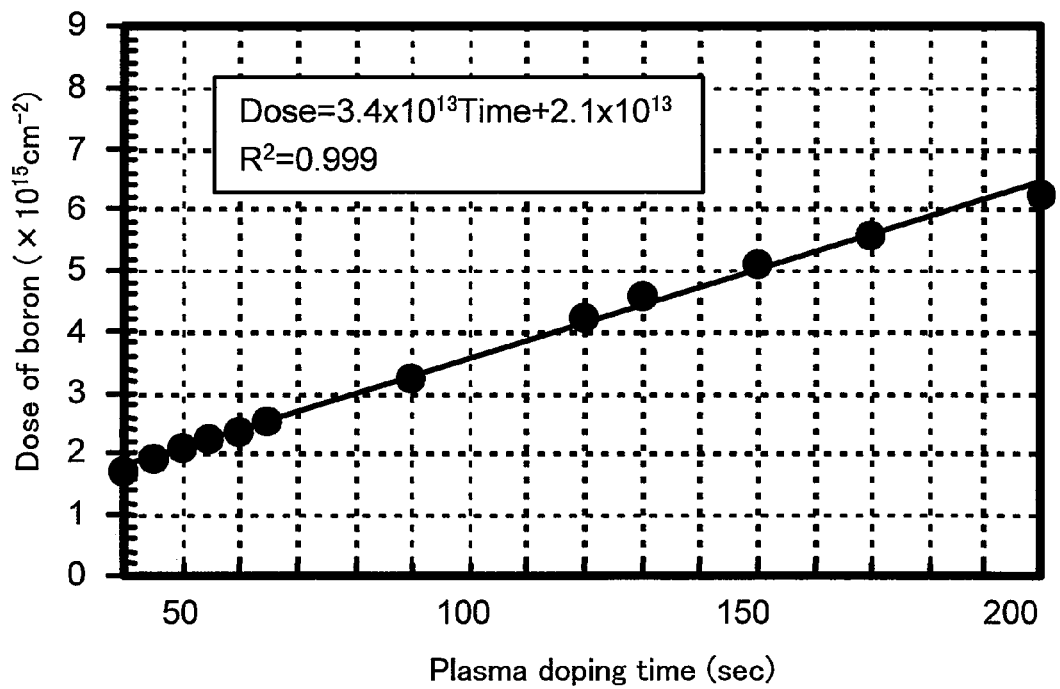
FIG. 17 shows the transition of the dose with respect to the change in the plasma doping time in the process region B in FIG. 16.

FIG. 16 shows the results obtained by examining the transition of the dose (the boron dose) and that of the sheet resistance uniformity (1σ) with respect to the plasma doping time for samples subjected to the plasma doping process of the present embodiment. As shown in FIG. 16, for a period of the plasma doping time from 0 second to about 45 seconds, since the dose rapidly increases, even a very slight shift in a parameter of the plasma doping conditions, for example, significantly influences the dose, and the dose is likely to vary. Therefore, it is difficult to ensure the dose reproducibility during the time period. When the plasma doping time is about 200 or more, the change in the dose with respect to time becomes significant again, and therefore the uniformity deteriorates rapidly. Thus, for a plasma doping time of about 200 seconds or more, the device characteristics vary across the substrate surface after the plasma doping process, and the yield lowers during production. Therefore, this time period cannot be used as the plasma doping time. On the other hand, in a period of the plasma doping time from about 45 seconds to about 200 seconds, it can be seen that the increase in the dose is mild and the uniformity is good, as shown in FIG. 16. This time region is the process region B (the process window of the plasma doping time). FIG. 17 shows the transition of the dose with respect to the change in the plasma doping time during the process region B in FIG. 16 (a period of the plasma doping time from 50 seconds to 200 seconds during which the increase in the dose is mild and the sheet resistance uniformity is good). The transition of the dose in the process region B can be represented as a function of time using (Expression b) below:

$$\text{Dose} = 3.4 \times 10^{13} \times \text{Time} + 2.1 \times 10^{13} \quad \text{(Expression b)}$$

(where Dose denotes the dose and Time denotes the plasma doping time). Here, $R^2 = 0.999$. Herein, $R^2$ shown in FIG. 17 is evaluated as being 0.999, which is very close to 1, thus indicating that the 11 dose values obtained in the time range from 45 seconds to 200 seconds are very well explained (determined) by the plasma doping time (Time). Therefore, in the time range around the process region B (from 45 seconds to 200 seconds), which includes therein the process region B from 50 seconds to 200 seconds, the dose Dose can be predicted with a very high precision using Expression (b), and the dose Dose can be adjusted with a very high precision only by adjusting the plasma doping time (Time). Moreover, referring to (Expression b), it can be seen that the dose is in proportion to the plasma doping time (Time). Thus, there is obtained an effect that it becomes easy to accurately control the dose by the plasma doping time. This is a significant effect obtained by appropriately selecting, as the process region B which is the process window of the plasma doping time in the present invention, not the time region in the initial period of plasma doping in which the dose changes rapidly but the subsequent time region in which the dose changes in a stable manner. Particularly, with plasma doping processes for forming an ultra-shallow junction whose implantation depth is 15 nm or less, this is a special effect which is characteristic of the present invention and which cannot be obtained by conventional techniques. The reason is that the present inventors were the first to notice that it is necessary to control the interaction at the substrate surface in order to make it easy to control the dose when implanting an impurity into an ultra-shallow region whose implantation depth is 15 nm or less, and incorporate it in the present invention. Specifically, the present inventors were the first to discover that in order to obtain the effect described above, it is necessary to set the plasma doping conditions so that the amount of impurity deposited on the substrate surface is dominant (greater) in the balance between the amount of impurity deposited on the substrate surface and the amount of impurity implanted from the substrate surface into the substrate. In the present invention, there is obtained a significant effect in a method for implanting an impurity into an ultra-shallow region by setting the plasma doping conditions so that the amount of impurity deposited on the substrate surface is dominant (great) in the balance between the amount of impurity deposited on the substrate surface and the amount of impurity implanted from the substrate surface into the substrate. In a conventional method for implanting an impurity into a region whose implantation depth exceeds 15 nm (typically, a deep region whose implantation depth is 20 nm or more), somewhat desirable dose controllability was obtained even by taking into consideration only the amount of impurity implanted into the substrate. In this case, the balance between the amount of impurity deposited on the substrate surface and the amount of impurity implanted from the substrate surface into the substrate was not taken into consideration. Also a conventional method for implanting an impurity into an ultra-shallow region whose implantation depth is 15 nm or less did not take into consideration the balance between the amount of impurity deposited on the substrate surface and the amount of impurity implanted from the substrate surface into the substrate, and the plasma doping conditions were not set so that the amount of impurity deposited on the substrate surface was dominant (great), as in the present invention. Thus, it was not possible to precisely control the dose as in the present invention. Moreover, where the plasma doping conditions are set in such a state that the substrate surface is etched by the plasma, the temporal change rate of the dose cannot be made constant, as in the present invention, and the dose becomes constant with respect to time. Therefore, the range over which the dose can be controlled precisely cannot be expanded as in the present invention.

Now, a comparison between FIG. 11 and FIG. 16 indicates that the sheet resistance decreases as the dose increases, and the sheet resistance increases as the dose decreases. Over the range of the plasma doping time in which the dose increases rapidly in FIG. 16 (from 0 second to 45 seconds), the sheet resistance decreases rapidly as shown in FIG. 11. Thus, there is a very closely inversely proportional relationship between the dose and the sheet resistance. The relationship is apparent also from the relationship described above between the plasma doping time and the sheet resistance, and the relationship described above between the plasma doping time and the dose. Thus, for the transition of the dose with respect to time and the transition of the sheet resistance with respect to time, one of them can be considered explained once the other has been explained. In view of this, in the following description, the reproducibility and the stability of the present invention will be described with respect to the sheet resistance.

Figure 18:
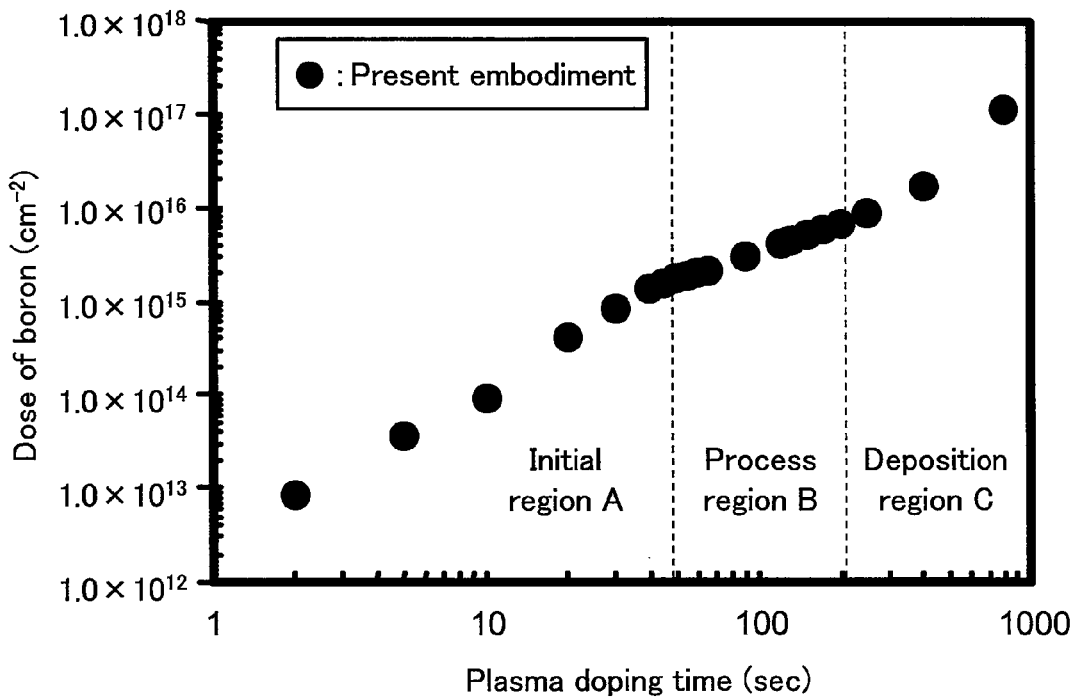
FIG. 18 shows, using a logarithmic axis, the transition of the dose with respect to the change in the plasma doping time shown in FIG. 17.

FIG. 18 shows, using a logarithmic axis, the transition of the dose with respect to the change in the plasma doping time shown in FIG. 17. As shown in FIG. 18, where the plasma doping conditions are set so that the amount of impurity deposited on the substrate surface is dominant (great) as in the present invention, the process is divided into three regions, including the initial region A where the dose changes rapidly, the process region B which is the process window of the plasma doping time in the present invention, and the deposition region C where the dose again changes rapidly. In a case where the temporal change of the dose is milder than in the case shown in FIG. 18 (e.g., a case where the dose becomes substantially constant in the process region B, and then the dose decreases thereafter), the pressure may be decreased, the concentration of the impurity supply gas may be increased or the source power may be decreased, for example, in the setting of the plasma doping conditions. On the other hand, in a case where the temporal change of the dose is more rapid than in the case shown in FIG. 18 (e.g., a case where the temporal increase rate of the dose increases in the process region B), the pressure may be increased, the concentration of the impurity supply gas may be decreased or the source power may be increased in the setting of the plasma doping conditions.

Figure 19:
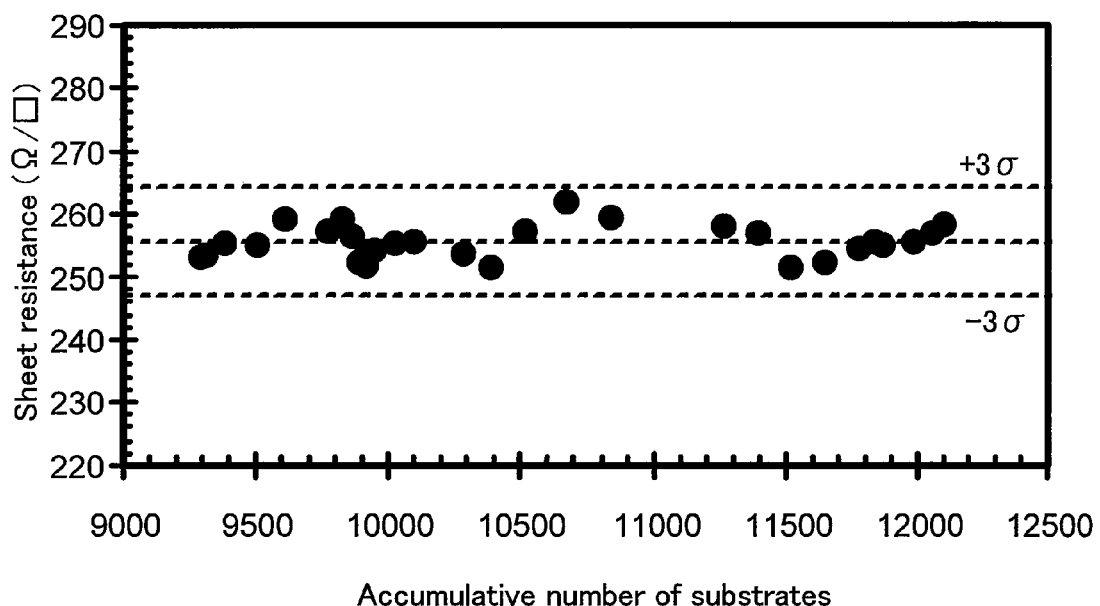
FIG. 19 shows the sheet resistance reproducibility in a case where the plasma doping process of a method for manufacturing a semiconductor device according to one embodiment of the present invention is performed repeatedly, with the plasma doping time for each subject substrate being 60 seconds.

FIG. 19 shows the sheet resistance reproducibility in a case where the plasma doping process of the present embodiment is performed repeatedly with plasma doping time for each subject substrate being 60 seconds. The number of measured samples selected from among over 10000 samples is 29. As shown in FIG. 19, the average value of the sheet resistance where the plasma doping time is 60 seconds is 255.6 Ω/□, and the reproducibility thereof is 1.05% in terms of 1σ, indicating a very high stability.

Figure 20:
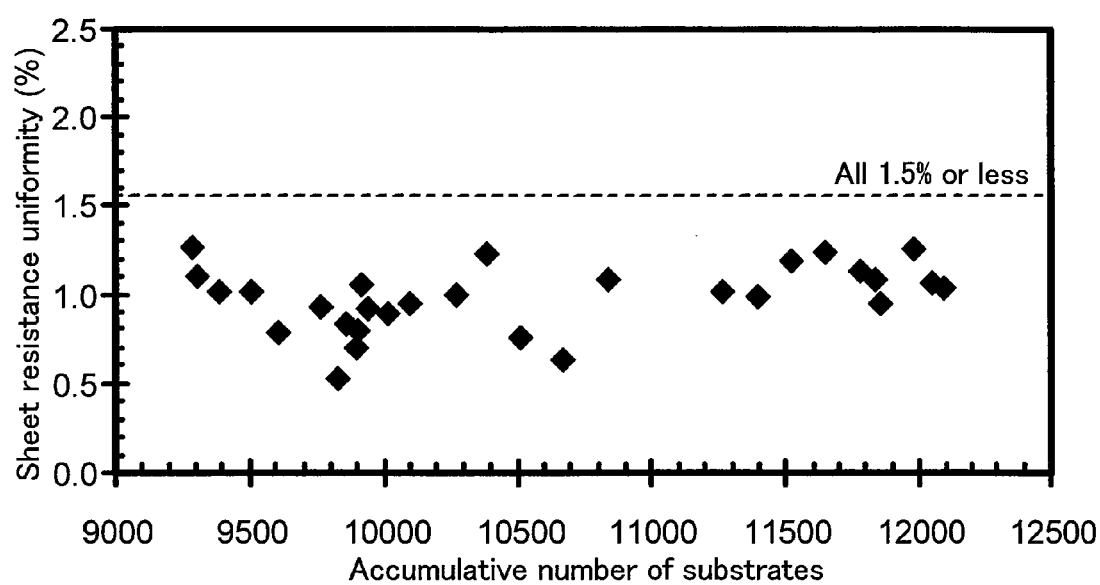
FIG. 20 shows the sheet resistance uniformity in a case where the plasma doping process of a method for manufacturing a semiconductor device according to one embodiment of the present invention is performed repeatedly, with the plasma doping time for each subject substrate being 60 seconds.

FIG. 20 shows the transition of the sheet resistance uniformity in a case where the plasma doping process of the present embodiment is performed repeatedly, with the plasma doping time for each subject substrate being 60 seconds. As shown in FIG. 20, the uniformity in terms of 1σ is 1.5% or less for all measurement results, indicating that good results are obtained also for uniformity. The dose obtained under the plasma doping conditions of the plasma doping process of the present embodiment is about $2.3 \times 10^{15}$ cm$^{-2}$. FIG. 21 shows a typical example of the sheet resistance distribution across the substrate surface, obtained when the plasma doping process of the present embodiment is performed, with the plasma doping time being 60 seconds.

FIG. 22 shows the sheet resistance reproducibility in a case where the plasma doping process of the present embodiment is performed repeatedly with plasma doping time for each subject substrate being 120 seconds. The number of measured samples selected from among over 10000 samples is 32. As shown in FIG. 22, the average value of the sheet resistance where the plasma doping time is 120 seconds is 215.8 Ω/□, and the reproducibility thereof is 0.83% in terms of 1σ, indicating a very high stability.

Figure 23:
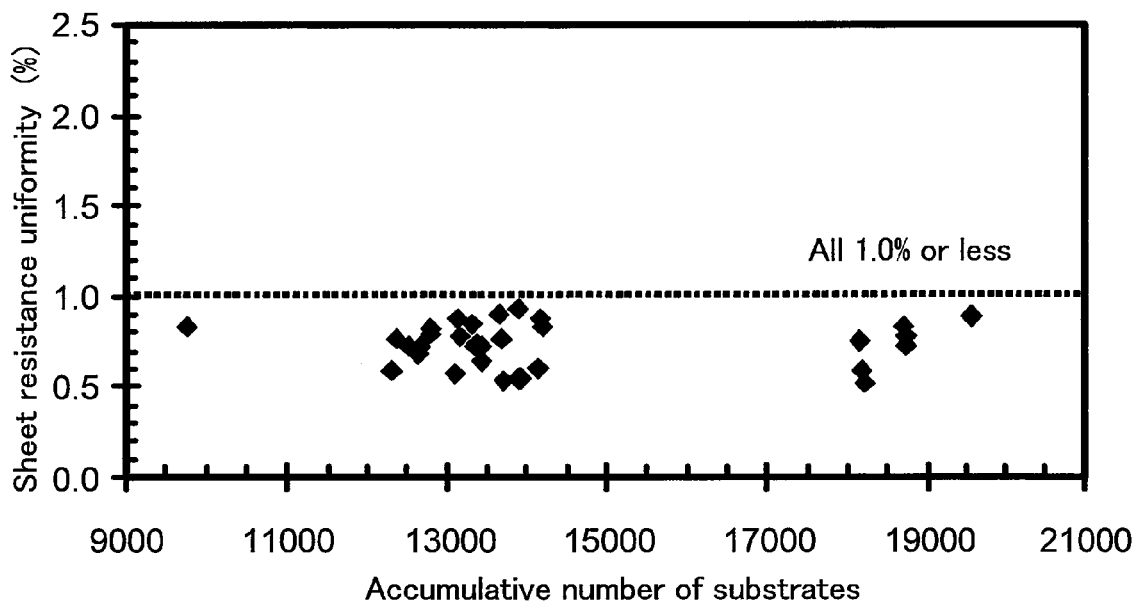
FIG. 23 shows the sheet resistance uniformity in a case where the plasma doping process of a method for manufacturing a semiconductor device according to one embodiment of the present invention is performed repeatedly, with the plasma doping time for each subject substrate being 120 seconds.

FIG. 23 shows the transition of the sheet resistance uniformity in a case where the plasma doping process of the present embodiment is performed repeatedly, with the plasma doping time for each subject substrate being 120 seconds. As shown in FIG. 23, the uniformity in terms of 1σ is 1.0% or less for all measurement results, indicating that good results are obtained also for uniformity. The dose obtained under the plasma doping conditions of the plasma doping process of the present embodiment is about $4.3 \times 10^{15}$ cm$^{-2}$.

Figure 24:
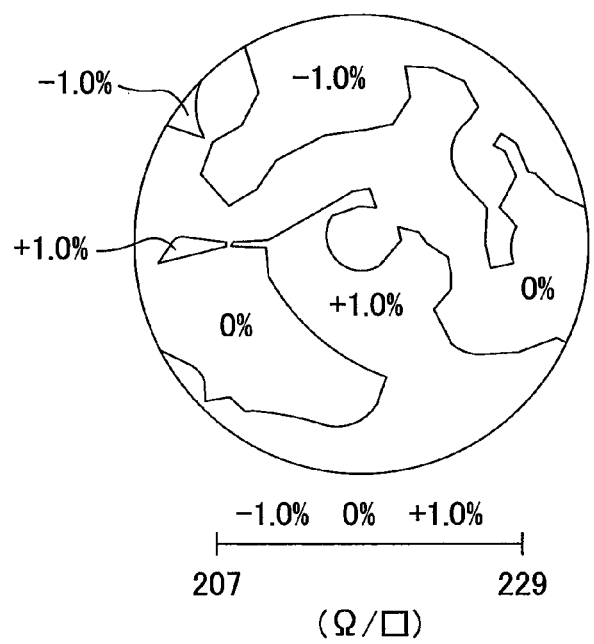
FIG. 24 shows a typical example of the sheet resistance distribution across the substrate surface, obtained when the plasma doping process of a method for manufacturing a semiconductor device according to one embodiment of the present invention is performed, with the plasma doping time being 120 seconds.

FIG. 24 shows a typical example of the sheet resistance distribution across the substrate surface, obtained when the plasma doping process of the present embodiment is performed, with the plasma doping time being 120 seconds.

As described above, according to the present embodiment, in the period of the plasma doping time from 50 seconds to 200 seconds, the dose can be stably controlled over a wide range of dose from about $2.3 \times 10^{15}$ cm$^{-2}$ to about $6.2 \times 10^{15}$ cm$^{-2}$, while ensuring the sheet resistance reproducibility and a good uniformity, only by adjusting the plasma doping time.

That is, according to the present embodiment, it is possible to implant an impurity into the substrate without substantially etching the substrate by appropriately selecting the plasma doping time when performing the plasma doping process using plasma doping conditions such that the deposition rate on the substrate surface by a plasma generated from a gas containing the impurity is appropriately positive (i.e., the etching rate of the substrate is negative). It is also possible, by adjusting only the plasma doping time, to easily control the dose over a wide range while ensuring a good uniformity and reproducibility of the impurity dose. Moreover, it is possible to achieve these effects without lowering the productivity and without having to measure the dose with a high precision.

[Regarding Boundary Between Initial Region A and Process Region B, and Boundary Between Process Region B and Deposition Region C]

As described above, in the plasma doping method of the present embodiment, the manner in which the dose changes with respect to the plasma doping time can be classified into three time regions as follows.

The first region is the initial region A which is a time region in which the dose changes rapidly with respect to the plasma doping time, the second region is the process region B which is the process window of the plasma doping time of the present embodiment, and the third region is the deposition region C which is a time region after the process region B in which the dose again changes rapidly with respect to the plasma doping time.

First, the boundary between the initial region A which is a time region in which the dose changes rapidly with respect to the plasma doping time and the process region B which is the process window of the plasma doping time of the present embodiment will be described. As will be described later, in the initial region A, the temporal change rate of the dose, which is the rate at which the dose changes per unit time, is not constant. On the other hand, in the process region B, the temporal change rate of the dose is constant. That is, the boundary between the initial region A and the process region B can be defined as a point when the temporal change rate of the dose in the initial region A becomes substantially constant. Now, the temporal change rate of the dose in the initial region A and that in the process region B will be described in detail.

Figure 25:
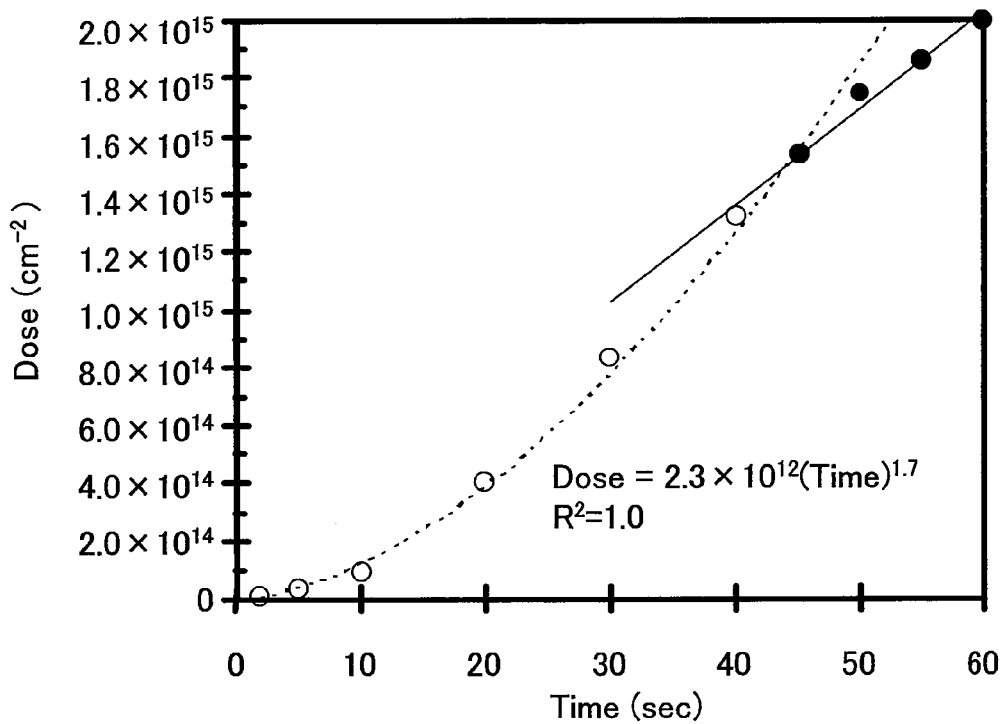
FIG. 25 shows the change in the dose with respect to the plasma doping time in the initial region A in a plasma doping process of a method for manufacturing a semiconductor device according to one embodiment of the present invention.

First, the temporal change rate of the dose in the initial region A will be described. FIG. 25 shows the change in the dose with respect to the plasma doping time in the initial region A of the present embodiment. In the present embodiment, the relationship between the dose and the plasma doping time in the initial region A can be represented as shown in the relational expression below:

$$\text{Dose} = 2.3 \times 10^{12} \times (\text{Time})^{1.7}$$

(where Dose denotes the dose and Time denotes the plasma doping time). The relational expression between the dose and the plasma doping time can be represented by (Expression 10) below, where A and B are coefficients.

$$\text{Dose} = A \times (\text{Time})^B \qquad \text{(Expression 10)}$$

Then, the temporal change rate of the dose can be represented as shown in (Expression 11) below by differentiating (Expression 10) by the plasma doping time.

$$dD/dT = A \times B \times (\text{Time})^{B-1} \qquad \text{(Expression 11)}$$

Thus, the temporal change rate of the dose in the initial region A can be represented as a function of the plasma doping time. That is, the temporal change rate of the dose in the initial region A is not constant with respect to the plasma doping time.

Figure 26:
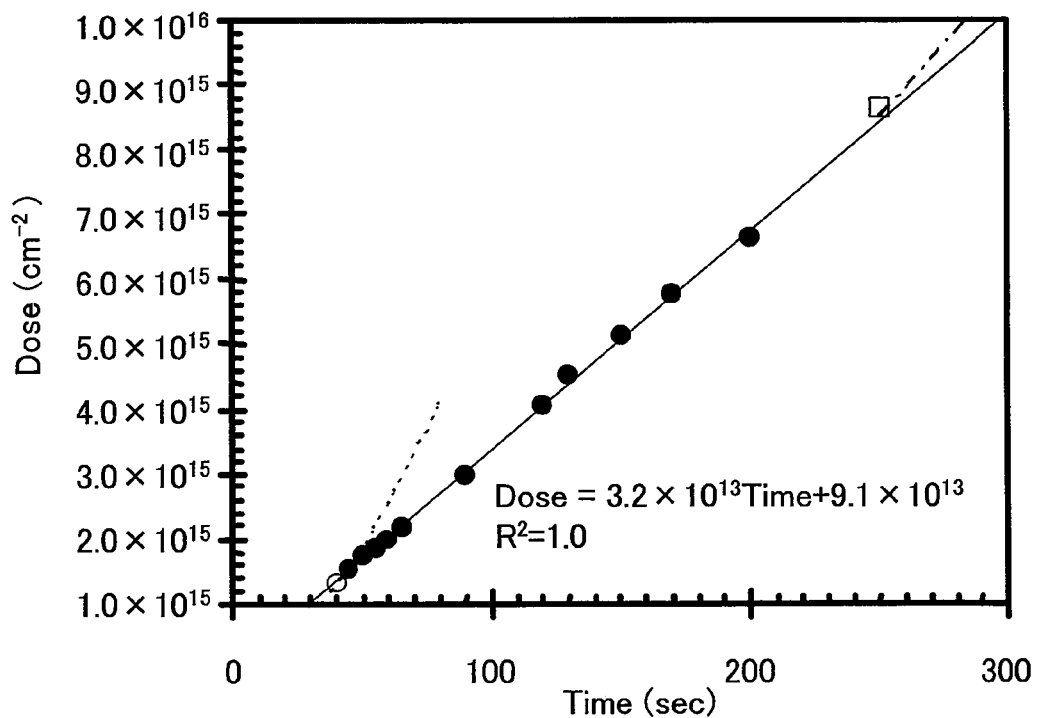
FIG. 26 shows the change in the dose with respect to the plasma doping time in the process region B in a plasma doping process of a method for manufacturing a semiconductor device according to one embodiment of the present invention.

Next, the temporal change rate of the dose in the process region B will be described. FIG. 26 shows the change in the dose with respect to the plasma doping time in the process region B of the present embodiment. In the present embodiment, the relationship between the dose and the plasma doping time in the process region B can be represented as shown in the relational expression below:

$$\text{Dose} = 3.2 \times 10^{13} \times (\text{Time}) + 9.1 \times 10^{13}$$

(where Dose denotes the dose and Time denotes the plasma doping time). The relational expression can be expressed by (Expression 12) below, where M and N are coefficients.

$$\text{Dose} = M \times (\text{Time}) + N \quad \text{(Expression 12)}$$

Then, the temporal change rate of the dose can be represented as shown in (Expression 13) below by differentiating (Expression 12) by the plasma doping time.

$$dD/dT = M \quad \text{(Expression 13)}$$

Thus, the temporal change rate of the dose in the process region B can be represented by a constant coefficient. That is, the temporal change rate of the dose in the process region B is constant with respect to plasma doping time.

Next, a method for determining the boundary between the initial region A and the process region B will be described.

The boundary between the initial region A and the process region B is a point when the temporal change rate of the dose in the initial region A becomes substantially constant. Herein, the temporal change rate of the dose becoming substantially constant means that the right-hand side of (Expression 11) representing the temporal change rate of the dose in the initial region A becomes substantially constant irrespective of time. That is, it is satisfied if the value $d^2D/dT^2$ becomes substantially 0 in (Expression 14) below obtained by differentiating (Expression 11) by the plasma doping time.

$$d^2D/dT^2 = A \times B \times (B-1) \times (\text{Time})^{B-2} \quad \text{(Expression 14)}$$

Herein, the value of the coefficient B with which $d^2D/dT^2$ of (Expression 14) becomes substantially 0 is obtained. Since (Expression 14) is a function of the plasma doping time, the value of the coefficient B with which $d^2D/dT^2$ becomes substantially 0 varies depending on the plasma doping time. Therefore, the value of the coefficient B with which $d^2D/dT^2$ becomes substantially 0 is herein obtained by limiting the plasma doping time to the range from 20 seconds to 800 seconds. FIGS. 27(*a*)-27(*h*) show the change in dD/dT and the change in $d^2D/dT^2$ with respect to the coefficient B where the coefficient A of (Expression 14) is set to 1, and the plasma doping time is set to 20 seconds, 50 seconds, 100 seconds and 800 seconds. As shown in FIGS. 27(*a*) and 27(*b*), it can be seen that when the plasma doping time is set to 20 seconds, the value of $d^2D/dT^2$ can be made substantially 0 by setting the coefficient B to be 1.3 or less. Similarly, it can be seen that the value of $d^2D/dT^2$ can be made substantially 0 by setting the coefficient B to be 1.3 or less when the plasma doping time is set to 50 seconds as shown in FIGS. 27(*c*) and 27(*d*), by setting the coefficient B to be 1.4 or less when the plasma doping time is set to 100 seconds as shown in FIGS. 27(*e*) and 27(*f*), and by setting the coefficient B to be 1.5 or less when the plasma doping time is set to 800 seconds as shown in FIGS. 27(*g*) and 27(*h*). In summary, in the range of plasma doping time from 20 seconds to 800 seconds, the value of $d^2D/dT^2$ can be made substantially 0 if the value of the coefficient B is 1.3 or less. Therefore, it can be seen that the temporal change rate of the dose in the initial region A is substantially constant when the coefficient B is 1.3 or less in (Expression 10) representing the relationship between the dose and the plasma doping time in the initial region A.

Next, in the initial region A of the present embodiment, a time period in which the coefficient B of (Expression 10) representing the temporal change rate of the dose in the initial region A is 1.3 or less is obtained. FIG. 28(*a*) shows the temporal change of the dose over a time period including 10 seconds before and after the plasma doping time set to 20 seconds. Then, the expression representing the relationship between the dose and the plasma doping time is $\text{Dose} = 9 \times 10^{11} \times (\text{Time})^{2.03}$. That is, the coefficient B is 2.03 in this case. Similarly, FIGS. 28(*b*), 28(*c*) and 28(*d*) show the temporal change of the dose over a time period including 10 seconds before and after the plasma doping time set to 30 seconds, 40 seconds and 50 seconds, respectively. The expression representing the relationship between the dose and the plasma doping time is $\text{Dose} = 2 \times 10^{12} \times (\text{Time})^{1.72}$, $\text{Dose} = 6 \times 10^{12} \times (\text{Time})^{1.46}$ and $\text{Dose} = 3 \times 10^{13} \times (\text{Time})^{1.00}$ for the plasma doping time of 30±10 seconds, 40±10 seconds and 50±10 seconds, respectively, and the value of the coefficient B is 1.72, 1.46 and 1.00 for the plasma doping time of 30±10 seconds, 40±10 seconds and 50±10 seconds, respectively.

Figure 29:
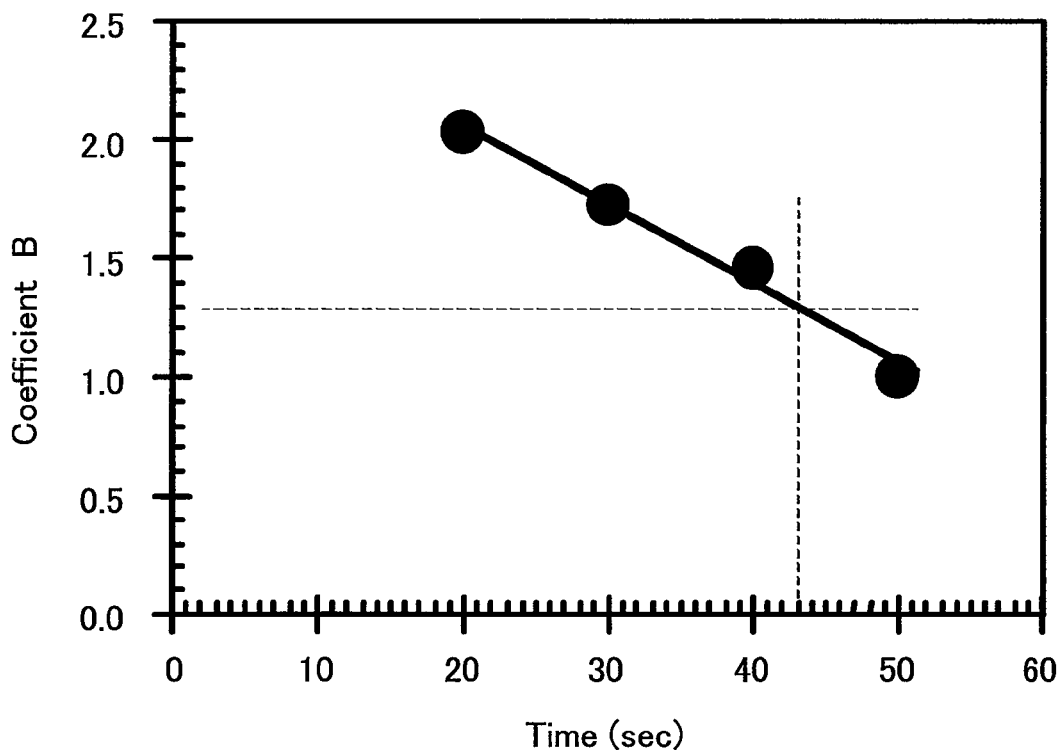
FIG. 29 illustrates a method for determining the boundary between the initial region A and the process region B in a plasma doping process of a method for manufacturing a semiconductor device according to one embodiment of the present invention.

In summary, how the coefficient B changes with respect to the plasma doping time can be represented as shown in FIG. 29. As described above, the boundary between the initial region A and the process region B is a point when the temporal change rate of the dose in the initial region A becomes substantially constant, i.e., when the value of the coefficient B becomes 1.3 or less, and it can be seen from FIG. 29 that the plasma doping time when the coefficient B is 1.3 or less is 43 seconds or later. Therefore, the boundary between the initial region A and the process region B in the present embodiment is when the plasma doping time is 43 seconds. The relational expression between the dose and the plasma doping time in the process region B can be expressed in the form of (Expression 10) above. That is, when the value of the coefficient B when the dose Dose (cm$^{-2}$) of impurity ions is represented by $\text{Dose} = A \times (\text{Time})^B$ using the plasma doping time Time (sec) is 1.3 or less, the temporal change rate of the dose is constant, irrespective of the change in the plasma doping time, as described above, and it is possible to obtain effects described above that are characteristic of the present invention by performing the plasma doping within this time range.

Next, the boundary between the process region B which is the process window of the plasma doping time of the present embodiment and the deposition region C which is a time region after the process region B in which the dose again changes rapidly with respect to the plasma doping time will be described.

Figure 30:
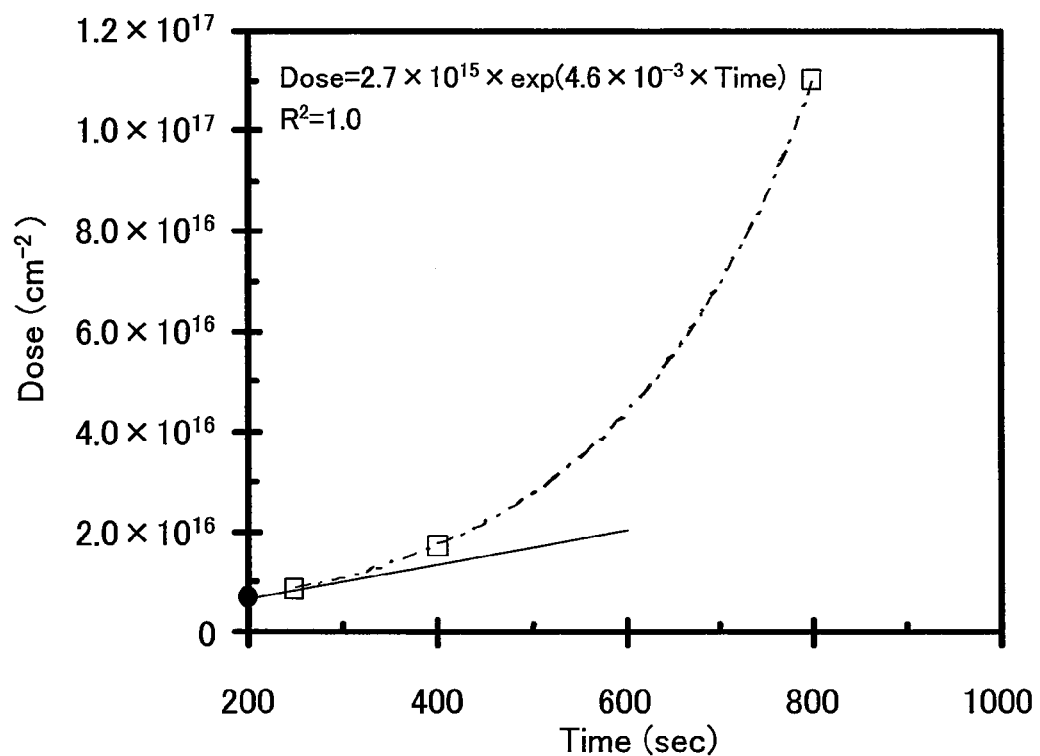
FIG. 30 illustrates the change in the dose with respect to the plasma doping time in the deposition region C in a plasma doping process of a method for manufacturing a semiconductor device according to one embodiment of the present invention.

FIG. 30 shows the change in the dose with respect to the plasma doping time in the deposition region C of the present embodiment. In FIG. 30, the dose when the plasma doping time is 200 seconds is on the straight line represented by $\text{Dose} = 3.2 \times 10^{13} \times (\text{Time}) + 9.1 \times 10^{13}$ which is a relational expression between the dose and the plasma doping time in the process region B, but the dose is slightly larger than the straight line when the plasma doping time is 250 seconds. As the plasma doping time exceeds 400 seconds, the dose increases clearly above the straight line. Therefore, it is clear that a plasma doping time greater than 400 seconds is in the deposition region C. Nevertheless, in the present embodiment, a plasma doping time greater than 200 seconds is considered to be in the deposition region C, taking a sufficiently large margin.

As described above, in the plasma doping method of the present embodiment, the manner in which the dose changes with respect to the plasma doping time can be classified into three regions each having a time range to be described below.

First, the initial region A is a time range in which the value of the coefficient B is greater than 1.3 when the dose is represented by Dose=A×(Time)$^B$ as a function of the plasma doping time, and it is a range of the plasma doping time from 0 second to 43 seconds in the present embodiment.

Next, the process region B to be the process window which is the plasma doping time of the present embodiment is a time range in which the value of the coefficient B is 1.3 or less when the dose is represented by Dose=A×(Time)$^B$ as a function of the plasma doping time, and it is a range of the plasma doping time that is 43 seconds or more and 200 seconds or less in the present embodiment.

Lastly, the deposition region C is a time region, after the process region B, in which the dose again increases significantly with respect to the plasma doping time, and it is a range of the plasma doping time greater than 200 seconds in the present embodiment.

[Method for Measuring The Etching Rate]

Figure 31:
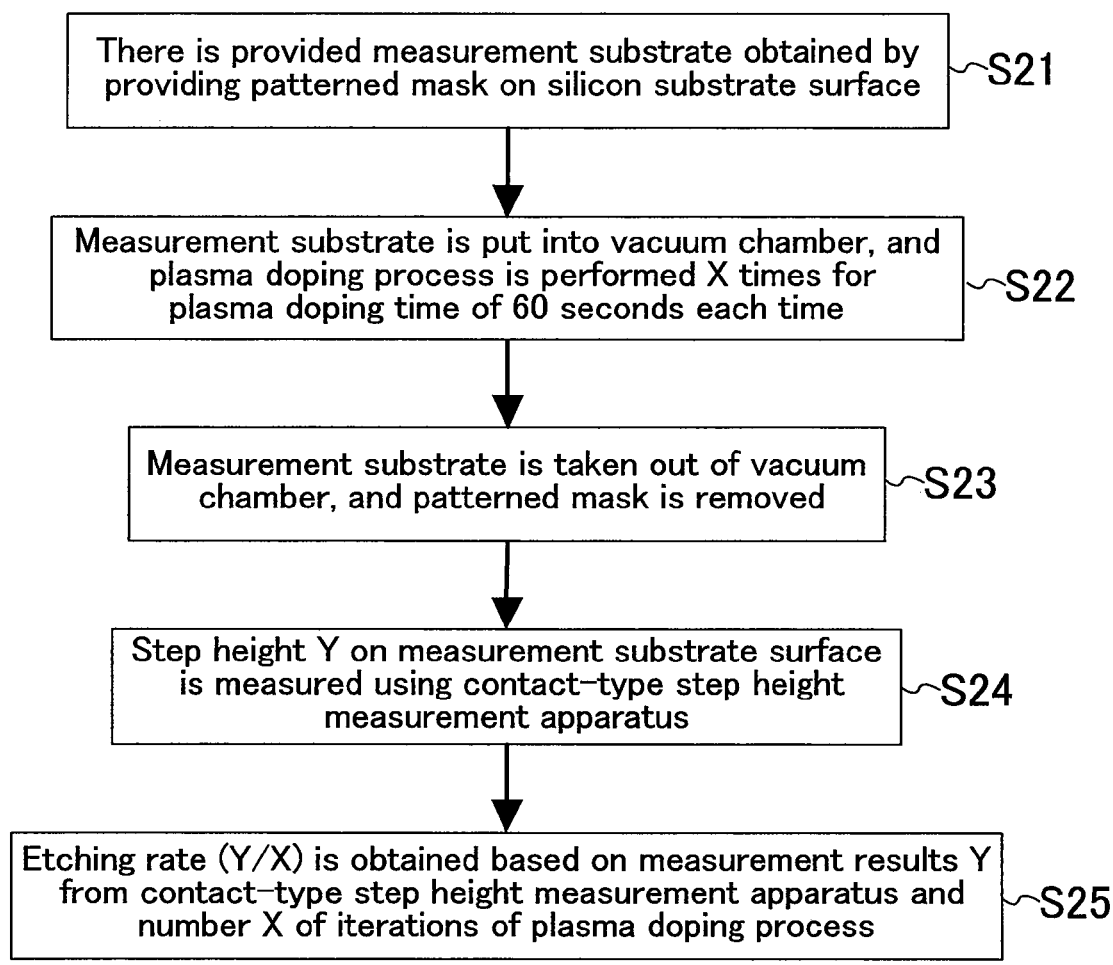
FIG. 31 is a flow chart of a method for measuring the etching rate used by the present inventors for evaluating the plasma doping process of a method for manufacturing a semiconductor device according to one embodiment of the present invention.

Now, the results of measurement (checking) by the present inventors of the etching rate (i.e., the deposition rate) of the sample 209 (specifically, a silicon substrate) under the plasma doping process conditions described above (the process condition I described in step S13 in the flow of FIG. 10) using the plasma doping process apparatus shown in FIG. 8 will be described. FIG. 31 is a flow chart of a method for measuring the etching rate used by the present inventors.

First, in step S21, there is provided a measurement substrate obtained by providing a patterned mask on a silicon substrate surface.

Then, in step S22, the measurement substrate is introduced into a vacuum chamber 210 by a known method and mounted on the sample electrode 203, and the measurement substrate is subjected to a plasma doping process. Herein, the plasma doping process is performed X times, for a plasma doping time of 60 seconds each time.

Then, in step S23, a measurement substrate, which has been subjected to a plurality of iterations of the plasma doping process, is taken out of the vacuum chamber 201, and the patterned mask on the measurement substrate is removed by a known method.

Then, in step S24, the step height Y on the measurement substrate surface, from which the patterned mask has been removed, is measured using a known contact-type step height measurement apparatus.

Then, in step S25, the etching rate (=Y/X) is calculated based on the measurement results of the step height Y by the contact-type step height measurement apparatus and the number X of iterations of the plasma doping process.

Through these steps S21 to S25, it is possible to obtain the etching rate, and to check whether or not the sample has been etched in the plasma doping process or whether or not the amount of deposition is excessive.

The results of measurement (checking) of the etching rate (i.e., the deposition rate) of the sample 209 (specifically, the silicon substrate) under the plasma doping process conditions described above using the etching rate measurement flow described above and using the plasma doping process apparatus shown in FIG. 8 are as follows.

Figure 32:
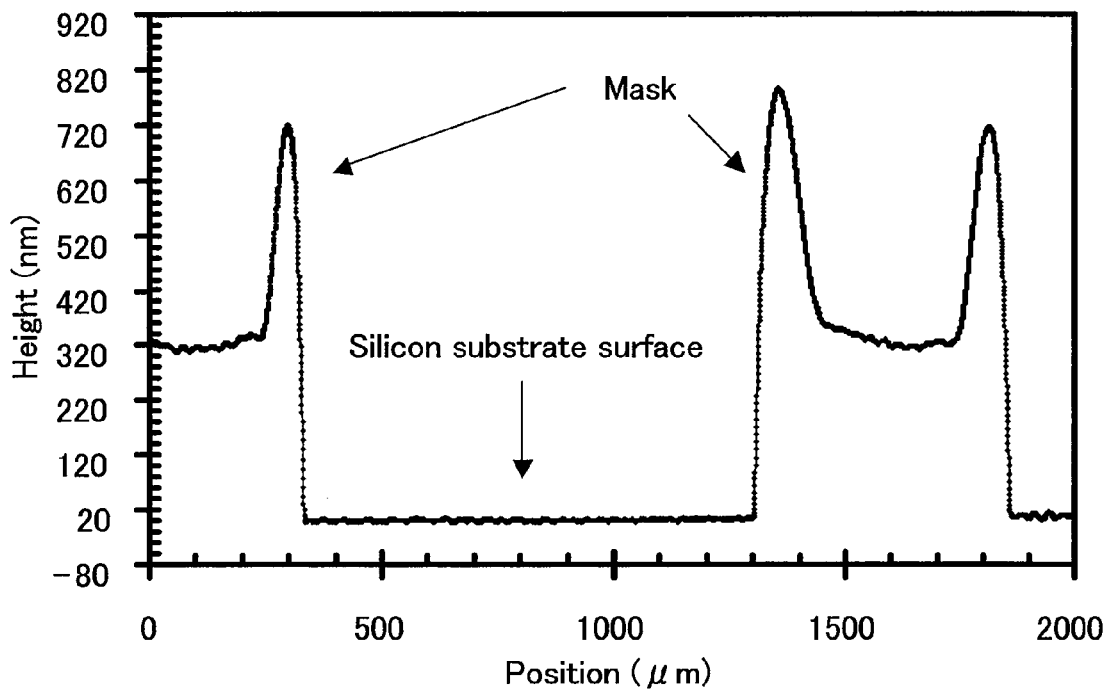
FIG. 32 shows the results obtained by measuring the step height of the surface of a measurement substrate provided with a patterned mask (before the plasma doping process) by using a contact-type step height measurement apparatus for evaluating the plasma doping process of a method for manufacturing a semiconductor device according to one embodiment of the present invention.

FIG. 32 shows the results obtained by measuring, using a contact-type step height measurement apparatus, the step height Y on the surface of the measurement substrate provided with a patterned mask (before the plasma doping process). As shown in FIG. 32, the surface of the measurement substrate, i.e., the silicon substrate, is flat, and a mask having a necessary and sufficient height is provided on the surface.

Figure 33:
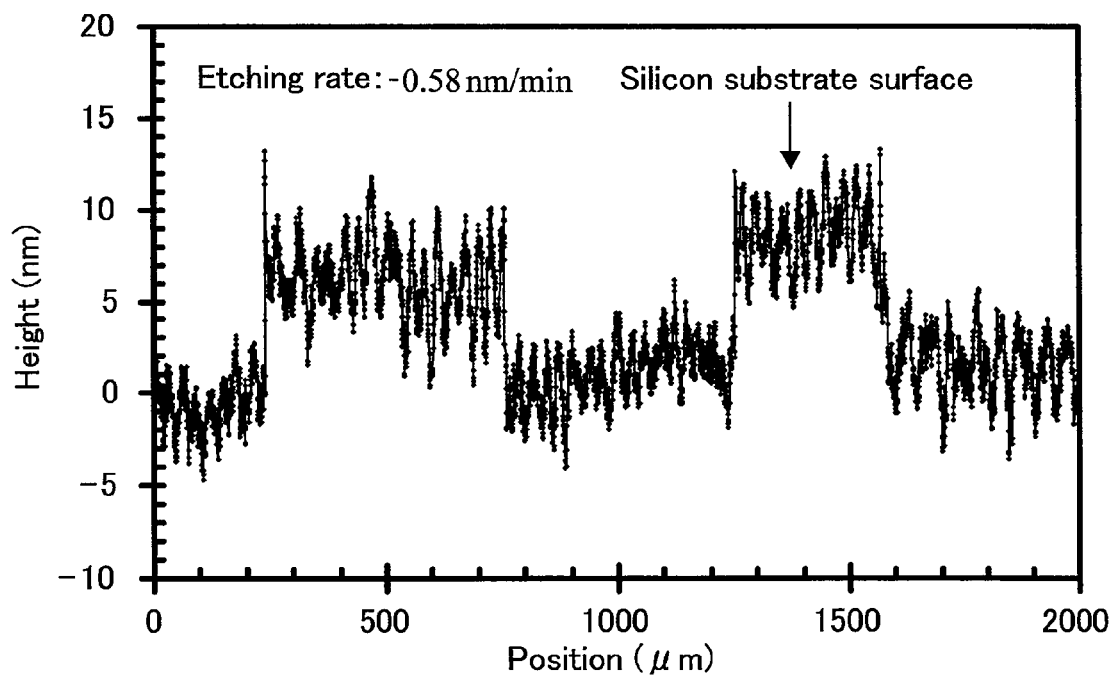
FIG. 33 shows the results obtained by measuring the step height of the surface of the measurement substrate from which the patterned mask has been removed (after the plasma doping process) by using a contact-type step height measurement apparatus for evaluating the plasma doping process of a method for manufacturing a semiconductor device according to one embodiment of the present invention.

Next, FIG. 33 shows the results obtained by measuring the step height Y using a known contact-type step height measurement apparatus in the step S24 of the etching rate measurement flow shown in FIG. 31. In FIGS. 32 and 33, the horizontal axis represents the position (with respect to any reference point) on the surface of the measurement substrate. The reference point for the vertical axis (height: 0 nm) in FIG. 32 is the height of the silicon substrate surface at a position where the mask is not formed, and the reference point for the vertical axis (height: 0 nm) in FIG. 33 is the height of the silicon substrate surface at a position where the mask has been removed. Moreover, the measurement results shown in FIG. 33 are obtained where the number X of iterations of the plasma doping process in step S22 is 10. In FIG. 33, the step height on the measurement substrate surface is as small as about the limit of measurement of the contact-type step height measurement apparatus, and the measurement results are therefore significantly influenced by the noise of the measurement apparatus, thus substantially fluctuating the measurement results. In view of this, in FIG. 33, the step height on the measurement substrate surface is obtained as the average value of the substantially-fluctuating measurement results. As shown in FIG. 33, the amount by which the silicon substrate was etched (at a position on the silicon substrate surface where the mask was not formed) under the plasma doping process conditions described above was −5.8 nm. Therefore, the etching rate of the silicon substrate under the plasma doping process conditions described above is calculated to be −0.58 nm/min. Herein, the reason why the calculated etching rate is − (negative) will be described. As shown in FIG. 33, the width of the mask formed on the measurement substrate surface is about 500 μm. The width of the mask is substantially the same at any position on the measurement substrate surface. In contrast, the exposed portions of the silicon substrate surface located between masks have various widths. For example, with the measurement results shown in FIG. 33, the step height is + (positive) over a width of about 300 μm where the coordinate (the position on the substrate) is from about 1250 μm to about 1550 μm. This width cannot be the width of the mask, and therefore it can easily be determined that this portion is an exposed portion of the silicon substrate surface (where the mask was not formed). Therefore, it can be seen that under the plasma doping process conditions described above, a deposit accumulated on the silicon substrate surface to form a convex-shaped step, instead of the silicon substrate surface being etched to form a concave-shaped step. That is, the etching rate is − (negative).

Figures 34, 35:
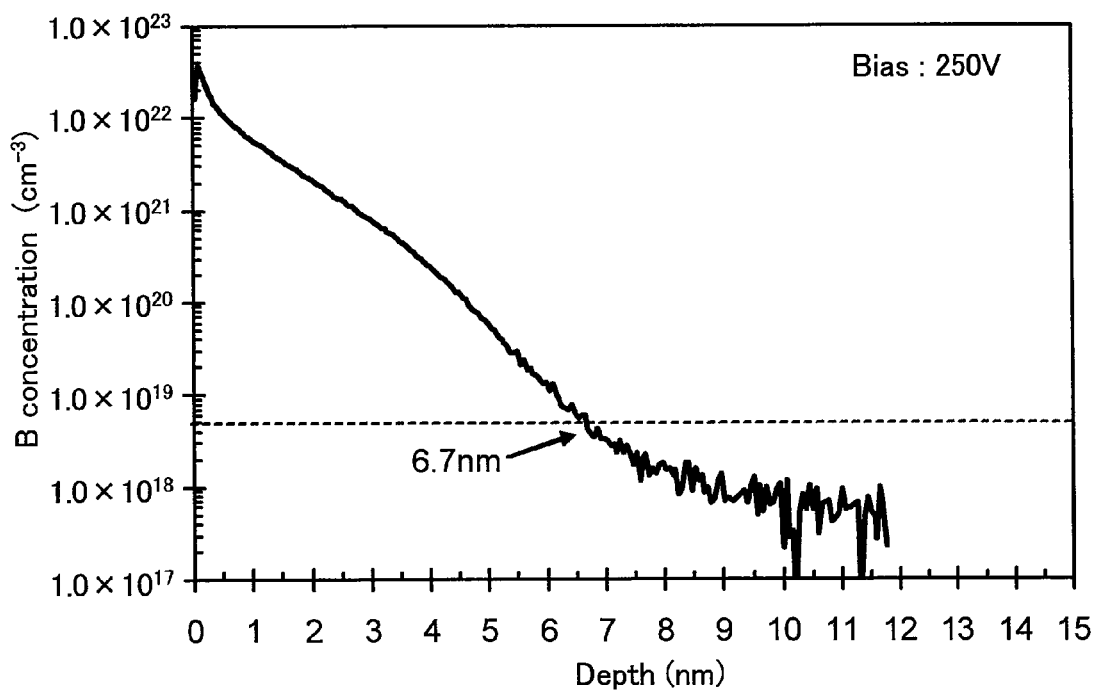
FIG. 34 shows a silicon substrate etching rate resulting when a plasma doping process of a method for manufacturing a semiconductor device according to one embodiment of the present invention is performed, in comparison with that resulting when a conventional plasma doping process disclosed in Patent Document 1 is performed.
FIG. 35 illustrates that boron, which is an introduced impurity, has been reliably introduced into the silicon substrate by the plasma doping process of a method for manufacturing a semiconductor device according to one embodiment of the present invention.

FIG. 34 shows a silicon substrate etching rate resulting when a plasma doping process of the present embodiment is performed, in comparison with that resulting when a conventional plasma doping process disclosed in Patent Document 1 is performed. The etching rate measurement flow shown in FIG. 31 is used also for the measurement of the etching rate for the conventional method. As shown in FIG. 34, the silicon substrate which is the sample is slightly etched when introducing an intended impurity into the surface of the silicon substrate in the conventional method, whereas the silicon substrate which is the sample 209 is not substantially etched when an intended impurity is introduced into the surface of the silicon substrate in the present embodiment. The results (the sheet resistance, the dose, etc.) obtained by performing the conventional plasma doping process will be described later (see Comparative Examples 1 and 2).

Figure 36:
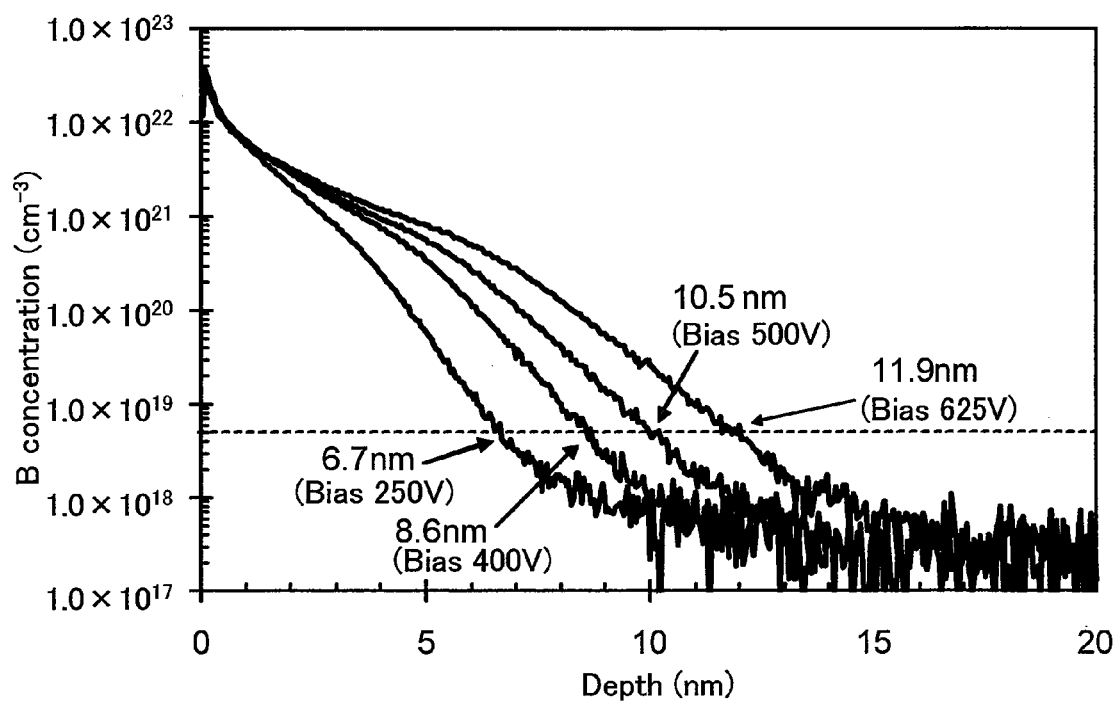
FIG. 36 illustrates that boron, which is an introduced impurity, has been reliably introduced into the silicon substrate by the plasma doping process of a method for manufacturing a semiconductor device according to one embodiment of the present invention.

Heretofore, the description has been directed to the fact that a deposit accumulates on the surface of the sample 209 at a rate of 0.58 nm/min when a plasma doping process is performed under the plasma doping process conditions of the present embodiment. Next, the description will be directed to the fact that boron which is the introduced impurity is reliably introduced into the silicon substrate which is the sample 209 by the plasma doping process of the present embodiment. FIG. 35 shows the results of an SIMS measurement for boron introduced into the sample 209 after the plasma doping is performed on the sample 209 under the plasma doping process conditions described above using the plasma doping process apparatus shown in FIG. 8 and before the impurity activation process. In FIG. 35, the position where the depth along the horizontal axis is 0 nm corresponds to the surface of the sample 209, and the depth value represents the distance from the sample surface in a direction that is vertically downward with respect to the sample surface. As shown in FIG. 35, the depth at which the boron concentration is $5.0 \times 10^{18}$ (cm$^{-3}$) is 6.7 nm. Therefore, it can be seen that the plasma-doped boron is not present only as a deposit on the surface of the sample 209, but has been implanted into the sample 209. Moreover, FIG. 36 shows the results of an SIMS measurement for boron on samples subjected to the plasma doping process in which the potential of the sample electrode 203 (the bias voltage), which is one parameter of the plasma doping process conditions, is set to 400 V, 500 V and 625 V. FIG. 36 also shows the results shown in FIG. 35 (where the bias voltage is 250 V). As shown in FIG. 36, it can be seen that boron has been implanted into the silicon substrate for any of the samples subjected to the plasma doping process under the different conditions. Moreover, it can also be seen that the boron implantation depth can be controlled by controlling the potential of the sample electrode 203 (the bias voltage) during the plasma doping process.

COMPARATIVE EXAMPLE 1

Figure 37:
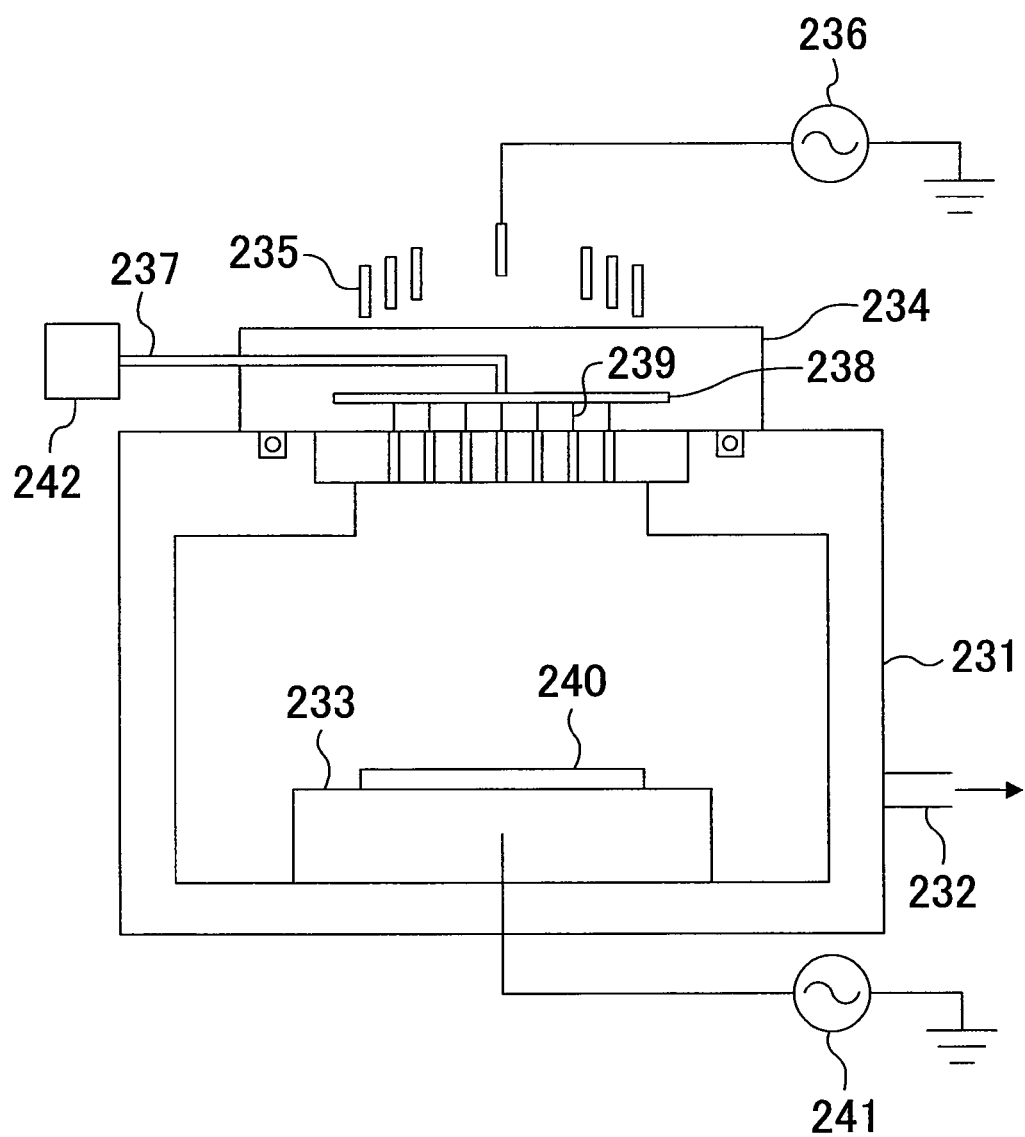
FIG. 37 is a cross-sectional view showing a general configuration of a plasma doping process apparatus used in a plasma doping process of Comparative Example 1.

FIG. 37 is a cross-sectional view showing a general configuration of a plasma doping process apparatus used in a plasma doping process of Comparative Example 1.

As shown in FIG. 37, a sample electrode 233 for receiving a sample 240, which is a silicon substrate, to be placed thereon is provided in a vacuum chamber 231 of a plasma doping process apparatus of Comparative Example 1, and a high-frequency power supply 241 is connected to the sample electrode 233. A top plate 234 made of a dielectric is provided on the upper wall of the vacuum chamber 231, and multiple coils 235 are provided on the upper surface of the top plate 234, with a high-frequency power supply 236 connected to the coils 235. The plasma doping process apparatus of Comparative Example 1 further includes a gas supplying device 242 for supplying $B_2H_6$ which is an impurity gas containing an intended element and He which is a diluent gas, and the gas supplied from the gas supplying device 242 is supplied from a gas supply port 239 into the vacuum chamber 231 through a gas supply pipe 237, and a gas branch pipe 238 provided in the top plate 234. Moreover, the plasma doping process apparatus of Comparative Example 1 includes a vacuum exhaust port 232 capable of decreasing and adjusting the pressure inside the vacuum chamber 231.

Herein, a high-frequency power is supplied to the coils 235 from the high-frequency power supply 236 to generate a magnetic field around the coils 235, which propagates in the vacuum chamber 231 via the top plate 234 made of a dielectric, thereby exciting a gas containing an intended impurity in the vacuum chamber 231 into a plasma state (ions, radicals, neutral molecules, etc.). Moreover, by supplying the high-frequency power to the sample electrode 233 from the high-frequency power supply 241, it is possible to control the potential of the sample electrode 233. The potential is negative with respect to the plasma. With the negative potential with respect to the plasma, boron ions in the plasma can be implanted into the surface of the sample 240.

Next, the process conditions when performing a plasma doping process using the plasma doping process apparatus shown in FIG. 37 in Comparative Example 1 will be described. First, the power supplied from the high-frequency power supply 236 to the coils 235 is 2000 W. A dopant gas containing an intended element, which is supplied from the gas supplying device 242 into the vacuum chamber 231 through the gas supply pipe 237, the gas branch pipe 238 and the gas supply port 239, has a mass concentration of 0.05% with respect to the entire gas. The power supplied from the high-frequency power supply 241 to the sample electrode 233 is 135 W. The pressure inside the vacuum chamber 231 adjusted by the vacuum exhaust port 232 is 0.9 Pa.

Now, the results obtained by performing the plasma doping process of Comparative Example 1 will be described.

Figure 38:
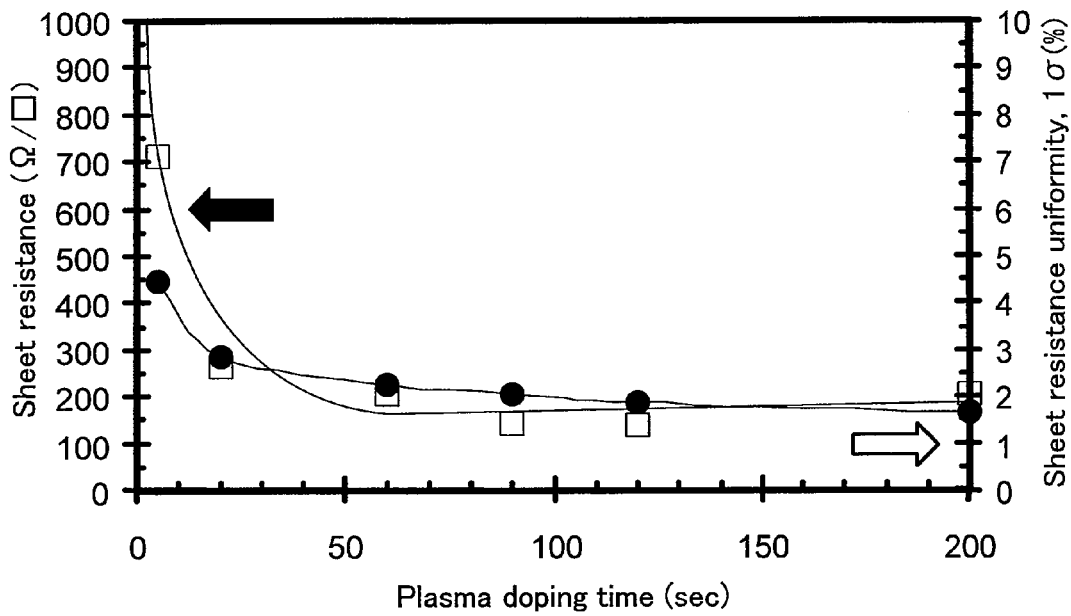
FIG. 38 shows the transition of the sheet resistance and the transition of the sheet resistance uniformity with respect to the change in the plasma doping time obtained by the plasma doping process of Comparative Example 1.
Figure 39:
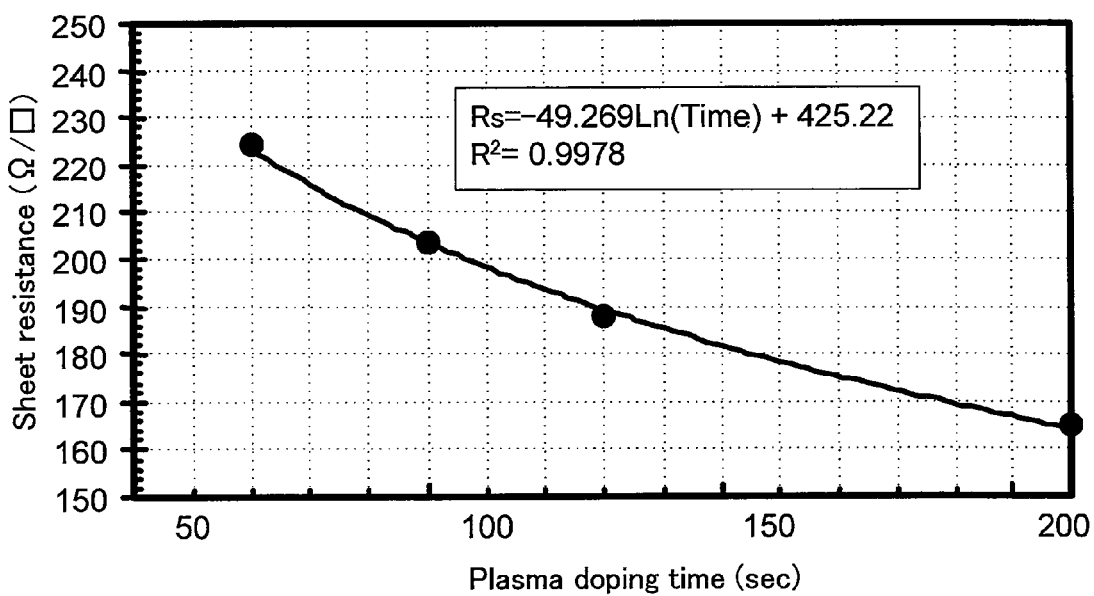
FIG. 39 shows, on an enlarged scale, the transition of the sheet resistance value with respect to the plasma doping time shown in FIG. 38, for a period of the plasma doping time from 60 seconds to 200 seconds.

FIG. 38 shows the results obtained by examining the transition of the sheet resistance and the transition of the sheet resistance uniformity with respect to the change in the plasma doping time by measuring the sheet resistance using a known four-point probe method after performing a plasma doping process on the sample 240 under the plasma doping process conditions described above using the plasma doping process apparatus shown in FIG. 37 and then performing a heat treatment by a known method to activate the impurity introduced into the sample 240. As shown in FIG. 38, as an effect of the plasma doping process of Comparative Example 1, the sheet resistance does not substantially decrease after about 60 seconds and a good condition is maintained also with the uniformity. FIG. 39 shows, on an enlarged scale, the transition of the sheet resistance value with respect to the plasma doping time shown in FIG. 38, for a period of the plasma doping time from 60 seconds to 200 seconds. The transition of the sheet resistance value shown in FIG. 39 can be represented as a function of time using (Expression c) below:

$$Rs = -49.269 \times \mathrm{Ln(Time)} + 425.22 \quad \text{(Expression c)}$$

(where Rs denotes the sheet resistance, Time denotes the plasma doping time, and Ln denotes the natural logarithm). Here, $R^2 = 0.9978$.

Figure 40:
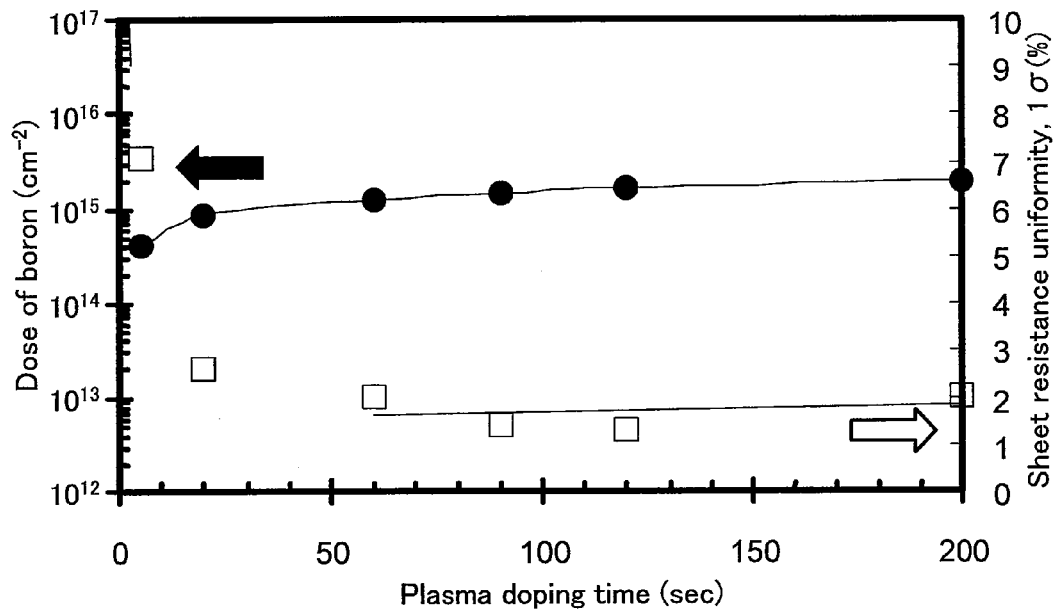
FIG. 40 shows the transition of the dose and the transition of the sheet resistance uniformity with respect to the change in the plasma doping time, obtained by the plasma doping process of Comparative Example 1.
Figure 41:
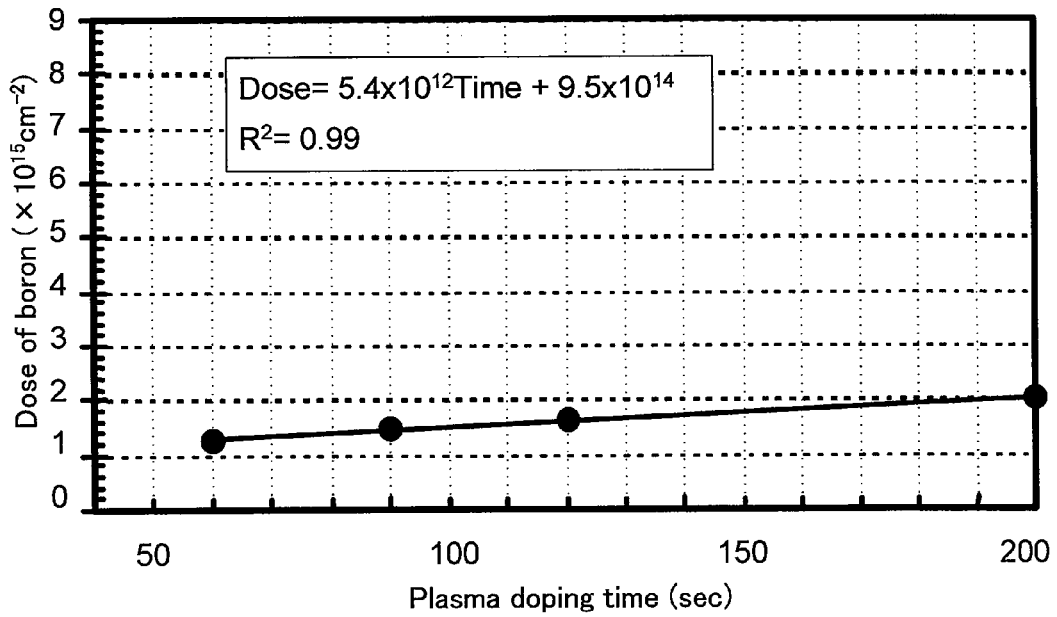
FIG. 41 shows, on an enlarged scale, the transition of the dose with respect to the plasma doping time shown in FIG. 40, for a period of the plasma doping time from 60 seconds to 200 seconds.

FIG. 40 shows the transition of the dose and the transition of the sheet resistance uniformity with respect to the plasma doping time, obtained as a result of performing a plasma doping process on the sample 240 under the plasma doping process conditions described above using the plasma doping process apparatus shown in FIG. 37. FIG. 41 shows, on an enlarged scale, the transition of the dose with respect to the plasma doping time shown in FIG. 40, for a period of the plasma doping time from 60 seconds to 200 seconds. The transition of the dose shown in FIG. 41 can be represented as a function of time using (Expression d) below:

$$\mathrm{Dose} = 5.4 \times 10^{13} \times \mathrm{Time} + 9.5 \times 10^{14} \quad \text{(Expression d)}$$

(where Dose denotes the dose and Time denotes the plasma doping time). Here, $R^2 = 0.99$.

Figure 42:
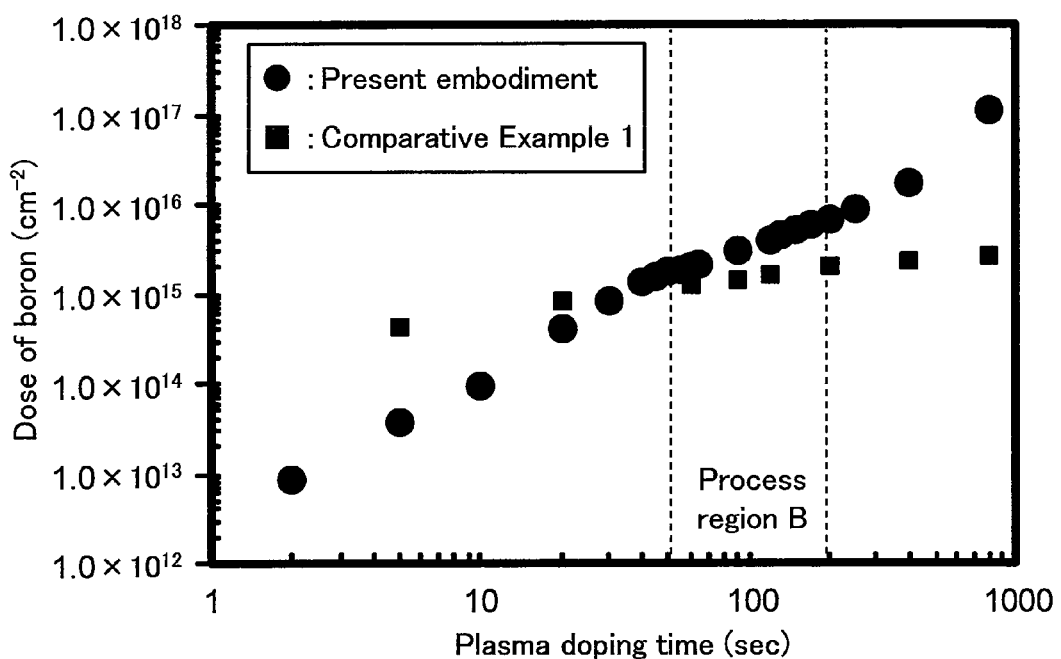
FIG. 42 shows the transition of the dose with respect to the plasma doping time in the plasma doping process of a method for manufacturing a semiconductor device according to one embodiment of the present invention, in comparison with that in the plasma doping process of Comparative Example 1.

As described above, the relationship between the sheet resistance and the dose is such that one of them can be considered explained once the other has been explained, and the following description will be directed to the dose. It can be seen that (Expression d) is a function only of the plasma doping time, and that the plasma doping time and the dose are in a closely directly proportional relationship with respect to each other. Herein, a comparison between (Expression d) and (Expression b) in the embodiment above shows that the temporal change rate of the dose of Comparative Example 1 is only one order of magnitude less than the temporal change rate of the embodiment above, and the dose having a directly proportional relationship with the plasma doping time as represented by (Expression d) is $9.5 \times 10^{14}$ cm$^{-2}$ at minimum and it is not possible to produce a sample having a dose less than or equal to this value. Therefore, it can be said that in Comparative Example 1, while the change in the dose with respect to the plasma doping time is substantially constant during a period of the plasma doping time from 60 seconds to 200 seconds as shown in (Expression d), the rate of change thereof is very small. Specifically, during a period of the plasma doping time from 60 seconds to 200 seconds, the dose changes only in a small range from about $1.2 \times 10^{15}$ cm$^{-2}$ to about $2.0 \times 10^{15}$ cm$^{-2}$, and it is not possible to produce a low-impurity-concentration sample in which the dose is $9.5 \times 10^{14}$ cm$^{-2}$ or less. FIG. 42 shows the transition of the dose with respect to the plasma doping time in the embodiment above, in comparison with that in Comparative Example 1. As shown in FIG. 42, the range over which the dose can be controlled with respect to the plasma doping time is very small in Comparative Example 1 as compared with that in the embodiment above.

Now, the results obtained by measuring the etching rate of the silicon substrate under the plasma doping process conditions described above of Comparative Example 1 according to the etching rate measurement flow shown in FIG. 31 will be described.

Figure 43:
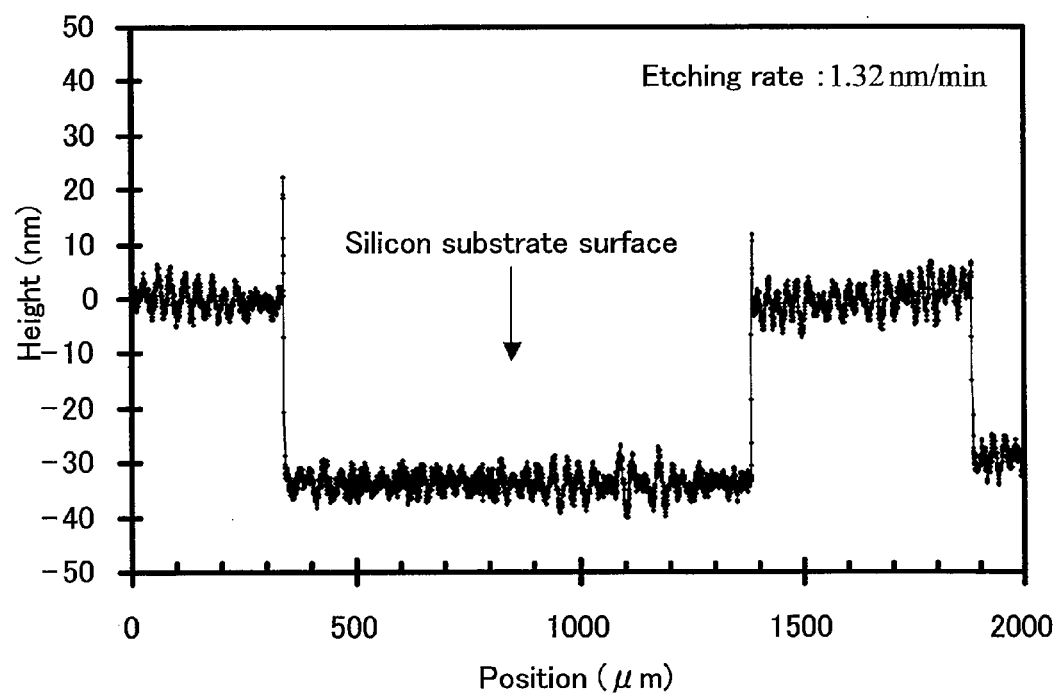
FIG. 43 shows the results of a step height measurement on a silicon substrate which has been subjected to a plasma doping process under the plasma doping process conditions of Comparative Example 1.

FIG. 43 shows the results obtained by a measurement in step S24 of the etching rate measurement flow shown in FIG. 31 using a known contact-type step height measurement apparatus, performed on a silicon substrate which has been subjected to a plasma doping process under the plasma doping process conditions described above of Comparative Example 1. In FIG. 43, the horizontal axis represents the position (with respect to any reference point) on the surface of the measurement substrate. The reference point for the vertical axis (height: 0 nm) in FIG. 43 is the height of the silicon substrate surface at a position where the mask has been removed. Moreover, the measurement results shown in FIG. 43 are obtained where the number X of iterations of the plasma doping process in step S22 is 25. Based on the measurement results shown in FIG. 43, the etching rate of the silicon substrate under the plasma doping process conditions of Comparative Example 1 is calculated to be +1.32 nm/min.

Herein, the reason why the calculated etching rate is + (positive) will be described. As shown in FIG. 43, the width of the mask on the surface of the silicon substrate which is the measurement substrate is about 500 μm. The width of the mask is substantially the same at any position on the measurement substrate surface. In contrast, the exposed portions of the silicon substrate surface located between masks have various widths. For example, with the measurement results shown in FIG. 43, the step height is – (negative) over a width of about 1100 μm where the coordinate (the position on the substrate) is from about 300 μm to about 1400 μm. This width cannot be the width of the mask, and therefore it can easily be determined that this portion is an exposed portion of the silicon substrate surface (where the mask was not formed). Therefore, it can be seen that under the plasma doping process conditions of Comparative Example 1 described above, the silicon substrate surface is etched to form a concave-shaped step. That is, the etching rate is + (positive).

COMPARATIVE EXAMPLE 2

FIG. 37 is a cross-sectional view showing a general configuration of a plasma doping process apparatus used in a plasma doping process of Comparative Example 2.

As shown in FIG. 37, a sample electrode 233 for receiving a sample 240, which is a silicon substrate, to be placed thereon is provided in a vacuum chamber 231 of a plasma doping process apparatus of Comparative Example 2, and a high-frequency power supply 241 is connected to the sample electrode 233. A top plate 234 made of a dielectric is provided on the upper wall of the vacuum chamber 231, and multiple coils 235 are provided on the upper surface of the top plate 234, with a high-frequency power supply 236 connected to the coils 235. The plasma doping process apparatus of Comparative Example 2 further includes a gas supplying device 242 for supplying $B_2H_6$ which is an impurity gas containing an intended element and He which is a diluent gas, and the gas supplied from the gas supplying device 242 is supplied from a gas supply port 239 into the vacuum chamber 231 through a gas supply pipe 237, and a gas branch pipe 238 provided in the top plate 234. Moreover, the plasma doping process apparatus of Comparative Example 2 includes a vacuum exhaust port 232 capable of decreasing and adjusting the pressure inside the vacuum chamber 231.

Herein, a high-frequency power is supplied to the coils 235 from the high-frequency power supply 236 to generate a magnetic field around the coils 235, which propagates in the vacuum chamber 231 via the top plate 234 made of a dielectric, thereby exciting a gas containing an intended impurity in the vacuum chamber 231 into a plasma state (ions, radicals, neutral molecules, etc.). Moreover, by supplying the high-frequency power to the sample electrode 233 from the high-frequency power supply 241, it is possible to control the potential of the sample electrode 233. The potential is negative with respect to the plasma. With the negative potential with respect to the plasma, boron ions in the plasma can be implanted into the surface of the sample 240.

Next, the process conditions when performing a plasma doping process using the plasma doping process apparatus shown in FIG. 37 in Comparative Example 2 will be described. First, the power supplied from the high-frequency power supply 236 to the coils 235 is 1500 W. A dopant gas containing an intended element, which is supplied from the gas supplying device 242 into the vacuum chamber 231 through the gas supply pipe 237, the gas branch pipe 238 and the gas supply port 239, has a mass concentration of 0.05% with respect to the entire gas. The power supplied from the high-frequency power supply 241 to the sample electrode 233 is 135 W. The pressure inside the vacuum chamber 231 adjusted by the vacuum exhaust port 232 is 0.9 Pa.

Now, the results obtained by performing the plasma doping process of Comparative Example 2 will be described.

Figure 44:
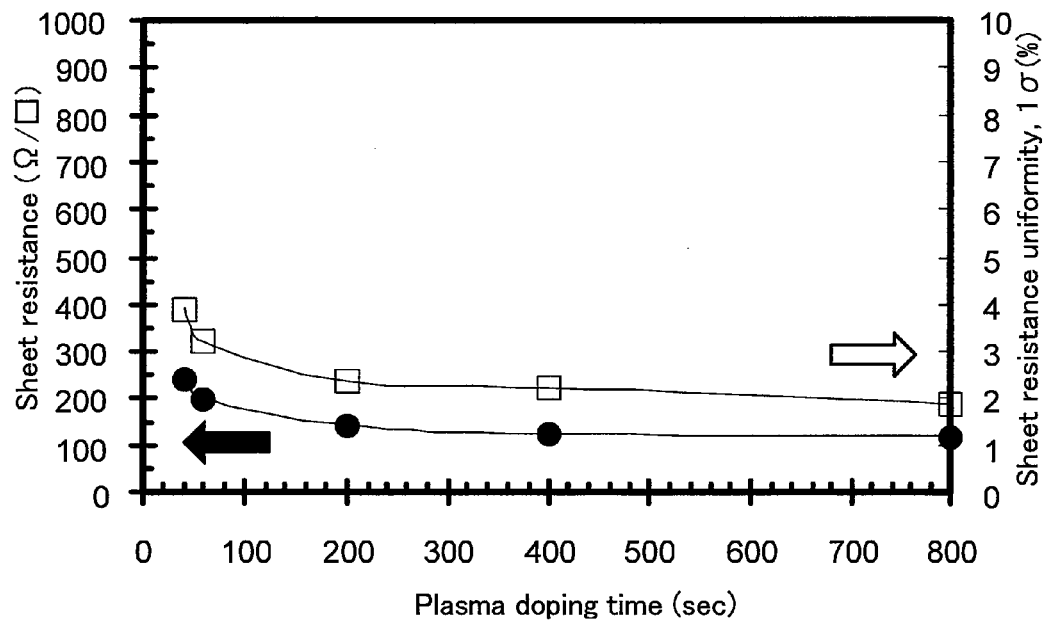
FIG. 44 shows the transition of the sheet resistance and the transition of the sheet resistance uniformity with respect to the change in the plasma doping time, obtained by the plasma doping process of Comparative Example 2.
Figure 45:
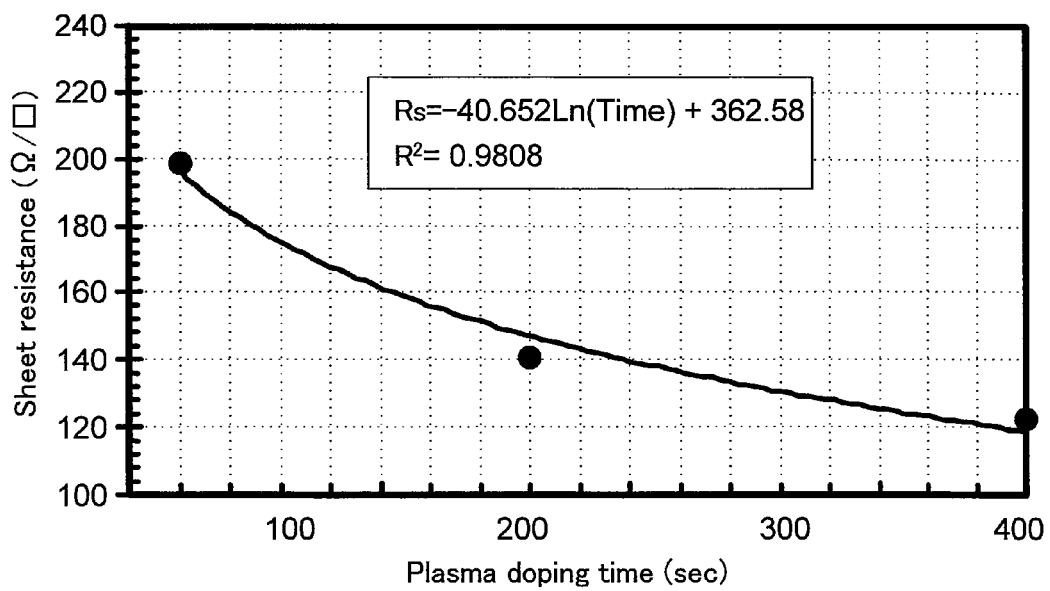
FIG. 45 shows, on an enlarged scale, the transition of the sheet resistance value with respect to the plasma doping time shown in FIG. 44, for a period of the plasma doping time from 60 seconds to 400 seconds.

FIG. 44 shows the results obtained by examining the transition of the sheet resistance and the transition of the sheet resistance uniformity with respect to the change in the plasma doping time by measuring the sheet resistance using a known four-point probe method after performing a plasma doping process on the sample 240 under the plasma doping process conditions described above using the plasma doping process apparatus shown in FIG. 37 and then performing a heat treatment by a known method to activate the impurity introduced into the sample 240. As shown in FIG. 44, as an effect of the plasma doping process of Comparative Example 2, the sheet resistance does not substantially decrease after about 60 seconds and a good condition is maintained also with the uniformity. FIG. 45 shows, on an enlarged scale, the transition of the sheet resistance value with respect to the plasma doping time shown in FIG. 44, for a period of the plasma doping time from 60 seconds to 400 seconds. The transition of the sheet resistance value shown in FIG. 45 can be represented as a function of time using (Expression e) below:

$Rs = -40.652 \times \text{Ln}(\text{Time}) + 362.58$ (Expression e)

(where Rs denotes the sheet resistance, Time denotes the plasma doping time, and Ln denotes the natural logarithm). Here, $R^2 = 0.9808$.

Figure 46:
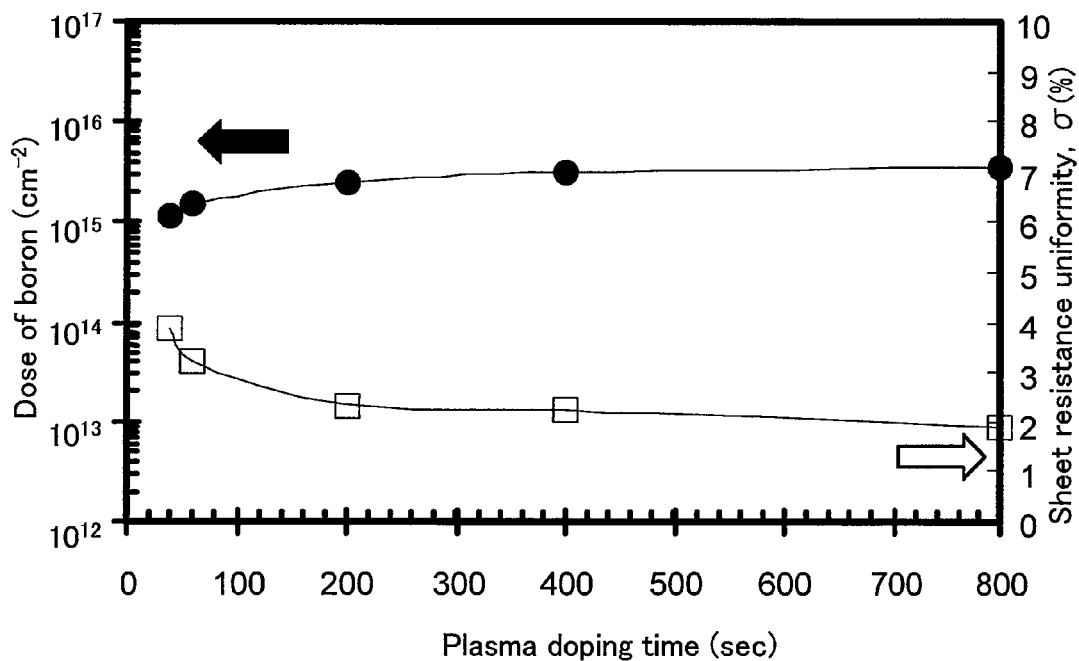
FIG. 46 shows the transition of the dose and the transition of the sheet resistance uniformity with respect to the change in the plasma doping time, obtained by the plasma doping process of Comparative Example 2.
Figure 47:
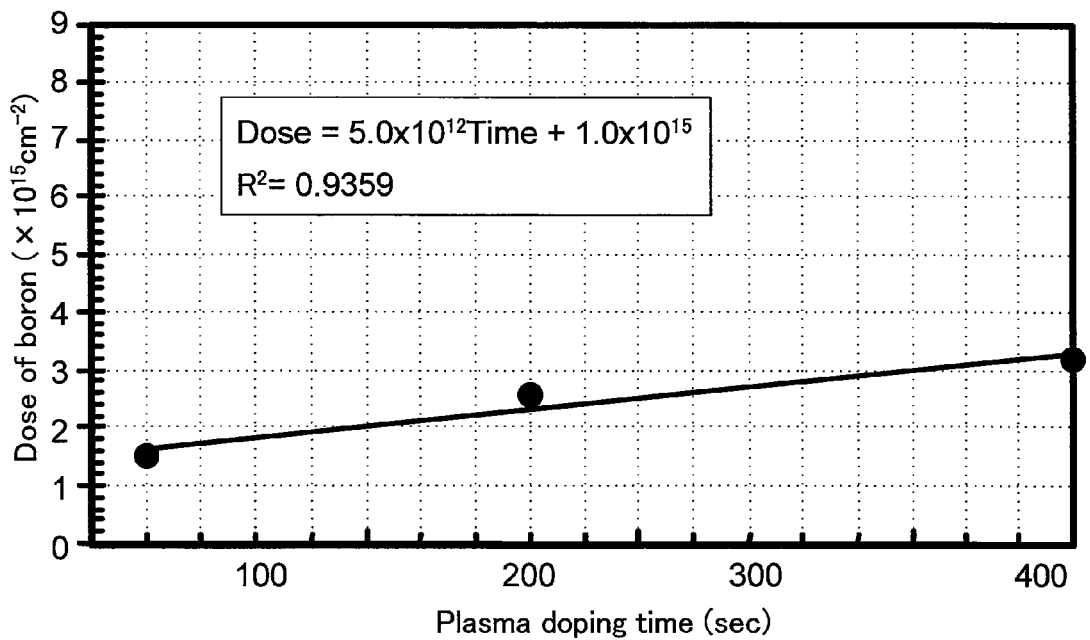
FIG. 47 shows, on an enlarged scale, the transition of the dose with respect to the plasma doping time shown in FIG. 46, for a period of the plasma doping time from 60 seconds to 400 seconds.

FIG. 46 shows the transition of the dose and the transition of the sheet resistance uniformity with respect to the plasma doping time, obtained as a result of performing a plasma doping process on the sample 240 under the plasma doping process conditions described above using the plasma doping process apparatus shown in FIG. 37. FIG. 47 shows, on an enlarged scale, the transition of the dose with respect to the plasma doping time shown in FIG. 46, for a period of the plasma doping time from 60 seconds to 400 seconds. The transition of the dose shown in FIG. 47 can be represented as a function of time using (Expression f) below:

$\text{Dose} = 5.0 \times 10^{13} \times \text{Time} + 1.0 \times 10^{15}$ (Expression f)

(where Dose denotes the dose and Time denotes the plasma doping time). Here, $R^2 = 0.9359$.

Figure 48:
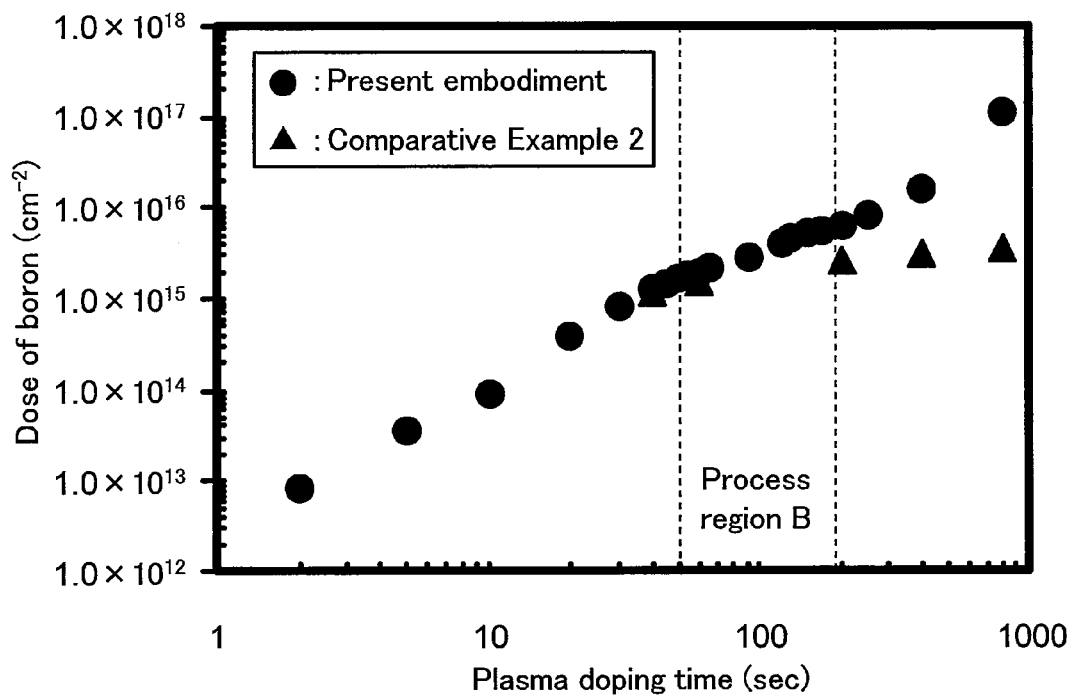
FIG. 48 shows the transition of the dose with respect to the plasma doping time in the plasma doping process of a method for manufacturing a semiconductor device according to one embodiment of the present invention, in comparison with that in the plasma doping process of Comparative Example 2.

As described above, the relationship between the sheet resistance and the dose is such that one of them can be considered explained once the other has been explained, and the following description will be directed to the dose. It can be seen that (Expression f) is a function only of the plasma doping time, and that the plasma doping time and the dose are in a closely directly proportional relationship with respect to each other. Herein, a comparison between (Expression f) and (Expression b) in the embodiment above shows that the temporal change rate of the dose of Comparative Example 2 is only one order of magnitude less than the temporal change rate of the embodiment above, and the dose having a directly proportional relationship with the plasma doping time as represented by (Expression f) is $1.0 \times 10^{15}$ cm$^{-2}$ at minimum and it is not possible to produce a sample having a dose less than or equal to this value. Therefore, it can be said that in Comparative Example 2, while the change in the dose with respect to the plasma doping time is substantially constant during a period of the plasma doping time from 60 seconds to 400 seconds as shown in (Expression f), the rate of change thereof is very small. Specifically, during a period of the plasma doping time from 60 seconds to 400 seconds, the dose changes only in a small range from about $1.5 \times 10^{15}$ cm$^{-2}$ to about $3.2 \times 10^{15}$ cm$^{-2}$, and it is not possible to produce a low-impurity-concentration sample in which the dose is $1.0 \times 10^{15}$ cm$^{-2}$ or less. Moreover, for a period of the plasma doping time from 60 seconds to 200 seconds, the dose changes only in a smaller range from about $1.5 \times 10^{15}$ cm$^{-2}$ to about $2.6 \times 10^{15}$ cm$^{-2}$. FIG. 48 shows the transition of the dose with respect to the plasma doping time in the embodiment above, in comparison with that in Comparative Example 2. As shown in FIG. 48, the range over which the dose can be controlled with respect to the plasma doping time is very small in Comparative Example 2 as compared with that in the embodiment above.

Now, the results obtained by measuring the etching rate of the silicon substrate under the plasma doping process conditions described above of Comparative Example 2 according to the etching rate measurement flow shown in FIG. 31 will be described.

Figure 49:
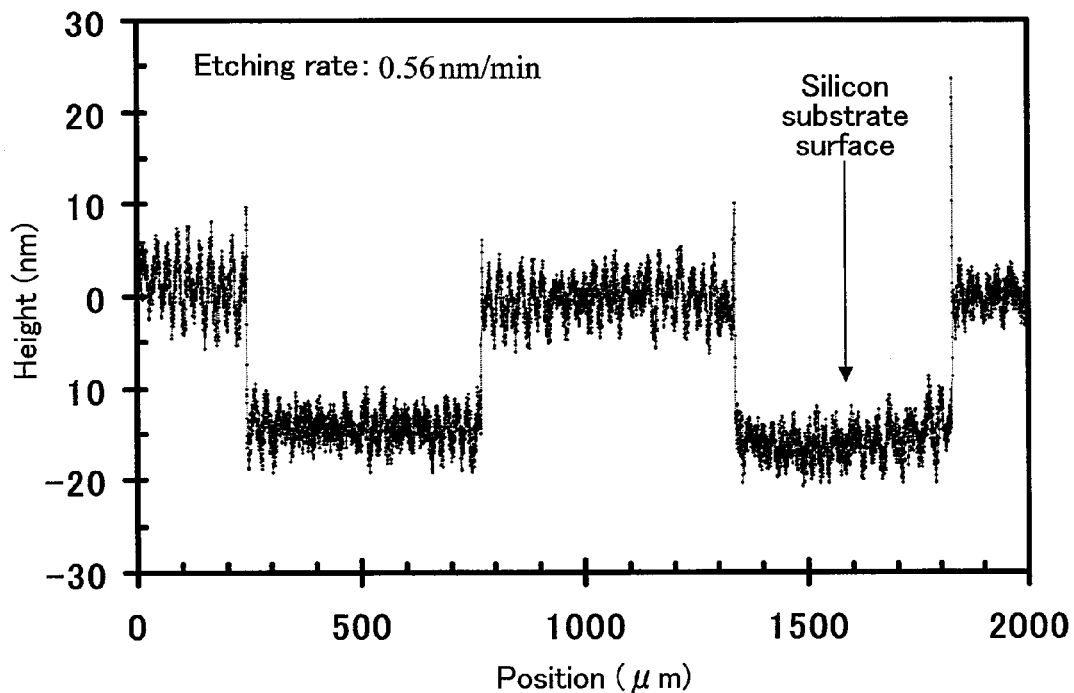
FIG. 49 shows the results of a step height measurement on a silicon substrate which has been subjected to a plasma doping process under the plasma doping process conditions of Comparative Example 2.

FIG. 49 shows the results obtained by a measurement in step S24 of the etching rate measurement flow shown in FIG. 31 using a known contact-type step height measurement apparatus, performed on a silicon substrate which has been subjected to a plasma doping process under the plasma doping process conditions described above of Comparative Example 2. In FIG. 49, the horizontal axis represents the position (with respect to any reference point) on the surface of the measurement substrate. The reference point for the vertical axis (height: 0 nm) in FIG. 49 is the height of the silicon substrate surface at a position where the mask has been removed. Moreover, the measurement results shown in FIG. 49 are obtained where the number X of iterations of the plasma doping process in step S22 is 25. Based on the measurement results shown in FIG. 49, the etching rate of the silicon substrate under the plasma doping process conditions of Comparative Example 2 is calculated to be +0.56 nm/min.

Herein, the reason why the calculated etching rate is + (positive) will be described. As shown in FIG. 49, the width of the mask on the surface of the silicon substrate which is the measurement substrate is about 500 μm. The width of the mask is substantially the same at any position on the measurement substrate surface. In contrast, the exposed portions of the silicon substrate surface located between masks have various widths. For example, with the measurement results shown in FIG. 49, the step height is − (negative) over a width of about 400 μm where the coordinate (the position on the substrate) is from about 1400 μm to about 1800 μm. This width cannot be the width of the mask, and therefore it can easily be determined that this portion is an exposed portion of the silicon substrate surface (where the mask was not formed). Therefore, it can be seen that under the plasma doping process conditions of Comparative Example 2 described above, the silicon substrate surface is etched to form a concave-shaped step. That is, the etching rate is + (positive).

Figure 50:
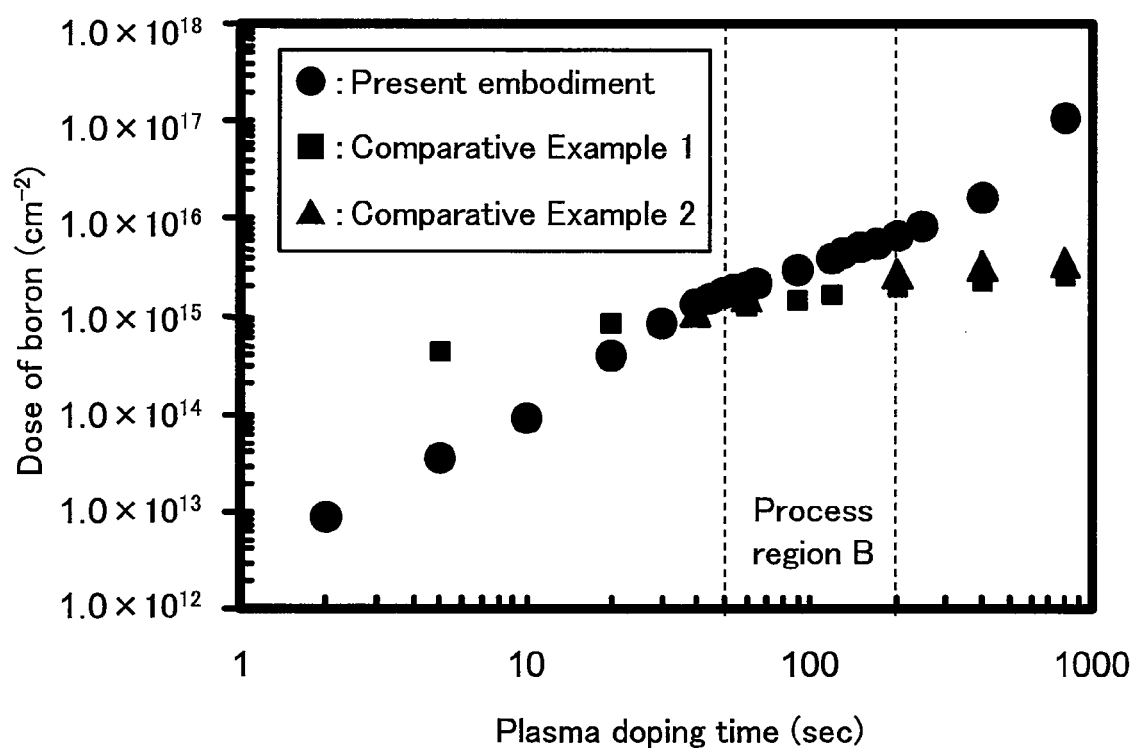
FIG. 50 shows the transition of the dose with respect to the plasma doping time in the plasma doping process of a method for manufacturing a semiconductor device according to one embodiment of the present invention, in comparison with that in the plasma doping process of Comparative Example 1, and that in the plasma doping process of Comparative Example 2.

FIG. 50 shows the transition of the dose with respect to the plasma doping time in the embodiment above, in comparison with that in Comparative Example 1, and that in Comparative Example 2. As shown in FIG. 50, the range over which the dose can be controlled by the plasma doping time is wide in the embodiment above, whereas the range is narrow in Comparative Examples 1 and 2. That is, it can be seen that by using the present invention, the dose can be controlled over a wide range by the plasma doping time.

INDUSTRIAL APPLICABILITY

The present invention relates to a method for manufacturing a semiconductor device. Particularly, when applied to a method for manufacturing a semiconductor device in which a semiconductor region is formed by implanting a substrate with an impurity by plasma doping, the present invention is very useful as there is provided an effect that it is possible to substantially increase over the prior art the range over which the dose can be controlled precisely without detracting from the productivity or the dose uniformity across the substrate surface and without having to precisely measure the dose.

The invention claimed is:

1. A method for manufacturing a semiconductor device, comprising:
    forming an impurity region by exposing a substrate to a plasma generated from a gas containing an impurity to thereby dope a surface portion of the substrate with the impurity,
    wherein the method uses a predetermined plasma doping time included within a time range over which a deposition rate of a film containing the impurity and deposited on the substrate by the plasma is greater than 0 nm/min and less than or equal to 5 nm/min.
2. The method for manufacturing a semiconductor device of claim 1, wherein the deposition rate on the substrate by the plasma is greater than 0 nm/min and less than or equal to 2 nm/min within the time range.

3. The method for manufacturing a semiconductor device of claim 1, wherein the time range is a range of 50 seconds or more and 200 seconds or less.

4. The method for manufacturing a semiconductor device of claim 1, wherein a temporal change rate of a dose of the impurity with which the substrate is doped is substantially constant within the time range, and the predetermined plasma doping time is determined using that relationship so that the dose is of an intended value.

5. The method for manufacturing a semiconductor device of claim 4, wherein
where the dose of the impurity with which the substrate is doped is D (cm$^{-2}$), the plasma doping time is t (sec), and the dose is expressed as D=A×t$^B$ (where A and B are coefficients), the coefficient B is 1.3 or less within the time range.

6. The method for manufacturing a semiconductor device of claim 5, wherein the coefficient B is greater than 0.4 within the time range.

7. The method for manufacturing a semiconductor device of claim 1, wherein before a surface portion of the substrate is doped with the impurity, a dummy substrate is exposed to a plasma generated from a gas containing the impurity to thereby dope a surface portion of the dummy substrate with the impurity, and for each of a plurality of positions on a surface of the dummy substrate, a time range for which a temporal change rate of a dose of the impurity with which the position is doped becomes substantially constant is obtained, wherein the predetermined plasma doping time is determined to be within one of these time ranges that contains the longest period of time.

* * * * *